US008128393B2

(12) United States Patent
Rolland et al.

(10) Patent No.: US 8,128,393 B2
(45) Date of Patent: Mar. 6, 2012

(54) METHODS AND MATERIALS FOR FABRICATING LAMINATE NANOMOLDS AND NANOPARTICLES THEREFROM

(75) Inventors: Jason P. Rolland, Durham, NC (US); Benjamin Maynor, Durham, NC (US); Robert L. Henn, Wilmington, DE (US)

(73) Assignee: Liquidia Technologies, Inc., Durham, NC (US)

( * ) Notice: Subject to any disclaimer, the term of this patent is extended or adjusted under 35 U.S.C. 154(b) by 538 days.

(21) Appl. No.: 11/633,763

(22) Filed: Dec. 4, 2006

(65) Prior Publication Data
US 2008/0131692 A1    Jun. 5, 2008

(51) Int. Cl.
*B29C 43/06* (2006.01)

(52) U.S. Cl. ........ 425/177; 425/195; 425/363; 425/385; 425/810

(58) Field of Classification Search .............. 425/90, 425/93, 105–107, 385, 403, 424, 810, 175, 425/177, 193, 194, 363; 428/336, 421; 427/135, 427/177
See application file for complete search history.

(56) References Cited

U.S. PATENT DOCUMENTS

| | | |
|---|---|---|
| 3,707,529 A | 12/1972 | Gladding at al. |
| 3,810,874 A | 5/1974 | Mitsch et al. |
| 4,694,045 A | 9/1987 | Moore |
| 4,818,801 A | 4/1989 | Rice et al. |
| 5,151,492 A | 9/1992 | Abe et al. |
| 5,512,374 A | 4/1996 | Wallace |
| 5,630,902 A | 5/1997 | Galarneau et al. |
| 5,674,959 A | 10/1997 | Arcella et al. |
| 5,717,036 A | 2/1998 | Saito et al. |
| 5,817,242 A | 10/1998 | Biebuyck et al. |
| 6,408,878 B2 | 6/2002 | Unger et al. |
| 6,422,528 B1 | 7/2002 | Domeier et al. |
| 6,512,063 B2 | 1/2003 | Tang |
| 6,860,956 B2 * | 3/2005 | Bao et al. ............ 264/219 |
| 6,979,419 B2 * | 12/2005 | Cameron ............ 264/220 |
| 7,037,457 B2 * | 5/2006 | Seidel et al. ............ 264/220 |
| 7,063,994 B2 | 6/2006 | Xiao et al. |
| 7,070,406 B2 * | 7/2006 | Jeans ............ 425/194 |
| 7,195,733 B2 | 3/2007 | Rogers et al. |
| 7,254,278 B2 | 8/2007 | Jung |

(Continued)

FOREIGN PATENT DOCUMENTS
CA    2067891    11/1992
(Continued)

OTHER PUBLICATIONS

Jin, et al., "Synthesis and Characterization of Phenylphosphine Oxide Containing Perfluorocyclobutyl . . . ", Marcomolecules, vol. 36, 2003, pp. 9000-9004.

(Continued)

*Primary Examiner* — Richard Crispino
*Assistant Examiner* — Thukhanh Nguyen
(74) *Attorney, Agent, or Firm* — Morgan, Lewis & Bockius LLP

(57) ABSTRACT

A laminate nanomold includes a layer of perfluoropolyether defining a cavity that has a predetermined shape and a support layer coupled with the layer of perfluoropolyether. The laminate can also include a tie-layer coupling the layer of perfluoropolyether with the support layer. The tie-layer can also include a photocurable component and a thermal curable component. The cavity can have a broadest dimension of less than 500 nanometers.

43 Claims, 6 Drawing Sheets

U.S. PATENT DOCUMENTS

| | | | |
|---|---|---|---|
| 7,294,294 B1 * | 11/2007 | Wago et al. ............... 425/403 | |
| 2003/0071016 A1 | 4/2003 | Shih | |
| 2004/0137734 A1 | 7/2004 | Chou et al. | |
| 2004/0202865 A1 | 10/2004 | Homola et al. | |
| 2004/0217085 A1 | 11/2004 | Jeans | |
| 2004/0219246 A1 | 11/2004 | Jeans | |
| 2004/0231781 A1 | 11/2004 | Bao | |
| 2006/0021533 A1 | 2/2006 | Jeans | |
| 2006/0214326 A1 | 9/2006 | Kim et al. | |
| 2008/0000373 A1 | 1/2008 | Petrucci-Samija et al. | |
| 2008/0047930 A1 | 2/2008 | Blanchet et al. | |
| 2008/0083484 A1 | 4/2008 | Blanchet et al. | |
| 2009/0165320 A1 | 7/2009 | DeSimone | |

FOREIGN PATENT DOCUMENTS

| | | |
|---|---|---|
| EP | 0784064 A1 | 7/1997 |
| EP | 0868447 B1 | 2/2000 |
| EP | 1700680 | 9/2006 |
| WO | WO2004033189 A1 | 4/2004 |
| WO | WO2004090636 A1 | 10/2004 |
| WO | 2005/019503 | 3/2005 |
| WO | WO2005101466 A2 | 10/2005 |
| WO | WO2007021762 A2 | 2/2007 |
| WO | WO2007024323 A2 | 3/2007 |
| WO | WO2007030698 A2 | 3/2007 |
| WO | 2008/143650 | 11/2008 |

OTHER PUBLICATIONS

William R. Jones, "The Properties of Perfluoropolyethers Used for Space Applications", NASA Tech Memo 106275, Jul. 1993, pp. 1-15.

Turri, et al., "End Group Chemistry of Fluoro-Oligomers:..", Journal of Polymer Science: Part A: Polymer Chemistry, 1996, vol. 34, pp. 3263-3275.

Crivello et al., "Investigation of the Reactivity of Epoxide Monomers in Photoinitiated Cationic Polymerization", Macromolecules 2005, vol. 38, 3584-3595.

Singh, et al., Poly[bis(2,2,2-trifluoroethoxy)phosphazene], Langmuir, 2005, vol. 21, pp. 11604-11607.

Rothrock, et. al., "High-performance imprint lithography and novel metrology methods using multifunctional perfluoropolyethers," Proceedings of SPIE, Metrology, inspection, and process control for microlithography Conference No. 20, Feb. 2006, vol. 6152 (2), ISBN 0-8194-6195-4.

Lee, H. et. al., "Fabrication of 100 nm metal lines on flexible plastic substrate using ultraviolet curing nanoimprint lithography," Applied Physics Letters 88, 143112 (2006), published online Apr. 5, 2006.

International Search Report from International Patent Application No. PCT/US2007/024910, dated Nov. 12, 2008.

Written Opinion of the International Searching Authority from International Patent Application No. PCT/US2007/024910, dated Nov. 12, 2008.

Office Action from U.S. Appl. No. 11/825,482, dated Jul. 14, 2010.

* cited by examiner

METHODS AND MATERIALS FOR FABRICATING LAMINATE NANOMOLDS AND NANOPARTICLES THEREFROM

TECHNICAL FIELD

Generally, the present invention relates to materials and methods for fabricating molds having nano-sized cavities for molding nanoparticles therein. More particularly, the molds include laminated layers of polymeric materials and can include arrays of nano-sized cavities of predetermined shapes.

ABBREVIATIONS

AC=alternating current
Ar=Argon
° C.=degrees Celsius
cm=centimeter
8-CNVE=perfluoro(8-cyano-5-methyl-3,6-dioxa-1-octene)
CSM=cure site monomer
CTFE=chlorotrifluoroethylene
g=grams
h=hours
1-HPFP=1,2,3,3,3-pentafluoropropene
2-HPFP=1,1,3,3,3-pentafluoropropene
HFP=hexafluoropropylene
HMDS=hexamethyldisilazane
IL=imprint lithography
IPDI=isophorone diisocyanate
MCP=microcontact printing
Me=methyl
MEA=membrane electrode assembly
MEMS=micro-electro-mechanical system
MeOH=methanol
MIMIC=micro-molding in capillaries
mL=milliliters
mm=millimeters
mmol=millimoles
$M_n$=number-average molar mass
m.p.=melting point
mW=milliwatts
NCM=nano-contact molding
NIL=nanoimprint lithography
nm=nanometers
Pd=palladium
PAVE perfluoro(alkyl vinyl)ether
PDMS=poly(dimethylsiloxane)
PEM=proton exchange membrane
PFPE=perfluoropolyether
PMVE perfluoro(methyl vinyl)ether
PPVE perfluoro(propyl vinyl)ether
PSEPVE=perfluoro-2-(2-fluorosulfonylethoxy)propyl vinyl ether
PTFE=polytetrafluoroethylene
SAMIM=solvent-assisted micro-molding
SEM=scanning electron microscopy
Si=silicon
TFE=tetrafluoroethylene
μm=micrometers
UV=ultraviolet
W=watts

BACKGROUND

Polymer materials have been used as molds and as laminate molds for many years. However, the typical polymer molds and laminate molds have many drawbacks with respect to the scale of what can be molded therein. Such drawbacks generally result from chemical and physical interaction between the materials of the molds and the materials being molded therein. Typically, as the structures to be molded are reduced in size and approach tens or hundreds of micrometers or less, the typical mold materials fail to perform as molds. These failures can include the failure to accept material into such mold cavities and failure to release, especially release cleanly, any materials that do enter the mold cavities. Therefore, there is a need in the art for materials that can form molds having cross-sectional dimensions of less than tens of micrometers, less than micrometers, and less than 500 nanometers that can accept materials into mold cavities and cleanly release materials molded therein. Furthermore, the smaller the feature sizes of the article being formed in the mold, the closer that feature size comes to defects and blemishes produced by the conventional molding materials and methods.

The applicants have previously disclosed PFPE based materials that overcome these drawbacks and disclose herein further methods, materials, and articles for overcoming such drawbacks.

SUMMARY

According to the present invention, a laminate nanomold includes a layer of perfluoropolyether, where the layer of perfluoropolyether defines a cavity having a predetermined shape and a support layer coupled with the layer of perfluoropolyether. In some embodiments, the laminate also includes a tie-layer coupling the layer of perfluoropolyether with the support layer. According to other embodiments, the tie-layer includes a photocurable component and a thermal curable component.

In some embodiments, the laminate further includes a plurality of cavities defined in the perfluoropolyether layer. Each cavity of the plurality of cavities can have a predetermined shape selected from the group of cylindrical, 200 nm diameter cylinders, cuboidal, 200 nm cuboidal, crescent, and concave disc. In some embodiments, the plurality of cavities includes cavities of a variety of predetermined shapes. According to alternative embodiments, each cavity of the plurality of cavities is less than about 10 micrometers in a largest dimension, less than about 5 micrometers in a largest dimension, less than about 1 micrometer in a largest dimension, less than about 750 nanometers in a largest dimension, less than about 500 nanometers in a largest dimension, less than about 300 nanometers in a largest dimension, less than about 200 nanometers in a largest dimension, less than about 100 nanometers in a largest dimension, less than about 75 nanometers in a largest dimension, less than about 50 nanometers in a largest dimension, less than about 40 nanometers in a largest dimension, less than about 30 nanometers in a largest dimension, less than about 20 nanometers in a largest dimension, or less than about 10 nanometers in a largest dimension.

According to other embodiments, the perfluoropolyether layer is less than about 50 micrometers thick, less than about 40 micrometers thick, less than about 30 micrometers thick, less than about 20 micrometers thick, less than about 15 micrometers thick, less than about 10 micrometers thick.

In some embodiments, the support layer includes a polymer. In other embodiments, the polymer of the support layer includes polyethylene terephthalate. In alternative embodiments, the support layer is less than about 20 mil thick, less than about 15 mil thick, less than about 10 mil thick, or less than about 5 mil thick.

In certain embodiments, the support layer introduces a modulus of greater than 1000 to the laminate. In other embodiments, the layer of perfluoropolyether is coupled with the support layer by photoinitiator coupling and thermalinitiator coupling. In some embodiments, the perfluoropolyether includes a photocurable component. In yet other embodiments, the layer of perfluoropolyether has a footprint greater than about 25 square centimeters, a footprint greater than about 50 square centimeters, or a footprint greater than about 100 square centimeters.

In some embodiments, each cavity of the plurality of cavities is less than about 5 micrometers from an adjacent cavity, less than about 2 micrometer from an adjacent cavity, less than about 1 micrometers from an adjacent cavity, less than about 750 nanometers from an adjacent cavity, or less than about 500 nanometers from an adjacent cavity. In some embodiments, the perfluoropolyether has less than about 10 percent sol fraction.

According to other embodiments of the present invention, a method of making a laminate nanomold includes positioning a patterned master adjacent to a support layer, inserting the positioned patterned master and adjacent support layer between nips of a roll laminator, delivering a curable perfluoropolyether between the patterned master and the support layer adjacent an input side of the roll laminator, activating the roll laminator to laminate the patterned master with the support layer, wherein the curable perfluoropolyether is dispersed between the patterned master and the support layer, and treating the laminate to activate a curable component of the curable perfluoropolyether such that the perfluoropolyether is solidified. In some embodiments, the method further includes, before positioning the patterned master adjacent the support layer, configuring a tie-layer with the support layer such that when activated the curable perfluoropolyether binds with the tie-layer.

According to further embodiments of the present invention, a laminate polymer mold includes a first polymer layer coupled to a second polymer layer by a tie-layer disposed between the first polymer layer and the second polymer layer, wherein the tie-layer includes a fluoropolymer having a photocurable component and a thermal curable component. In some embodiments, the polymer of the first or second layers includes a fluoropolymer. In other embodiments, the polymer of the first or second layers includes a perfluoropolyether. In further embodiments, the polymer of the first or second layers includes a polyethylene terephthalate. In still further embodiments, the fluoropolymer of the tie-layer includes a perfluoropolyether.

DETAILED DESCRIPTION

Figure 1:
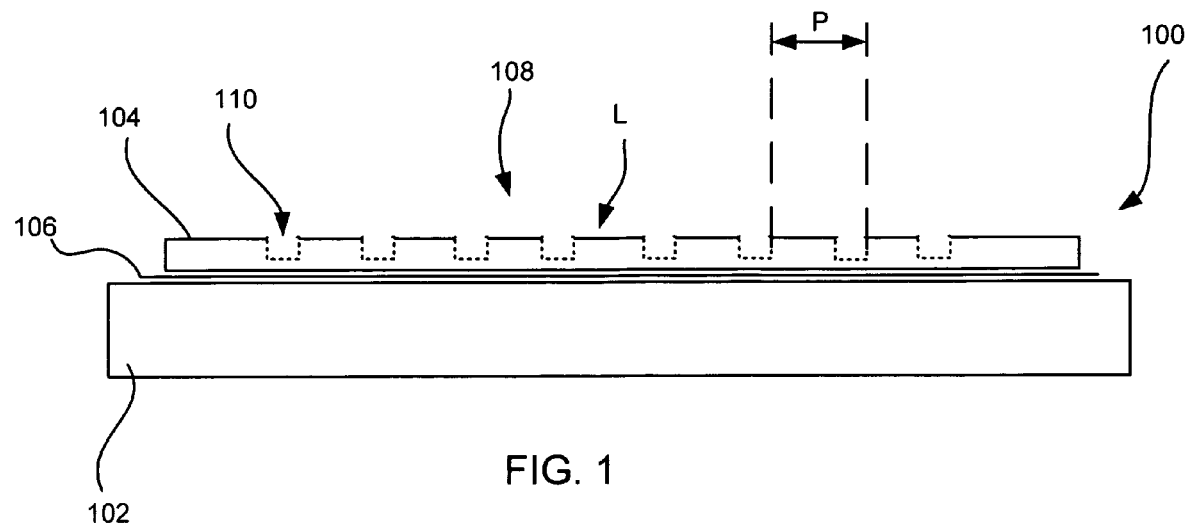
FIG. 1 shows a schematic of a laminate mold according to an embodiment of the present invention.

Generally, the present invention discloses laminate molds of varying polymer materials and methods of making such molds. The molds generally include arrays of nano-sized cavities formed with predetermined shapes and controlled spacing between the cavities.

I. Non-Exhaustive List of Definitions

As used herein, the term "pattern" can mean an array, a matrix, specific shape or form, a template of the article of interest, or the like. In some embodiments, a pattern can be ordered, uniform, repetitious, alternating, regular, irregular, or random arrays or templates. The patterns of the present invention can include one or more of a micro- or nano-sized reservoir, a micro- or nano-sized reaction chamber, a micro- or nano-sized mixing chamber, a micro- or nano-sized collection chamber. The patterns of the present invention can also include a surface texture or a pattern on a surface that can include micro- and/or nano-sized cavities. The patterns can also include micro- or nano-sized projections.

As typical in polymer chemistry the term "perfluoropolyethers" herein should be understood to represent not only its purest form, i.e., the polymeric chain built from three elements—carbon, oxygen, and fluorine, but variations of such structures. The base family of perfluooropolyethers itself includes linear, branched, and functionalized materials. The use within this patent also includes some substitution of the fluorine with materials such as H, and other halides; as well as block or random copolymers to modify the base perfluoropolyethers.

As used herein, the term "monolithic" refers to a structure having or acting as a single, uniform structure.

As used herein, the term "non-biological organic materials" refers to organic materials, i.e., those compounds that include covalent carbon-carbon bonds, other than biological materials. As used herein, the term "biological materials" includes nucleic acid polymers (e.g., DNA, RNA) amino acid polymers (e.g., enzymes, proteins, and the like) and small organic compounds (e.g., steroids, hormones) wherein the small organic compounds have biological activity, especially biological activity for humans or commercially significant animals, such as pets and livestock, and where the small organic compounds are used primarily for therapeutic or diagnostic purposes. While biological materials are of interest with respect to pharmaceutical and biotechnological applications, a large number of applications involve chemical processes that are enhanced by other than biological materials, i.e., non-biological organic materials.

As used herein, the term "partial cure" refers to a condition wherein less than about 100% of a polymerizable group of a material is reacted. In certain embodiments, the term "partially-cured material" refers to a material that has undergone a partial cure process or treatment.

As used herein, the term "full cure" refers to a condition wherein about 100% of a polymerizable group of a material is reacted. In certain embodiments, the term "fully-cured material" refers to a material which has undergone a full cure process or treatment.

As used herein, the term "photocured" refers to a reaction of polymerizable groups whereby the reaction can be triggered by actinic radiation, such as UV light. In this application UV-cured can be a synonym for photocured.

As used herein, the term "thermal cure" or "thermally cured" refers to a reaction of polymerizable groups, whereby the reaction can be triggered or accelerated by heating the material beyond a threshold temperature.

Following long-standing patent law convention, the terms "a", "an", and "the" refer to "one or more" when used in this application, including the claims. Thus, for example, reference to "a cavity" includes a plurality of such cavities, and so forth.

II. Materials

In certain embodiments, the present invention broadly describes and employs solvent resistant, low surface energy polymeric materials for fabricating articles or articles, such as molds having micro- and/or nano-sized cavities. According to some embodiments the low surface energy polymeric materials include, but are not limited to fluoropolyether or perfluoropolyether (collectively "PFPE"), poly(dimethylsiloxane) (PDMS), poly(tetramethylene oxide), poly(ethylene oxide), poly(oxetanes), polyisoprene, polybutadiene, fluoroolefin-based fluoroelastomers, and the like. An example of forming a mold with such materials includes casting liquid PFPE precursor materials onto a patterned substrate (or master) and then curing the liquid PFPE precursor materials to generate a replica pattern of the master. For simplification purposes, most of the description will focus on PFPE materials, however, it should be appreciated that other polymers, such as those recited herein, can be applied to the methods, materials, and articles of the present invention.

According to certain embodiments of the present invention, "curing" a liquid polymer, for example a liquid PFPE precursor, means transforming the polymer from a liquid state to a non-liquid state (excluding a gas state) such that the polymer does not readily flow, such as a material with a relatively high viscosity or a rubbery state. In some embodiments, the non-liquid state that the polymer is transformed to is a gel state. In some embodiments, the polymer in the non-liquid state can include un-reacted polymerizable groups. In other embodiments, the polymer liquid precursor is capable of undergoing a first cure to become non-liquid such that the polymer becomes not fully soluble in a solvent. In other embodiments, when the liquid polymer precursor is cured it is meant that the polymer has transitioned into a non-liquid polymer that forms fibers about an object drawn through the material. In other embodiments, an initial cure of the liquid polymer precursor transitions the polymer to a non-conformable state at room temperature. In other embodiments, following a cure, the polymer takes a gel form, wherein gel means an article that is free-standing or self-supporting in that its yield value is greater than the shear stress imposed by gravity.

Representative solvent resistant elastomer-based materials include but are not limited to fluorinated elastomer-based materials. As used herein, the term "solvent resistant" refers to a material, such as an elastomeric material that does not substantially swell or dissolve in common hydrocarbon-based organic solvents or acidic or basic aqueous solutions. Representative fluorinated elastomer-based materials include but are not limited to fluoropolyether and perfluoropolyether (collectively "PFPE") based materials.

In certain embodiments, functional liquid PFPE materials exhibit desirable properties for use in a micro- or nano-sized molds. For example, functional PFPE materials typically have one or more of the following characteristics: low surface energy, are non-toxic, UV and visible light transparent, highly gas permeable, cure into a tough, durable, highly fluorinated elastomeric or glassy materials with excellent release properties, resistant to swelling, solvent resistant, biocompatible, non-reactive surfaces, combinations thereof, and the like. The properties of these materials can be tuned over a wide range through the judicious choice of additives, fillers, reactive co-monomers, and functionalization agents, examples of which are described further herein. Such properties that are desirable to modify, include, but are not limited to, modulus, tear strength, surface energy, permeability, functionality, mode of cure, solubility, toughness, hardness, elasticity, swelling characteristics, absorption, adsorption, combinations thereof, and the like.

Some examples of methods of adjusting mechanical and or chemical properties of the finished material includes, but are not limited to, shortening the molecular weight between cross-links to increase the modulus of the material, adding monomers that form polymers of high Tg to increase the modulus of the material, adding charged monomer or species to the material to increase the surface energy or wetability of the material, combinations thereof, and the like.

According to one embodiment, materials for use herein (e.g., PFPE materials) have surface energy below about 30 mN/m. According to another embodiment the surface energy is between about 7 mN/m and about 20 mN/m. According to a more preferred embodiment, the surface energy is between about 10 mN/m and about 15 mN/m. The non-swelling nature and easy release properties of the presently disclosed materials (e.g. PFPE materials) allow for the fabrication of laminate articles.

II.A. Perfluoropolyether Materials Prepared from a Liquid PFPE Precursor Material Having a Viscosity Less Than About 100 Centistokes.

As would be recognized by one of ordinary skill in the art, perfluoropolyethers (PFPEs) have been in use for over 25 years for many applications. Commercial PFPE materials are made by polymerization of perfluorinated monomers. The first member of this class was made by the cesium fluoride catalyzed polymerization of hexafluoropropene oxide (HFPO) yielding a series of branched polymers designated as KRYTOX® (DuPont, Wilmington, Del., United States of America). A similar polymer is produced by the UV catalyzed photo-oxidation of hexafluoropropene (FOMBLIN® Y) (Solvay Solexis, Brussels, Belgium). Further, a linear polymer (FOMBLIN® Z) (Solvay) is prepared by a similar process, but utilizing tetrafluoroethylene. Finally, a fourth polymer (DEMNUM®) (Daikin Industries, Ltd., Osaka, Japan) is produced by polymerization of tetrafluorooxetane followed by direct fluorination. Structures for these fluids are presented in Table I. Table II contains property data for some members of the PFPE class of lubricants. Likewise, the physical properties of functional PFPEs are provided in Table III. In addition to these commercially available PFPE fluids, a new series of structures are being prepared by direct fluorination technology. Representative structures of these new PFPE materials appear in Table IV. Of the abovementioned PFPE fluids, only KRYTOX® and FOMBLIN® Z have been extensively used in applications. See Jones, W. R., Jr., The Properties of Perfluoropolyethers Used for Space Applications, NASA Technical Memorandum 106275 (July 1993), which is incorporated herein by reference in its entirety. Accordingly, the use of such PFPE materials is provided in the presently disclosed subject matter.

TABLE I

NAMES AND CHEMICAL STRUCTURES OF COMMERCIAL PFPE FLUIDS

| NAME | Structure |
|---|---|
| DEMNUM ® | $C_3F_7O(CF_2CF_2CF_2O)_xC_2F_5$ |
| KRYTOX ® | $C_3F_7O[CF(CF_3)CF_2O]_xC_2F_5$ |
| FOMBLIN ® Y | $C_3F_7O[CF(CF_3)CF_2O]_x(CF_2O)_yC_2F_5$ |
| FOMBLIN ® Z | $CF_3O(CF_2CF_2O)_x(CF_2O)_yCF_3$ |

TABLE II

PFPE PHYSICAL PROPERTIES

| Lubricant | Average Molecular Weight | Viscosity at 20° C., (cSt) | Viscosity Index | Pour Point, ° C. | Vapor Pressure, Torr 20° C. | Vapor Pressure, Torr 100° C. |
|---|---|---|---|---|---|---|
| FOMBLIN® Z-25 | 9500 | 255 | 355 | −66 | $2.9 \times 10^{-12}$ | $1 \times 10^{-8}$ |
| KRYTOX® 143AB | 3700 | 230 | 113 | −40 | $1.5 \times 10^{-6}$ | $3 \times 10^{-4}$ |
| KRYTOX® 143AC | 6250 | 800 | 134 | −35 | $2 \times 10^{-8}$ | $8 \times 10^{-6}$ |
| DEMNUM® S-200 | 8400 | 500 | 210 | −53 | $1 \times 10^{-10}$ | $1 \times 10^{-7}$ |

TABLE III

PFPE PHYSICAL PROPERTIES OF FUNCTIONAL PFPEs

| Lubricant | Average Molecular Weight | Viscosity at 20° C., (cSt) | Vapor Pressure, Torr 20° C. | Vapor Pressure, Torr 100° C. |
|---|---|---|---|---|
| FOMBLIN® Z-DOL 2000 | 2000 | 85 | $2.0 \times 10^{-5}$ | $2.0 \times 10^{-5}$ |
| FOMBLIN® Z-DOL 2500 | 2500 | 76 | $1.0 \times 10^{-7}$ | $1.0 \times 10^{-4}$ |
| FOMBLIN® Z-DOL 4000 | 4000 | 100 | $1.0 \times 10^{-8}$ | $1.0 \times 10^{-4}$ |
| FOMBLIN® Z-TETROL | 500 | 2000 | $5.0 \times 10^{-7}$ | $2.0 \times 10^{-4}$ |

TABLE IV

Names and Chemical Structures of Representative PFPE Fluids

| Name | Structure[a] |
|---|---|
| Perfluoropoly(methylene oxide) (PMO) | $CF_3O(CF_2O)_xCF_3$ |
| Perfluoropoly(ethylene oxide) (PEO) | $CF_3O(CF_2CF_2O)_xCF_3$ |
| Perfluoropoly(dioxolane) (DIOX) | $CF_3O(CF_2CF_2OCF_2O)_xCF_3$ |
| Perfluoropoly(trioxocane) (TRIOX) | $CF_3O[(CF_2CF_2O)_2CF_2O]_xCF_3$ |

[a]wherein x is any integer.

In some embodiments, the perfluoropolyether precursor includes poly(tetrafluoroethylene oxide-co-difluoromethylene oxide)α,ω diol, which in some embodiments can be photocured to form one of a perfluoropolyether dimethacrylate and a perfluoropolyether distyrenic compound. A representative scheme for the synthesis and photocuring of a functionalized perfluoropolyether is provided in Scheme 1.

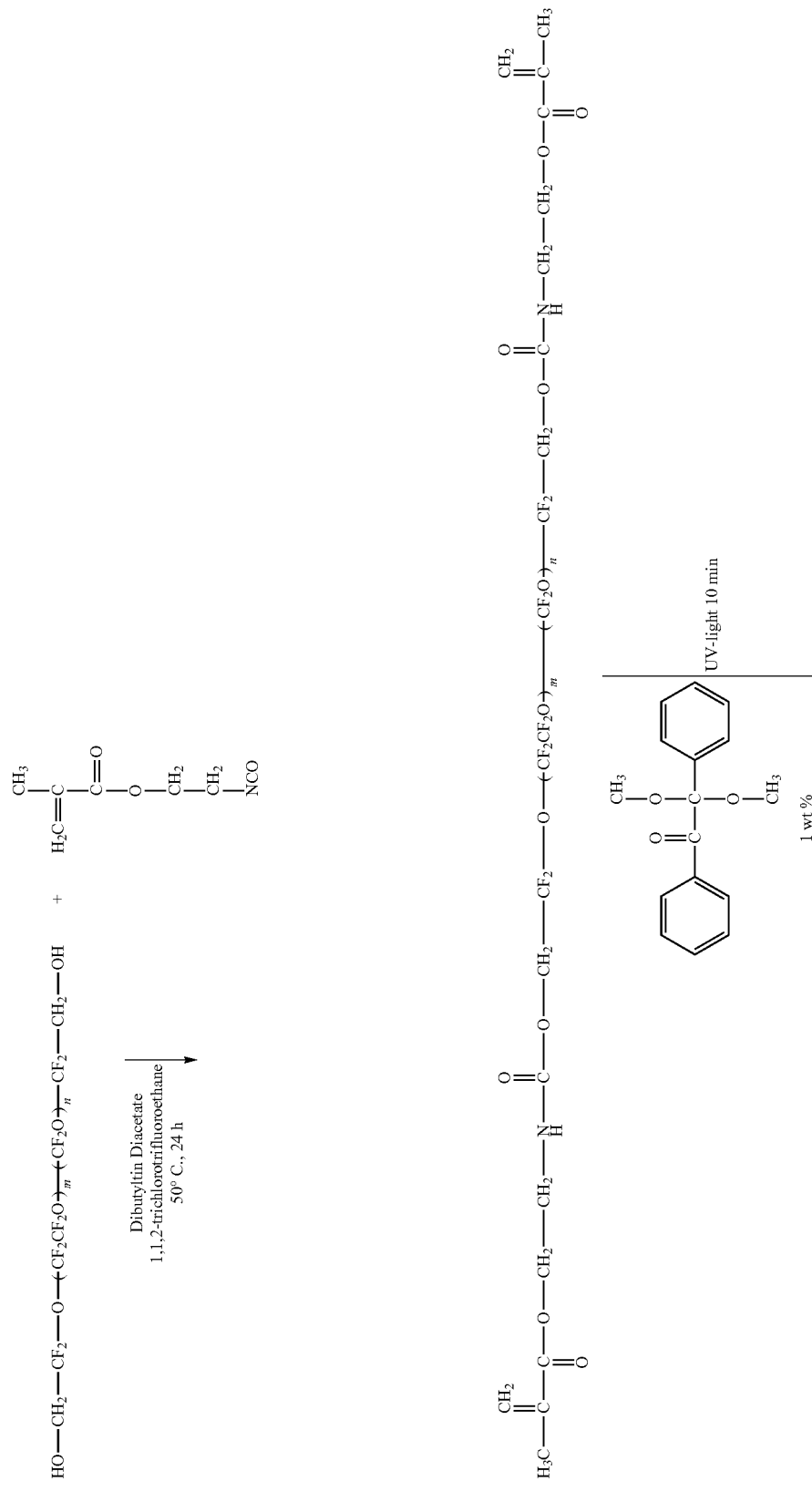
Scheme 1. Synthesis and Photocuring of Functionalized Perfluoropolyethers.

II.B. Perfluoropolyether Materials Prepared from a Liquid PFPE Precursor Material Having a Viscosity Greater Than About 100 Centistokes.

In some embodiments, the PFPE liquid precursor is synthesized from hexafluoropropylene oxide or tetrafluoro ethylene oxide as shown in Scheme 2.

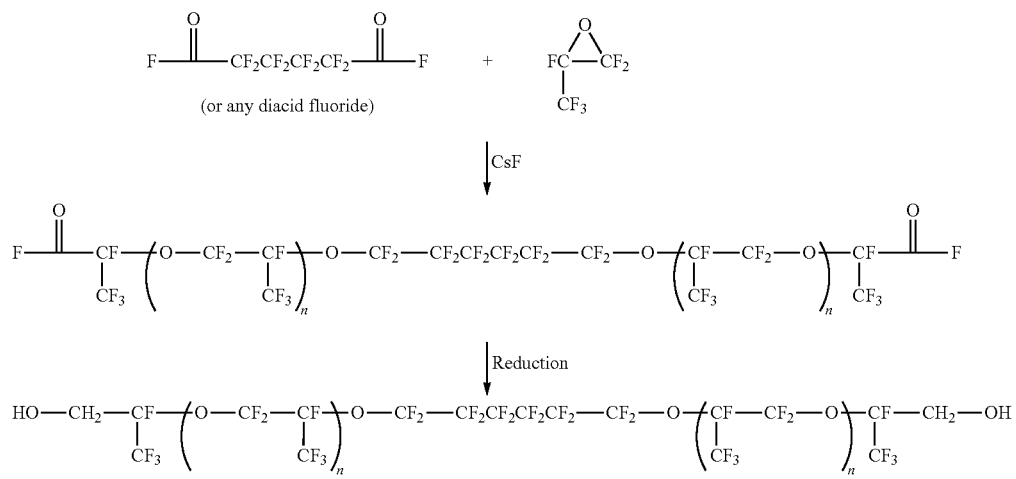

Scheme 2. Synthesis of a liquid PFPE precursor material from hexafluoropropylene oxide or tetrafluoro ethylene oxide.

The methods provided herein below for promoting and/or increasing adhesion between a layer of a PFPE material and another material and/or a substrate and for adding a chemical functionality to a surface include a PFPE material having a characteristic selected from the group including, but not limited to a viscosity greater than about 100 centistokes (cSt) and a viscosity less than about 100 cSt, provided that the liquid PFPE precursor material having a viscosity less than 100 cSt is not a free-radically photocurable PFPE material. As provided herein, the viscosity of a liquid PFPE precursor material refers to the viscosity of that material prior to functionalization, e.g., functionalization with a methacrylate or a styrenic group.

Thus, in some embodiments, PFPE material is prepared from a liquid PFPE precursor material having a viscosity greater than about 100 centistokes (cSt). In some embodiments, the liquid PFPE precursor is end-capped with a polymerizable group. In some embodiments, the polymerizable group is selected from the group including, but not limited to an acrylate, a methacrylate, an epoxy, an amino, a carboxylic, an anhydride, a maleimide, an isocyanato, an olefinic, and a styrenic group. In some embodiments, the PFPE material includes a backbone structure selected from the group including, but not limited to:

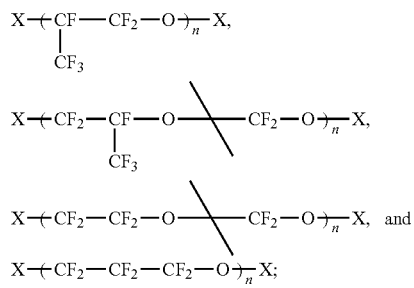

wherein X is present or absent, and when present includes an endcapping group, and n is an integer from 1 to 100.

In some embodiments, the liquid PFPE precursor is synthesized from hexafluoropropylene oxide or tetrafluoro ethylene oxide as shown in Scheme 3.

Scheme 3.
Synthesis of a liquid PFPE precursor material
from hexafluoropropylene oxide or tetrafluoro ethylene oxide.

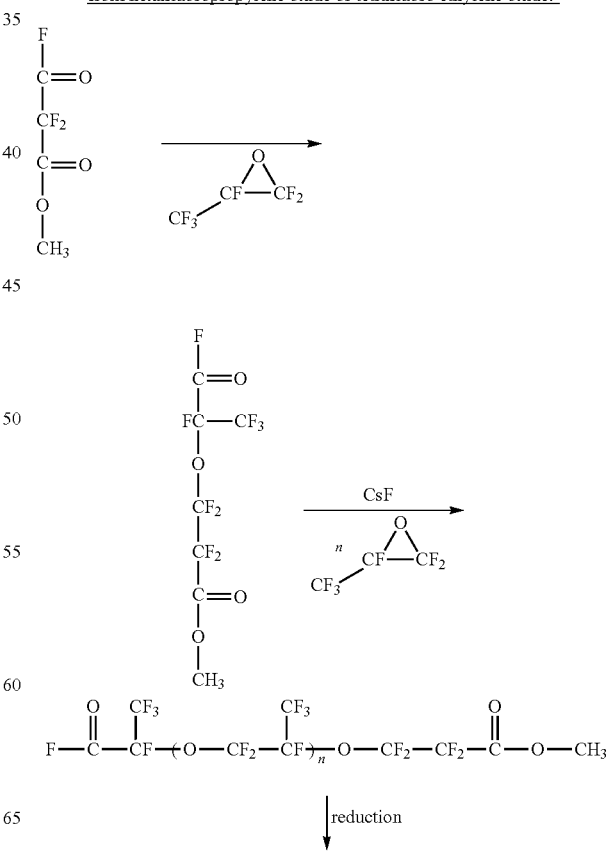

-continued

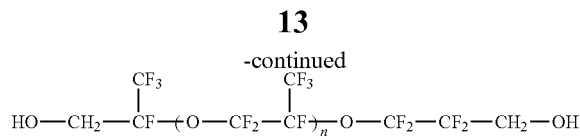

In some embodiments the liquid PFPE precursor includes a chain extended material such that two or more chains are linked together before adding polymerizable groups. Accordingly, in some embodiments, a "linker group" joins two chains to one molecule. In some embodiments, as shown in Scheme 4, the linker group joins three or more chains.

Scheme 4. Linker group joining three PFPE chains.

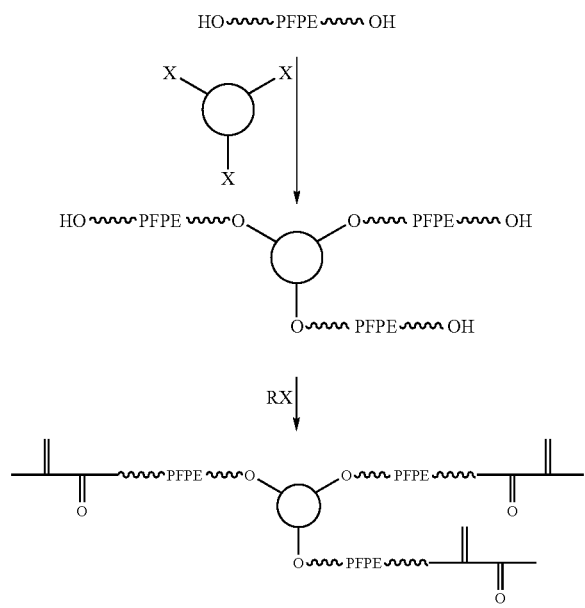

In some embodiments, X is selected from the group including, but not limited to an isocyanate, an acid chloride, an epoxy, and a halogen. In some embodiments, R is selected from the group including, but not limited to an acrylate, a methacrylate, a styrene, an epoxy, a carboxylic, an anhydride, a maleimide, an isocyanate, an olefinic, and an amine. In some embodiments, the circle represents any multifunctional molecule. In some embodiments, the multifunctional molecule includes a cyclic molecule. PFPE refers to any PFPE material provided herein.

In some embodiments, the liquid PFPE precursor includes a hyperbranched polymer as provided in Scheme 5, wherein PFPE refers to any PFPE material provided herein.

Scheme 5. Hyperbranched PFPE liquid precursor material.

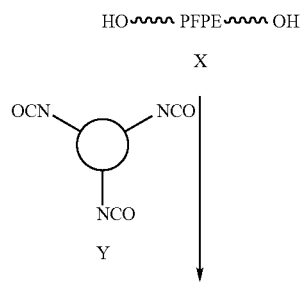

-continued

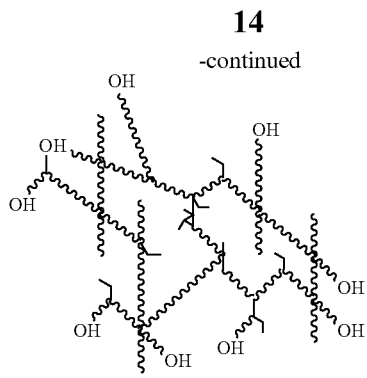

OH∼∼∼∼ = PFPE Chain

Hyperbranched PFPE precursor

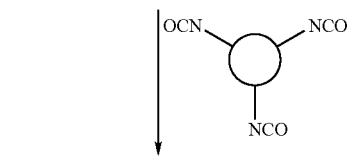

Crosslinked Hyperbranched PFPE Network

In some embodiments, the liquid PFPE material includes an end-functionalized material selected from the group including, but not limited to:

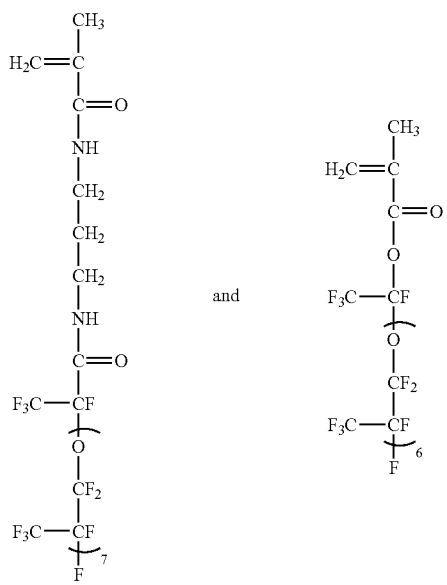

In some embodiments the PFPE liquid precursor is encapped with an epoxy moiety that can be photocured using a photoacid generator. Photoacid generators suitable for use in the presently disclosed subject matter include, but are not limited to: bis(4-tert-butylphenyl)iodonium p-toluenesulfonate, bis(4-tert-butylphenyl)iodonium triflate, (4-bromophenyl)diphenylsulfonium triflate, (tert-butoxycarbonylmethoxynaphthyl)-diphenylsulfonium triflate, (tent-butoxycarbonylmethoxyphenyl)diphenylsulfonium triflate, (4-tert-butylphenyl)diphenylsulfonium triflate, (4-chlorophenyl)diphenylsulfonium triflate, diphenyliodonium-9,10-dimethoxyanthracene-2-sulfonate, diphenyliodonium hexafluorophosphate, diphenyliodonium nitrate, diphenyliodonium perfluoro-1-butanesulfonate, diphenyliodonium p-toluenesulfonate, diphenyliodonium triflate, (4-fluorophenyl)diphenylsulfonium triflate, N-hydroxynaphthalimide triflate, N-hydroxy-5-norbornene-2,3-dicarboximide perfluoro-1-butanesulfonate, N-hydroxyphthalimide triflate, [4-[(2-hydroxytetradecyl)oxy]phenyl]phenyliodonium hexafluoroantimonate, (4-iodophenyl)diphenylsulfonium triflate, (4-methoxyphenyl)diphenylsulfonium triflate, 2-(4-methoxystyryl)-4,6-bis(trichloromethyl)-1,3,5-triazine, (4-methylphenyl)diphenylsulfonium triflate, (4-methylthiophenyl)methyl phenyl sulfonium triflate, 2-naphthyl diphenylsulfonium triflate, (4-phenoxyphenyl)diphenylsulfonium triflate, (4-phenylthiophenyl)diphenylsulfonium triflate, thiobis(triphenyl sulfonium hexafluorophosphate), triarylsulfonium hexafluoroantimonate salts, triarylsulfonium hexafluorophosphate salts, triphenylsulfonium perfluoro-1-butanesulfonate, triphenylsulfonium triflate, tris(4-tert-butylphenyl)sulfonium perfluoro-1-butanesulfonate, and tris(4-tert-butylphenyl)sulfonium triflate.

In some embodiments the liquid PFPE precursor cures into a highly UV and/or highly visible light transparent elastomer. In some embodiments the liquid PFPE precursor cures into an elastomer that is highly permeable to oxygen, carbon dioxide, and nitrogen, a property that can facilitate maintaining the viability of biological fluids/cells disposed therein. In some embodiments, additives are added or layers are created to enhance the barrier properties of the articles to molecules, such as oxygen, carbon dioxide, nitrogen, dyes, reagents, and the like.

In some embodiments, the material suitable for use with the presently disclosed subject matter includes a silicone material having a fluoroalkyl functionalized polydimethylsiloxane (PDMS) having the following structure:

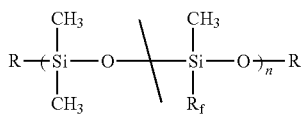

wherein:
R is selected from the group including, but not limited to an acrylate, a methacrylate, and a vinyl group;
$R_f$ includes a fluoroalkyl chain; and
n is an integer from 1 to 100,000.

In some embodiments, the material suitable for use with the presently disclosed subject matter includes a styrenic material having a fluorinated styrene monomer selected from the group including, but not limited to:

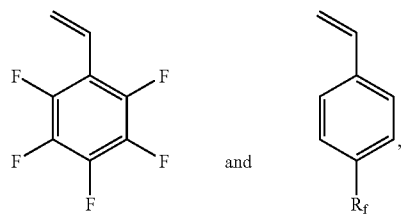

wherein $R_f$ includes a fluoroalkyl chain.

In some embodiments, the material suitable for use with the presently disclosed subject matter includes an acrylate material having a fluorinated acrylate or a fluorinated methacrylate having the following structure:

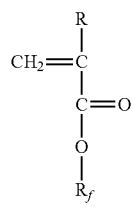

wherein:
R is selected from the group including, but not limited to H, alkyl, substituted alkyl, aryl, and substituted aryl; and
$R_f$ includes a fluoroalkyl chain with a —$CH_2$— or a —$CH_2$—$CH_2$— spacer between a perfluoroalkyl chain and the ester linkage. In some embodiments, the perfluoroalkyl group has hydrogen substituents.

In some embodiments, the material suitable for use with the presently disclosed subject matter includes a triazine fluoropolymer having a fluorinated monomer.

In some embodiments, the fluorinated monomer or fluorinated oligomer that can be polymerized or crosslinked by a metathesis polymerization reaction includes a functionalized olefin. In some embodiments, the functionalized olefin includes a functionalized cyclic olefin.

According to an alternative embodiment, the PFPE material includes a urethane block as described and shown in the following structures provided in Scheme 6:

Scheme 6. PFPE Urethane Tetrafunctional Methacrylate

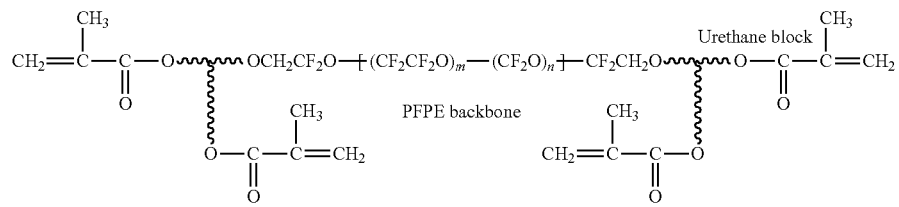

PFPE Urethane Tetrafunctional Methacrylate

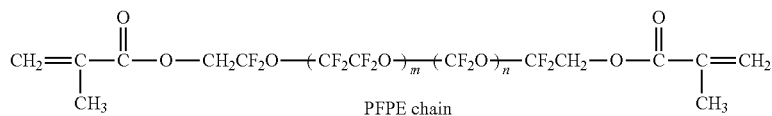

PFPE methacrylate

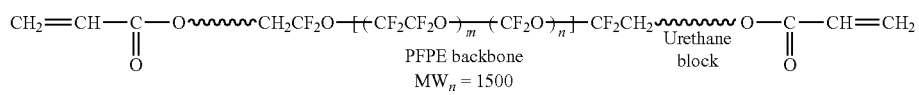

PFPE urethaneacrylate

According to an embodiment of the present invention, PFPE urethane tetrafunctional methacrylate materials such as the above described can be used as the materials and methods of the present invention or can be used in combination with other materials and methods described herein, as will be appreciated by one of ordinary skill in the art.

Scheme 7. PFPE Urethane Systems
According to some embodiments, urethane systems include materials with the following structures.
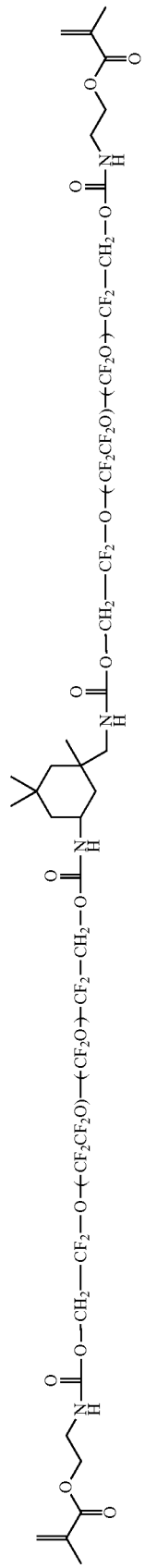
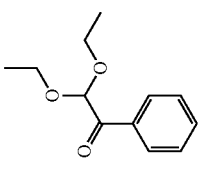
MW of PFPE component = 4,000 g/mol
0.5 wt % photoinitiator
Part A
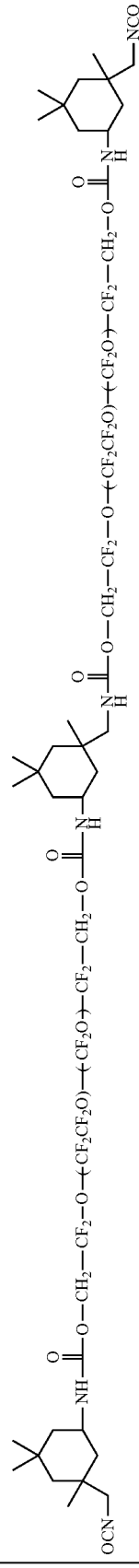
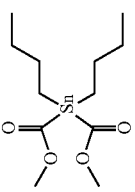
MW of PFPE component = 4,000 g/mol
~0.1 wt % catalyst
Part B Part C
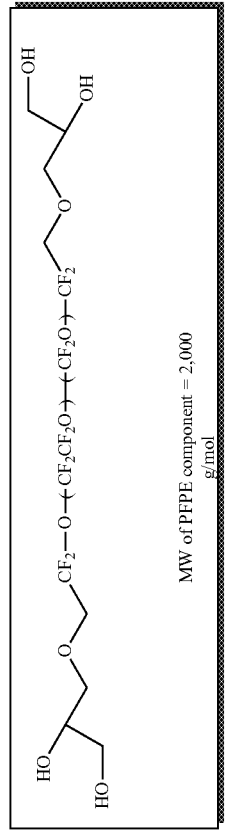
Part D
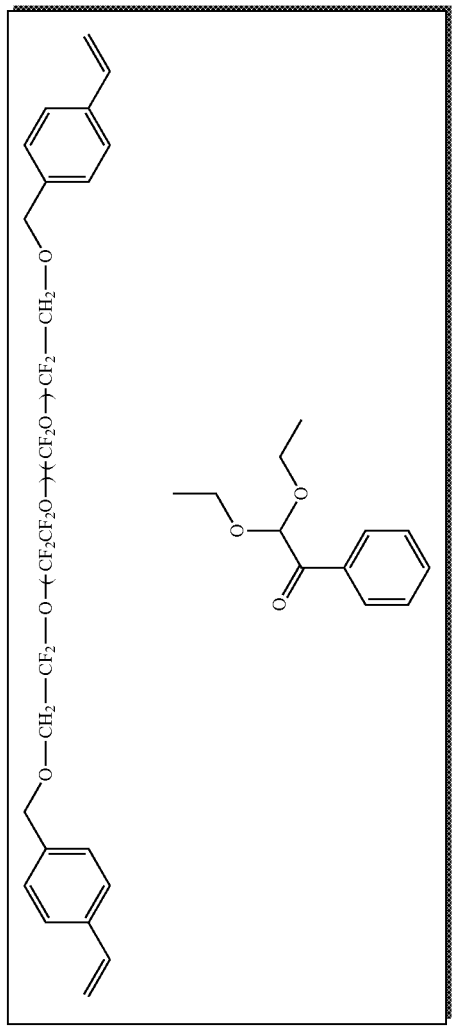

According to this scheme, part A is a UV curable precursor and parts B and C make up a thermally curable component of the urethane system. The fourth component, part D, is an end-capped precursor, (e.g., styrene end-capped liquid precursor). According to some embodiments, part D reacts with latent methacrylate, acrylate, or styrene groups contained in a base material, thereby adding chemical compatibility or a surface passivation to the base material and increasing the functionality of the base material.

II.C. Fluoroolefin-based Materials

Further, in some embodiments, the materials used herein are selected from highly fluorinated fluoroelastomers, e.g., fluoroelastomers having at least fifty-eight weight percent fluorine, as described in U.S. Pat. No. 6,512,063 to Tang, which is incorporated herein by reference in its entirety. Such fluoroelastomers can be partially fluorinated or perfluorinated and can contain between 25 to 70 weight percent, based on the weight of the fluoroelastomer, of copolymerized units of a first monomer, e.g., vinylidene fluoride ($VF_2$) or tetrafluoroethylene (TFE). The remaining units of the fluoroelastomers include one or more additional copolymerized monomers, that are different from the first monomer, and are selected from the group including, but not limited to fluorine-containing olefins, fluorine containing vinyl ethers, hydrocarbon olefins, and combinations thereof.

These fluoroelastomers include VITON® (DuPont Dow Elastomers, Wilmington, Del., United States of America) and Kel-F type polymers, as described in U.S. Pat. No. 6,408,878 to Unger et al. These commercially available polymers, however, have Mooney viscosities ranging from about 40 to 65 (ML 1+10 at 121° C.) giving them a tacky, gum-like viscosity. When cured, they become a stiff, opaque solid. As currently available, VITON® and Kel-F have limited utility for microscale molding. Curable species of similar compositions, but having lower viscosity and greater optical clarity, is needed in the art for the applications described herein. A lower viscosity (e.g., 2 to 32 (ML 1+10 at 121° C.)) or more preferably as low as 80 to 2000 cSt at 20° C., composition yields a pourable liquid with a more efficient cure.

More particularly, the fluorine-containing olefins include, but are not limited to, vinylidine fluoride, hexafluoropropylene (HFP), tetrafluoroethylene (TFE), 1,2,3,3,3-pentafluoropropene (1-HPFP), chlorotrifluoroethylene (CTFE) and vinyl fluoride.

The fluorine-containing vinyl ethers include, but are not limited to perfluoro(alkyl vinyl)ethers (PAVEs). More particularly, perfluoro(alkyl vinyl)ethers for use as monomers include perfluoro(alkyl vinyl)ethers of the following formula:

$$CF_2=CFO(R_fO)_n(R_fO)_mR_f$$

wherein each $R_f$ is independently a linear or branched $C_1$-$C_6$ perfluoroalkylene group, and m and n are each independently an integer from 0 to 10.

In some embodiments, the perfluoro(alkyl vinyl)ether includes a monomer of the following formula:

$$CF_2=CFO(CF_2CFXO)_nR_f$$

wherein X is F or $CF_3$, n is an integer from 0 to 5, and $R_f$ is a linear or branched $C_1$-$C_6$ perfluoroalkylene group. In some embodiments, n is 0 or 1 and $R_f$ includes 1 to 3 carbon atoms. Representative examples of such perfluoro(alkyl vinyl)ethers include perfluoro(methyl vinyl)ether (PMVE) and perfluoro(propyl vinyl)ether (PPVE). In some embodiments, the perfluoro(alkyl vinyl)ether includes a monomer of the following formula:

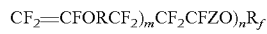

wherein $R_f$ is a perfluoroalkyl group having 1-6 carbon atoms, m is an integer from 0 or 1, n is an integer from 0 to 5, and Z is F or $CF_3$. In some embodiments, $R_f$ is $C_3F_7$, m is 0, and n is 1.

In some embodiments, the perfluoro(alkyl vinyl)ether monomers include compounds of the formula:

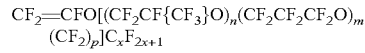

wherein m and n each integers independently from 0 to 10, p is an integer from 0 to 3, and x is an integer from 1 to 5. In some embodiments, n is 0 or 1, m is 0 or 1, and x is Other examples of useful perfluoro(alkyl vinyl ethers) include:

$$CF_2=CFOCF_2CF(CF_3)0(CF_2O)_mC_nF_{2n+1}$$

wherein n is an integer from 1 to 5, m is an integer from 1 to 3. In some embodiments, n is 1.

In embodiments wherein copolymerized units of a perfluoro(alkyl vinyl)ether (PAVE) are present in the presently described fluoroelastomers, the PAVE content generally ranges from 25 to 75 weight percent, based on the total weight of the fluoroelastomer. If the PAVE is perfluoro(methyl vinyl) ether (PMVE), then the fluoroelastomer contains between 30 and 55 wt. % copolymerized PMVE units.

Hydrocarbon olefins useful in the presently described fluoroelastomers include, but are not limited to ethylene (E) and propylene (P). In embodiments wherein copolymerized units of a hydrocarbon olefin are present in the presently described fluoroelastomers, the hydrocarbon olefin content is generally 4 to 30 weight percent.

Further, the presently described fluoroelastomers can, in some embodiments, include units of one or more cure site monomers. Examples of suitable cure site monomers include: i) bromine-containing olefins; ii) iodine-containing olefins; iii) bromine-containing vinyl ethers; iv) iodine-containing vinyl ethers; v) fluorine-containing olefins having a nitrile group; yl) fluorine-containing vinyl ethers having a nitrile group; vii) 1,1,3,3,3-pentafluoropropene (2-HPFP); viii) perfluoro(2-phenoxypropyl vinyl)ether; and ix) non-conjugated dienes.

In certain embodiments, the brominated cure site monomers can contain other halogens, preferably fluorine. Examples of brominated olefin cure site monomers are $CF_2=CFOCF_2CF_2CF_2OCF_2CF_2Br$; bromotrifluoroethylene; 4-bromo-3,3,4,4-tetrafluorobutene-1 (BTFB); and others such as vinyl bromide, 1-bromo-2,2-difluoroethylene; perfluoroallyl bromide; 4-bromo-1,1,2-trifluorobutene-1; 4-bromo-1,1,3,3,4,4,-hexafluorobutene; 4-bromo-3-chloro-1,1,3,4,4-pentafluorobutene; 6-bromo-5,5,6,6-tetrafluorohexene; 4-bromoperfluorobutene-1 and 3,3-difluoroallyl bromide. Brominated vinyl ether cure site monomers include 2-bromo-perfluoroethyl perfluorovinyl ether and fluorinated compounds of the class $CF_2Br$—$R_f$—O—CF=$CF_2$ (wherein $R_f$ is a perfluoroalkylene group), such as $CF_2BrCF_2O$—CF=$CF_2$, and fluorovinyl ethers of the class ROCF=CFBr or ROCBr=$CF_2$ (wherein R is a lower alkyl group or fluoroalkyl group), such as $CH_3OCF$=CFBr or $CF_3CH_2OCF$=CFBr.

Suitable iodinated cure site monomers include iodinated olefins of the formula: CHR=CH—Z—$CH_2$CHR—I, wherein R is —H or —$CH_3$; Z is a $C_1$ to $C_{18}$ (per)fluoroalkylene radical, linear or branched, optionally containing one or more ether oxygen atoms, or a (per)fluoropolyoxyalkylene radical as disclosed in U.S. Pat. No. 5,674,959. Other examples of useful iodinated cure site monomers are unsaturated ethers of the formula: I($CH_2CF_2CF_2)_n$OCF=$CF_2$ and ICH$_2$CF$_2$O[CF(CF$_3$)CF$_2$O]$_n$CF=CF$_2$, and the like, wherein n is an integer from 1 to 3, such as disclosed in U.S. Pat. No. 5,717,036. In addition, suitable iodinated cure site monomers including iodoethylene, 4-iodo-3,3,4,4-tetrafluorobutene-1 (ITFB); 3-chloro-4-iodo-3,4,4-trifluorobutene; 2-iodo-1,1,2,2-tetrafluoro-1-(vinyloxy)ethane; 2-iodo-1-(perfluorovinyloxy)-1,1,2,2-tetrafluoroethylene; 1,1,2,3,3,3-hexafluoro-2-iodo-1-(perfluorovinyloxy)propane; 2-iodoethyl vinyl ether; 3,3,4,5,5,5-hexafluoro-4-iodopentene; and iodotrifluoroethylene are disclosed in U.S. Pat. No. 4,694,045. Allyl iodide and 2-iodo-perfluoroethyl perfluorovinyl ether also are useful cure site monomers.

Useful nitrile-containing cure site monomers include, but are not limited to those of the formulas shown below:

$$CF_2=CF—O(CF_2)_nCN$$

wherein n is an integer from 2 to 12. In some embodiments, n is an integer from 2 to 6.

$$CF_2=CF—O[CF_2—CF(CF)—O]_n—CF_2CF(CF_3)—CN$$

wherein n is an integer from 0 to 4. In some embodiments, n is an integer from 0 to 2.

$$CF_2=CF—[OCF_2CF(CF_3)]_x—O—(CF_2)_n—CN$$

wherein x is 1 or 2, and n is an integer from 1 to 4; and $$CF_2=CF—O—(CF_2)_n—O—CF(CF_3)—CN$$

wherein n is an integer from 2 to 4. In some embodiments, the cure site monomers are perfluorinated polyethers having a nitrile group and a trifluorovinyl ether group.

In some embodiments, the cure site monomer is:

$$CF_2=CFOCF_2CF(CF_3)OCF_2CF_2CN$$

i.e., perfluoro(8-cyano-5-methyl-3,6-dioxa-1-octene) or 8-CNVE.

Examples of non-conjugated diene cure site monomers include, but are not limited to 1,4-pentadiene; 1,5-hexadiene; 1,7-octadiene; 3,3,4,4-tetrafluoro-1,5-hexadiene; and others, such as those disclosed in Canadian Patent No. 2,067,891 and European Patent No. 0784064A1. A suitable triene is 8-methyl-4-ethylidene-1,7-octadiene.

In embodiments wherein the fluoroelastomer will be cured with peroxide, the cure site monomer is preferably selected from the group including, but not limited to 4-bromo-3,3,4,4-tetrafluorobutene-1 (BTFB); 4-iodo-3,3,4,4-tetrafluorobutene-1 (ITFB); allyl iodide; bromotrifluoroethylene and 8-CNVE. In embodiments wherein the fluoroelastomer will be cured with a polyol, 2-HPFP or perfluoro(2-phenoxypropyl vinyl) ether is the preferred cure site monomer. In embodiments wherein the fluoroelastomer will be cured with a tetraamine, bis(aminophenol) or bis(thioaminophenol), 8-CNVE is the preferred cure site monomer.

Units of cure site monomer, when present in the presently disclosed fluoroelastomers, are typically present at a level of 0.05-10 wt. % (based on the total weight of fluoroelastomer), preferably 0.05-5 wt. % and most preferably between 0.05 and 3 wt. %.

Fluoroelastomers which can be used in the presently disclosed subject matter include, but are not limited to, those having at least 58 wt. % fluorine and having copolymerized units of i) vinylidene fluoride and hexafluoropropylene; ii) vinylidene fluoride, hexafluoropropylene and tetrafluoroethylene; iii) vinylidene fluoride, hexafluoropropylene, tetrafluoroethylene and 4-bromo-3,3,4,4-tetrafluorobutene-1; iv) vinylidene fluoride, hexafluoropropylene, tetrafluoroethylene and 4-iodo-3,3,4,4-tetrafluorobutene-1; v) vinylidene fluoride, perfluoro(methyl vinyl)ether, tetrafluoroethylene and 4-bromo-3,3,4,4-tetrafluorobutene-1; yl) vinylidene fluoride, perfluoro(methyl vinyl)ether, tetrafluoroethylene and 4-iodo-3,3,4,4-tetrafluorobutene-1; vii) vinylidene fluoride, perfluoro(methyl vinyl)ether, tetrafluoroethylene and 1,1,3,3,3-pentafluoropropene; viii) tetrafluoroethylene, perfluoro(methyl vinyl)ether and ethylene; ix) tetrafluoroethylene, perfluoro(methyl vinyl)ether, ethylene and 4-bromo-3,3,4,4-tetrafluorobutene-1; x) tetrafluoroethylene, perfluoro(methyl vinyl)ether, ethylene and 4-iodo-3,3,4,4-tetrafluorobutene-1; xi) tetrafluoroethylene, propylene and vinylidene fluoride; xii) tetrafluoroethylene and perfluoro(methyl vinyl)ether; xiii) tetrafluoroethylene, perfluoro(methyl vinyl)ether and perfluoro(8-cyano-5-methyl-3,6-dioxa-1-octene); xiv) tetrafluoroethylene, perfluoro(methyl vinyl) ether and 4-bromo-3,3,4,4-tetrafluorobutene-1; xv) tetrafluoroethylene, perfluoro(methyl vinyl)ether and 4-iodo-3,3,4,4-tetrafluorobutene-1; and xvi) tetrafluoroethylene, perfluoro(methyl vinyl) ether and perfluoro(2-phenoxypropyl vinyl) ether.

Additionally, iodine-containing endgroups, bromine-containing endgroups or combinations thereof can optionally be present at one or both of the fluoroelastomer polymer chain ends as a result of the use of chain transfer or molecular weight regulating agents during preparation of the fluoroelastomers. The amount of chain transfer agent, when employed, is calculated to result in an iodine or bromine level in the fluoroelastomer in the range of 0.005-5 wt. %, preferably 0.05-3 wt. %.

Examples of chain transfer agents include iodine-containing compounds that result in incorporation of bound iodine at one or both ends of the polymer molecules. Methylene iodide; 1,4-diiodoperfluoro-n-butane; and 1,6-diiodo-3,3,4,4-tetrafluorohexane are representative of such agents. Other iodinated chain transfer agents include 1,3-diiodoperfluoropropane; 1,6-diiodoperfluorohexane; 1,3-diiodo-2-chloroperfluoropropane; 1,2-di(iododifluoromethyl)perfluorocyclobutane; monoiodoperfluoroethane; monoiodoperfluorobutane; 2-iodo-1-hydroperfluoroethane, and the like. Also included are the cyano-iodine chain transfer agents disclosed European Patent No. 0868447A1. Particularly preferred are diiodinated chain transfer agents.

Examples of brominated chain transfer agents include 1-bromo-2-iodoperfluoroethane; 1-bromo-3-iodoperfluoropropane; 1-iodo-2-bromo-1,1-difluoroethane and others such as disclosed in U.S. Pat. No. 5,151,492.

Other chain transfer agents suitable for use include those disclosed in U.S. Pat. No. 3,707,529. Examples of such agents include isopropanol, diethylmalonate, ethyl acetate, carbon tetrachloride, acetone and dodecyl mercaptan.

II.D. Dual Photo-curable and Thermal-curable Materials

According to other embodiments of the present invention, a dual cure material includes one or more of a photo-curable constituent and a thermal-curable constituent. In one embodiment, the photo-curable constituent is independent from the thermal-curable constituent such that the material can undergo multiple cures. A material having the ability to undergo multiple cures is useful, for example, in forming layered articles or in connecting or attaching articles to other articles or portions or components of articles to other portions or components of articles. For example, a liquid material having photocurable and thermal-curable constituents can undergo a first cure to form a first article through, for example, a photocuring process or a thermal curing process. Then the photocured or thermal cured first article can be adhered to a second article of the same material or any material similar thereto that will thermally cure or photocure and bind to the material of the first article. By positioning the first article and second article adjacent one another and subjecting the first and second articles to a thermal curing or photocuring, whichever component that was not activated on the first curing. Thereafter, either the thermal cure constituents of the first article that were left un-activated by the photocuring process or the photocure constituents of the first article that were left un-activated by the first thermal curing, will be activated and bind the second article. Thereby, the first and second articles become adhered together. It will be appreciated by one of ordinary skill in the art that the order of curing processes is independent and a thermal-curing could occur first followed by a photocuring or a photocuring could occur first followed by a thermal curing.

According to yet another embodiment, dual cure materials can include multiple thermo-curable constituents included in the material such that the material can be subjected to multiple independent thermal-cures. For example, the multiple thermal-curable constituents can have different activation temperature ranges such that the material can undergo a first thermal-cure at a first temperature range and a second thermal-cure at a second temperature range. Accordingly, the material can be adhered to multiple other materials through different thermal-cures, thereby, forming a multiple laminate layer article.

According to another embodiment, dual cure materials can include materials having multiple photo curable constituents that can be triggered at different wavelengths. For example, a first photo curable constituent can be triggered at a fisrt applied wavelength and such wavelength can leave a second photo curable constituent available for activation at a second wavelength.

Examples of chemical groups which would be suitable end-capping agents for a UV curable component include: methacrylates, acrylates, styrenics, epoxides, cyclobutanes and other 2+2 cycloadditions, combinations thereof, and the like. Examples of chemical group pairs which are suitable to endcap a thermally curable component include: epoxy/amine, epoxy/hydroxyl, carboxylic acid/amine, carboxylic acid/hydroxyl, ester/amine, ester/hydroxyl, amine/anhydride, acid halide/hydroxyl, acid halide/amine, amine/halide, hydroxyl/halide, hydroxyl/chlorosilane, azide/acetylene and other so-called "click chemistry" reactions, and metathesis reactions involving the use of Grubb's-type catalysts, combinations thereof, and the like.

The presently disclosed methods for the adhesion of multiple layers of a article to one another or to a separate surface can be applied to PFPE-based materials, as well as a variety of other materials, including PDMS and other liquid-like polymers. Examples of liquid-like polymeric materials that are suitable for use in the presently disclosed adhesion methods include, but are not limited to, PDMS, poly(tetramethylene oxide), poly(ethylene oxide), poly(oxetanes), polyisoprene, polybutadiene, and fluoroolefin-based fluoroelastomers, such as those available under the registered trademarks VITON® AND KALREZ®.

Accordingly, the presently disclosed methods can be used to adhere layers of different polymeric materials together to form articles, such as laminate moldes, and the like.

II.E. Silicone Based Materials

According to alternate embodiments, novel silicone based materials include photocurable and thermal-curable components. In such alternate embodiments, silicone based materials can include one or more photo-curable and thermal-curable components such that the silicone based material has a dual curing capability as described herein. Silicone based materials compatible with the present invention are described herein and throughout the reference materials incorporated by reference into this application.

II.F. Phosphazene-Containing Polymers

According to some embodiments, articles and methods disclosed herein can be formed with materials that include phosphazene-containing polymers having the following structure. According to these embodiments, R, in the structure below, can be a fluorine-containing alkyl chain. Examples of such fluorine-containing alkyl chains can be found in *Langmuir*, 2005, 21, 11604, the disclosure of which is incorporated herein by reference in its entirety. The articles disclosed in this application can be formed from phosphazene-containing polymers or from PFPE in combination with phosphazene-containing polymers.

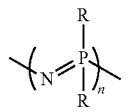

II.G. Materials End-capped with an aryl trifluorovinyl ether (TVE)

In some embodiments, articles and methods disclosed herein can be formed with materials that include materials end-capped with one or more aryl trifluorovinyl ether (TVE) group, as shown in the structure below. Examples of materials end-capped with a TVE group can be found in *Macromolecules*, 2003, 36, 9000, which is incorporated herein by reference in its entirety. These structures react in a 2+2 addition at about 150° C. to form perfluorocyclobutyl moieties. In some embodiments, Rf can be a PFPE chain. In some embodiments three or more TVE groups are present on a 3-armed PFPE polymer such that the material crosslinks into a network.

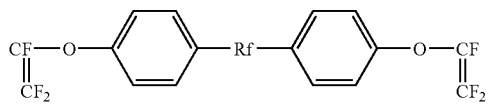

II.H. Sodium Naphthalene Etchant

In some embodiments a sodium naphthalene etchant, such as commercially available TETRAETCH™, is contacted with a layer of a fluoropolymer article, such as an article disclosed herein. In other embodiments, a sodium naphthalene etchant is contacted with a layer of a PFPE-based article, such as laminate articles disclosed herein. According to such embodiments, the etch reacts with C—F bonds in the polymer of the article forming functional groups along a surface of the article. In some embodiments, these functional groups can then be reacted with modalities on other layers, on a silicon surface, on a glass surface, on polymer surfaces, combinations thereof, or the like, thereby forming an adhesive bond. In some embodiments, such adhesive bonds available on the surface of articles disclosed herein, such as laminate mold articles, can increase adhesion between two articles, layers of an article, combinations thereof, or the like. Increasing the bonding strength between layers of a laminate mold can increase the functionality of the article, for example, by increasing the binding strength between laminate layers.

II.I. Trifunctional PFPE precursor

According to some embodiments, a trifunctional PFPE precursor can be used to fabricate articles disclosed herein, such as laminate mold articles. The trifunctional PFPE precursor disclosed herein can increase the functionality of an overall article by increasing the number of functional groups that can be added to the material. Moreover, the trifunctional PFPE precursor can provide for increased cross-linking capabilities of the material. According to such embodiments, articles can be synthesized by the following reaction scheme.

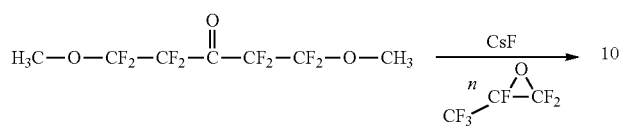

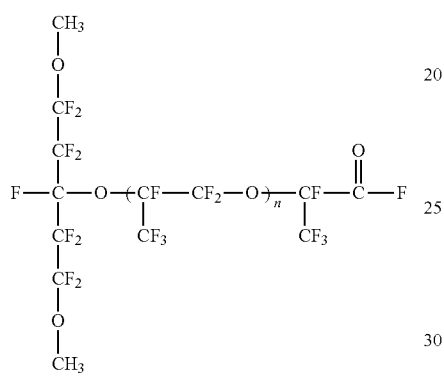

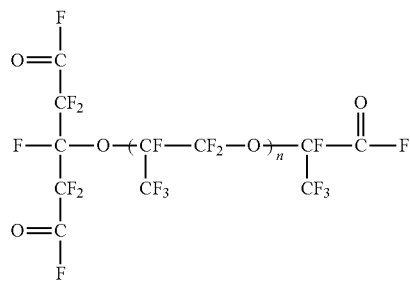

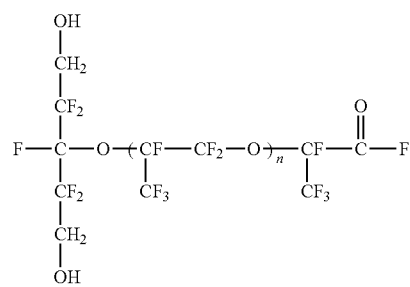

In further embodiments, a trifunctional PFPE precursor for the fabrication of articles, such as for example laminate articles disclosed herein, is synthesized by the following reaction scheme.

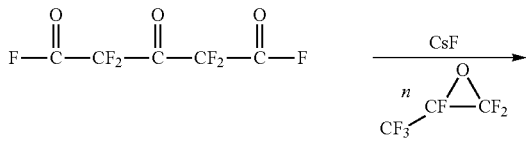

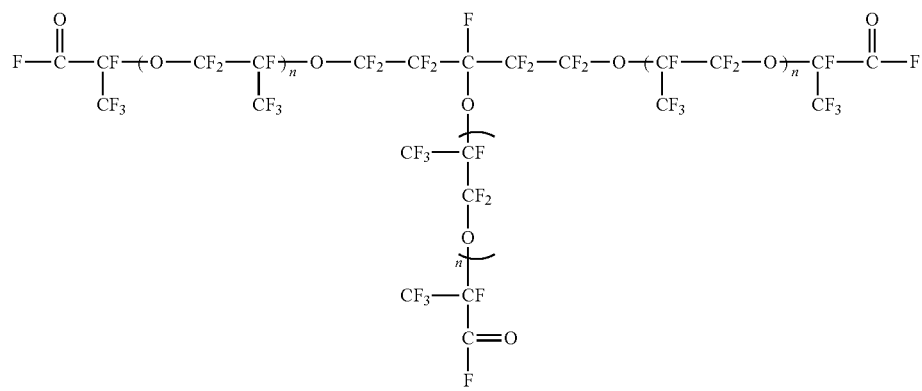

-continued

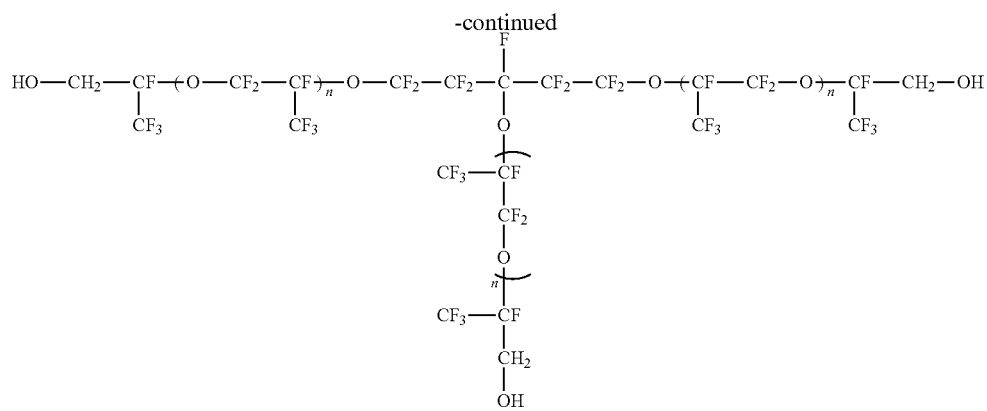

II.J. Fluoroalkyliodide Precursors for Generating Fluoropolymers and/or PFPE's In some embodiments, functional PFPEs or other fluoropolymers can be generated using fluoroalkyliodide precursors. According to such embodiments, such materials can be modified by insertion of ethylene and then transformed into a host of common functionalities including but not limited to: silanes, Gringard reagents, alcohols, cyano, thiol, epoxides, amines, and carboxylic acids.

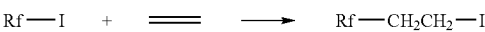

II.K. Diepoxy Materials

According to some embodiments, one or more of the PFPE precursors useful for fabricating articles disclose herein, such as laminate articles for example, contains diepoxy materials. The diepoxy materials can be synthesized by reaction of PFPE diols with epichlorohydrin according to the reaction scheme below.

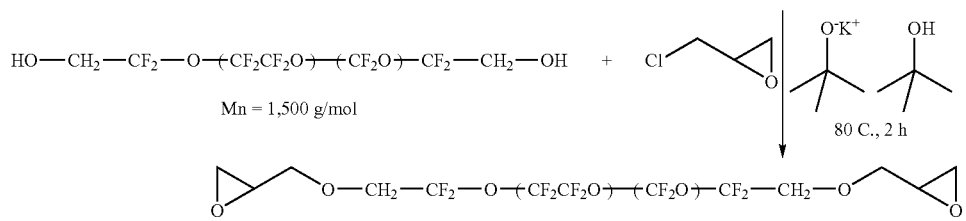

II.L. Encapped PFPE Chains with Cycloaliphatic Epoxides

In some embodiments, PFPE chains can be encapped with cycloaliphatic epoxides moeites such as cyclohexane epoxides, cyclopentane epoxides, combinations thereof, or the like. In some embodiments, the PFPE diepoxy is a chain-extending material having the structure below synthesized by varying the ratio of diol to epichlorohydrin during the synthesis. Examples of some synthesis procedures are described by Tonelli et al. in *Journal of Polymer Science: Part A: Polymer Chemistry* 1996, Vol 34, 3263, which is incorporated herein by reference in its entirety. Utilizing this method, the mechanical properties of the cured material can be tuned to predetermined standards.

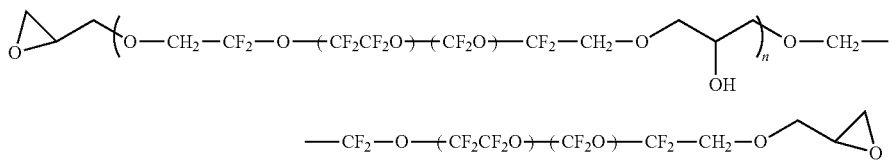

In further embodiments, the secondary alcohol formed in this reaction can be used to attach further functional groups. An example of this is shown below whereby the secondary alcohol is reacted with 2-isocyanatoethyl methacrylate to yield a material with species reactive towards both free radical and cationic curing. Functional groups such as in this example can be utilized to bond surfaces together, such as for example, layers of PFPE material in laminate molds.

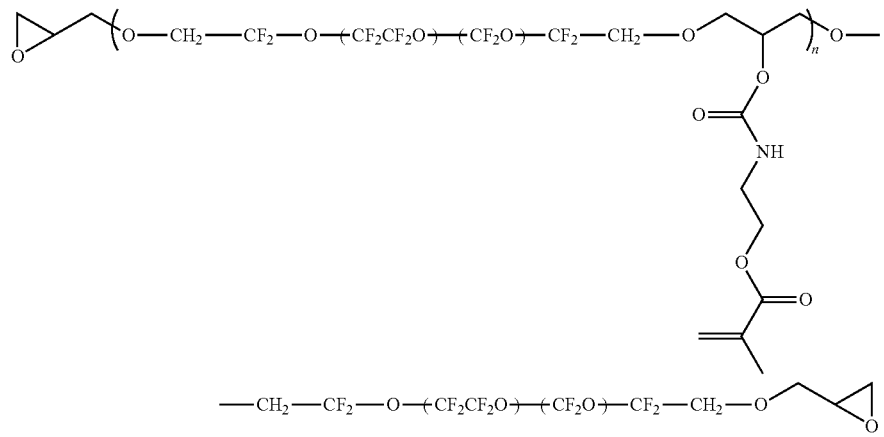

II.M. PFPE Diepoxy Cured with Diamines

In some embodiments, PFPE diepoxy can be cured with traditional diamines, including but not limited to, 1,6 hexanediamine; isophorone diamine; 1,2 ethanediamine; combinations thereof; and the like. According to some embodiments the diepoxy can be cured with imidazole compounds including those with the following or related structures where R1, R2, and R3 can be a hydrogen atom or other alkyl substituents such as methyl, ethyl, propyl, butyl, fluoroalkyl compounds, combinations thereof, and the like. According to some embodiments, the imidazole agent is added to the PFPE diepoxy in concentrations on the order of between about 1-25 mol % in relation to the epoxy content. In some embodiments the PFPE diepoxy containing an imidazole catalyst is the thermal part of a two cure system, such as described elsewhere herein.

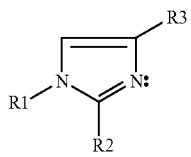

II.N. PFPE Cured with Photoacid Generators

In some embodiments, a PFPE diepoxy can be cured through the use of photoacid generators (PAGs), The PAGs are dissolved in the PFPE material in concentrations ranging from between about 1 to about 5 mol % relative to epoxy groups and cured by exposure to UV light. Specifically, for example, these photoacid generators can posses the following structure (Rhodorsil™) 2074 (Rhodia, Inc):

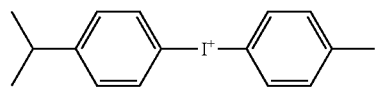

-continued

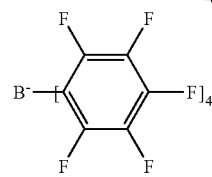

In other embodiments, the photoacid generator can be, for example, Cyracure™ (Dow Corning) possessing the following structure:

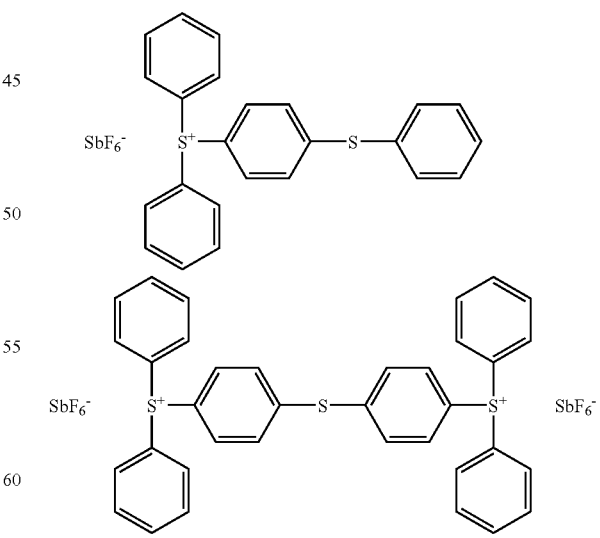

II.O. pfpe Diol Containing a Poly(Ethylene Glycol)

In some embodiments, commercially available PFPE diols containing a number of poly(ethylene glycol) units can be used as the material for fabrication of a article, such as laminate articles. In other embodiments, the commercially available PFPE diol containing a given number f poly(ethylene glycol) units is used in combination with other materials disclosed herein. Such materials can be useful for dissolving the above described photoinitiators into the PFPE diepoxy and can also be helpful in tuning mechanical properties of the material as the PFPE diol containing a poly(ethylene glycol) unit can react with propagating epoxy units and can be incorporated into the final network.

II.P. PFPE Diols and/or Polyols Mixed with a PFPE Diepoxy

In further embodiments, commercially available PFPE diols and/or polyols can be mixed with a PFPE diepoxy compound to tune mechanical properties by incorporating into the propagating epoxy network during curing.

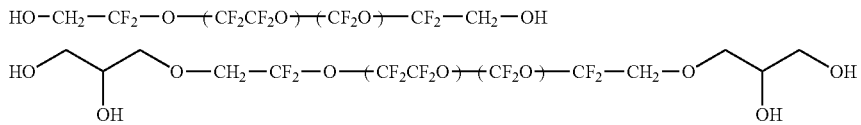

II.Q. PFPE Epoxy-Containing a Pag Blended with a Photoinitiator

In some embodiments, a PFPE epoxy-containing a PAG can be blended with between about 1 and about 5 mole % of a free radical photoinitiator such as, for example, 2,2-dimethoxyacetophenone, 1-hydroxy cyclohexyl phenyl ketone, diethoxyacetophenone, combinations thereof, or the like. These materials, when blended with a PAG, form reactive cationic species which are the product of oxidation by the PAG when the free-radical initiators are activated with UV light, as partially described by Crivello et al. *Macromolecules* 2005, 38, 3584, which is incorporated herein by reference in its entirety. Such cationic species can be capable of initiating epoxy polymerization and/or curing. The use of this method allows the PFPE diepoxy to be cured at a variety of different wavelengths.

II.R. PFPE Diepoxy Containing a Photoacid Generator and Blended with a PFPE Dimethacrylate In some embodiments, a PFPE diepoxy material containing a photoacid generator can be blended with a PFPE dimethacrylate material containing a free radical photoinitiator and possessing the following structure:

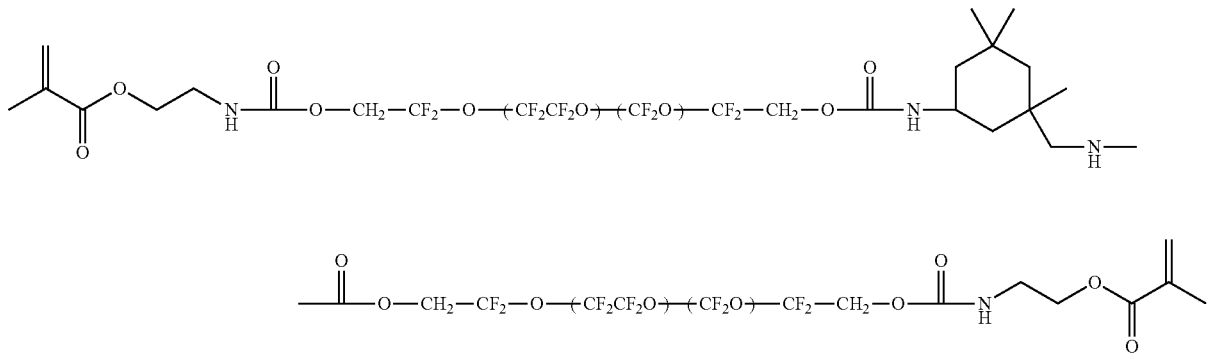

The blended material includes a dual cure material which can be cured at one wavelength, for example, curing the dimethacrylate at 365 nm, and then bonded to other layers of material through activating the curing of the second diepoxy material at another wavelength, such as for example 254 nm. In this manner, multiple layers of patterned PFPE materials can be bonded and adhered to other substrates such as glass, silicon, other polymeric materials, combinations thereof, and the like at different stages of fabrication of an overall article.

II.S. Other Materials

According to alternative embodiments, the following materials can be utilized alone, in connection with other materials disclosed herein, or modified by other materials disclosed here and applied to the methods disclosed herein to fabricate the articles disclosed herein. Moreover, end-groups disclosed herein and disclosed in U.S. Pat. Nos. 3,810,874; and 4,818,801, each of which is incorporated herein by reference including all references cited therein.

II.S.1 Diurethane Methacrylate

In some embodiments, the material is or includes diurethane methacrylate having a modulus of about 4.0 MPa and is UV curable with the following structure:

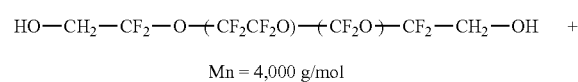
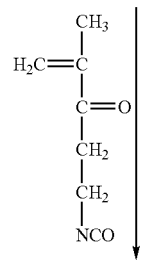
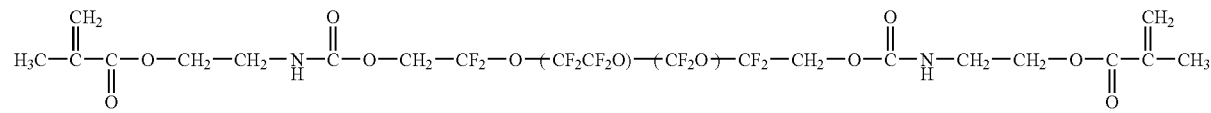

II.S.ii Chain-Extended Diurethane Methacrylate

In some embodiments, the material is or includes a chain extended diurethane methacrylate, wherein chain extension before end-capping increases molecular weight between crosslinks, a modulus of approximately 2.0 MPa, and is UV curable, having the following structure:

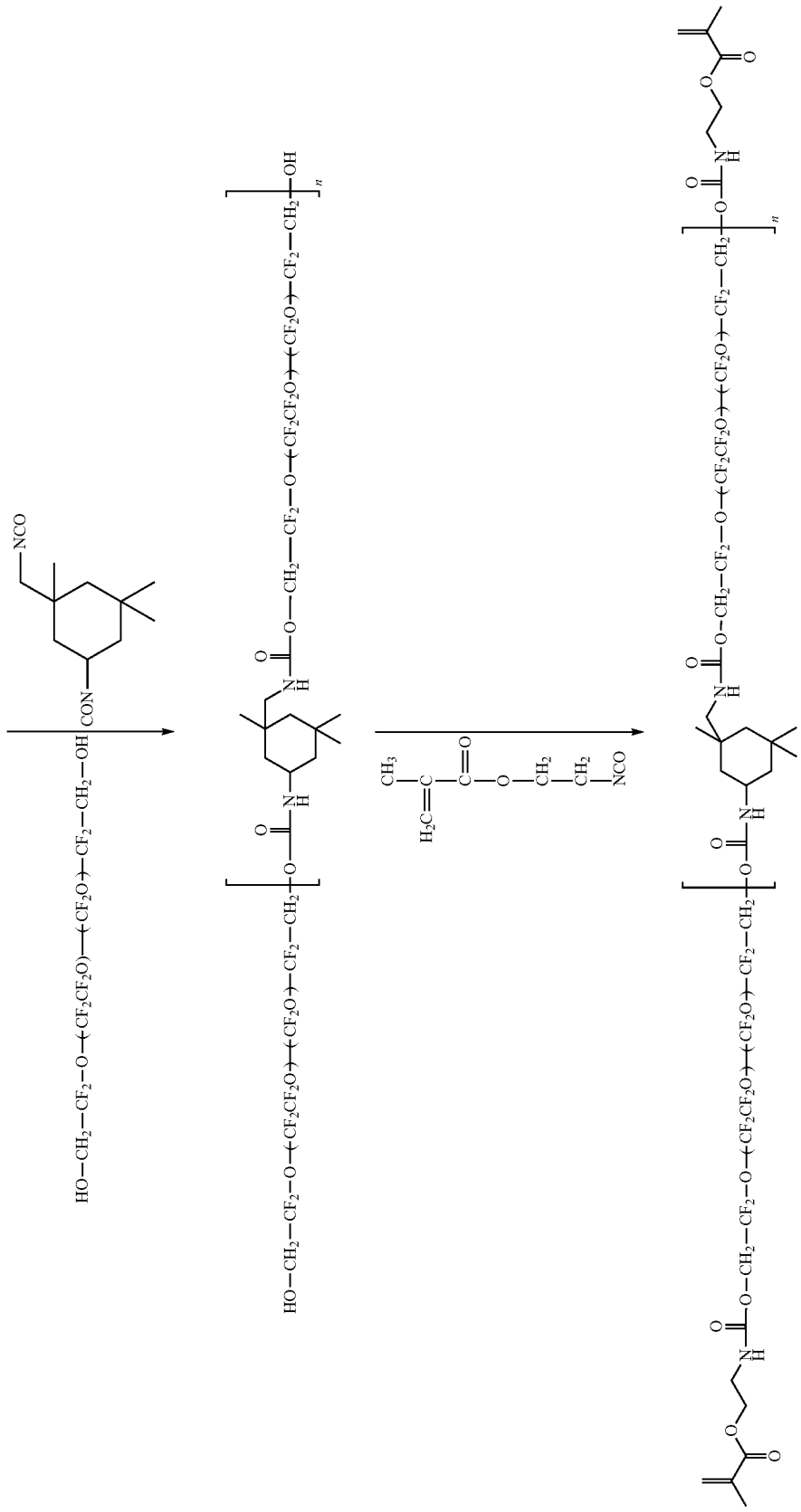

II.S.iii Diisocyanate

In some embodiments, the material is typically one component of a two-component thermally curable system; may be cured by itself through a moisture cure technique; and has the following structure:

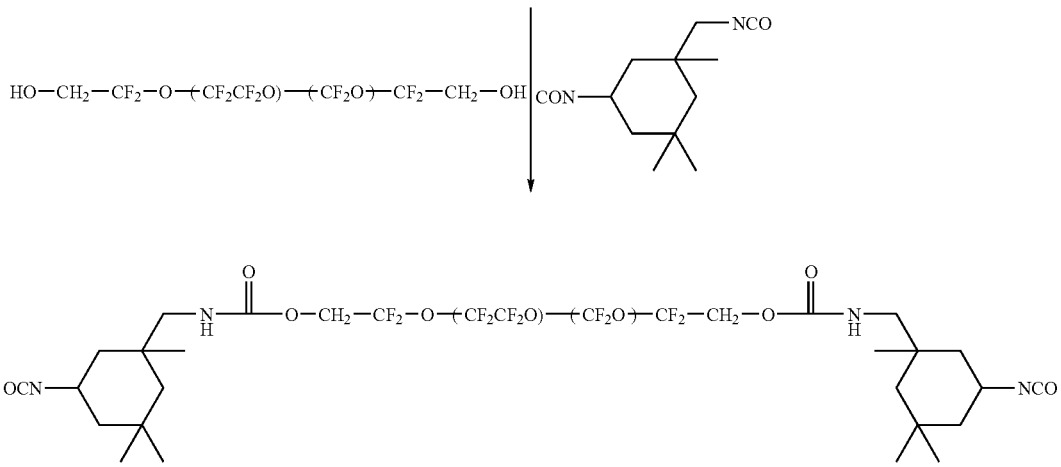

II.S.iv Chain Extended Diisocyanate

In some embodiments, the material is or includes, one component of a two component thermally curable system; chain extended by linking several PFPE chains together; may be cured by itself through a moisture cure; and includes the following structure:

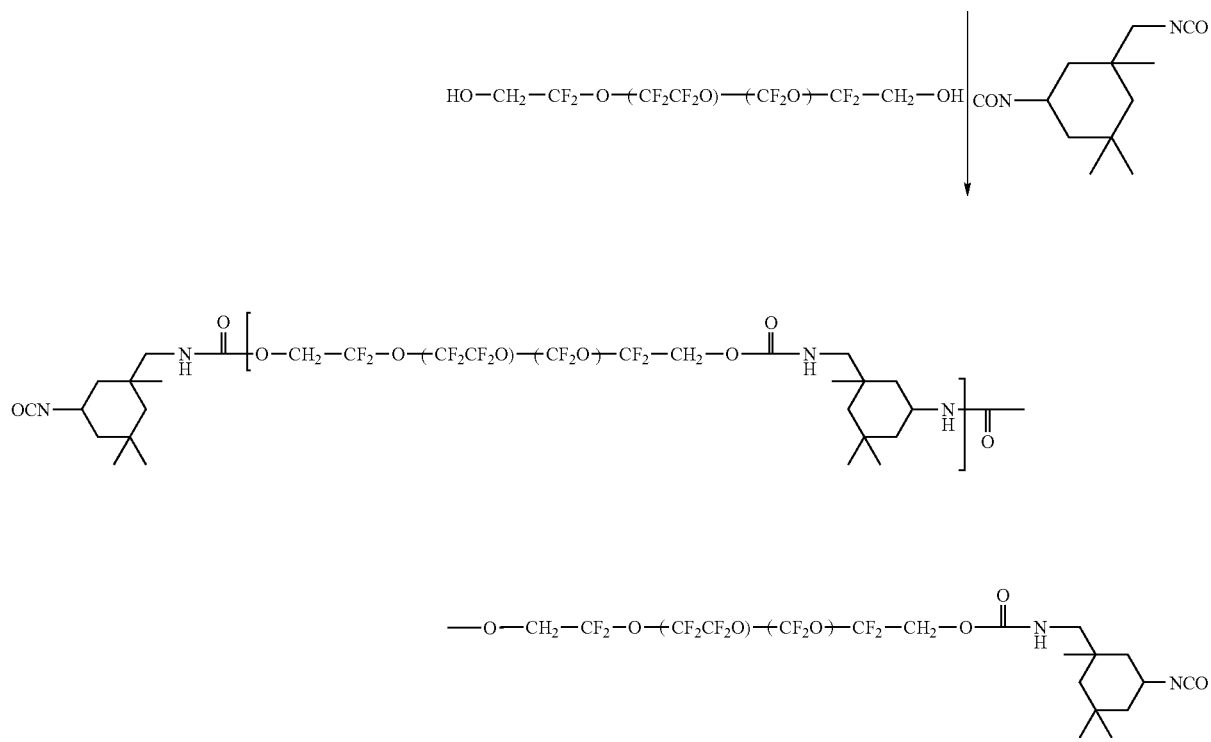

II.S.v Blocked Diisocyanate

In some embodiments, the material is or includes: one component of a two component thermally curable system; and includes the following structure:

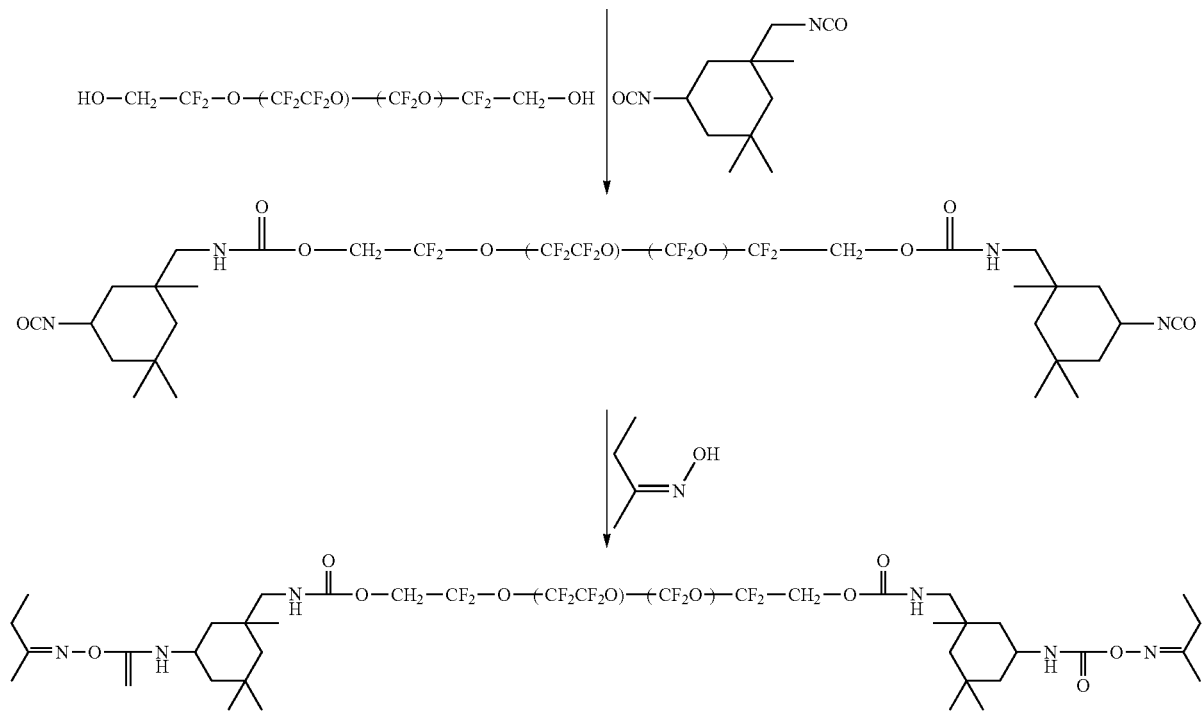

II.S.vi PFPE Three-Armed Triol

In some embodiments, the material is or includes a PFPE triol as one component of a two-component thermally curable urethane system; includes the benefits of being highly miscible with other PFPE compositions; and includes the following structure:

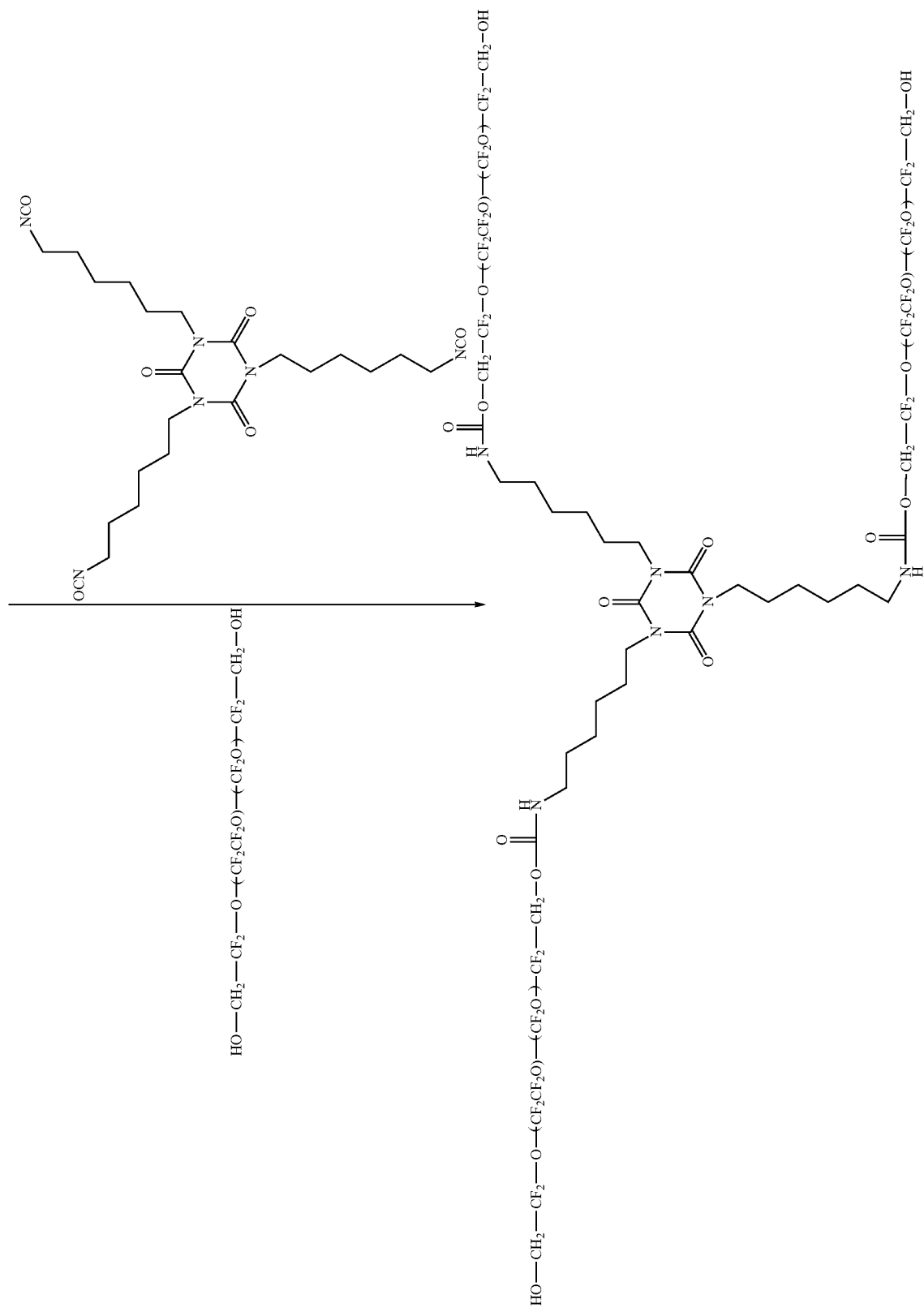

II.S.vii PFPE DiStyrene

In some embodiments, the material is or includes PFPE distyrene material that is UV curable, highly chemically stable, is useful in making laminate coatings with other compositions, and includes the following structure:

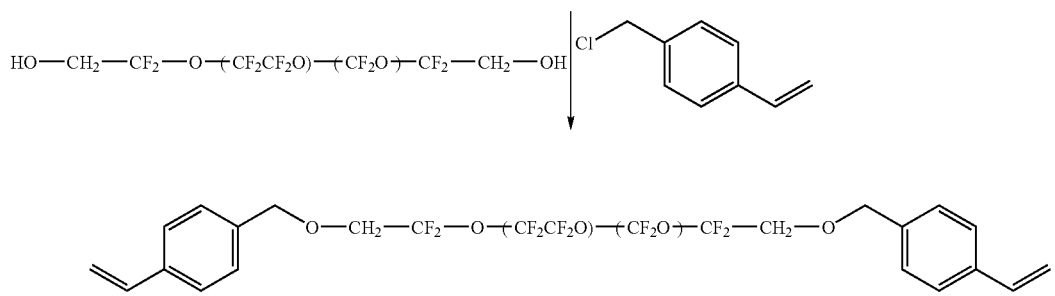

20

II.S.viii Diepoxy

In some embodiments, the material can be UV cured; can be thermally cured by itself using imidazoles; can also be thermally cured in a two-component diamine system; is highly Chemically stable; and includes the following structure:

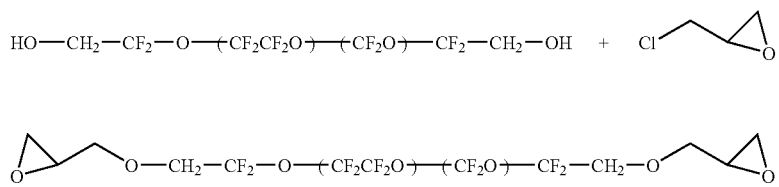

II.S.ix Diamine

In some embodiments, the material can be thermally cured in a two-component diamine system; has functionality of 6 (3 amines available on each end); is highly chemically stable; and includes the following structure:

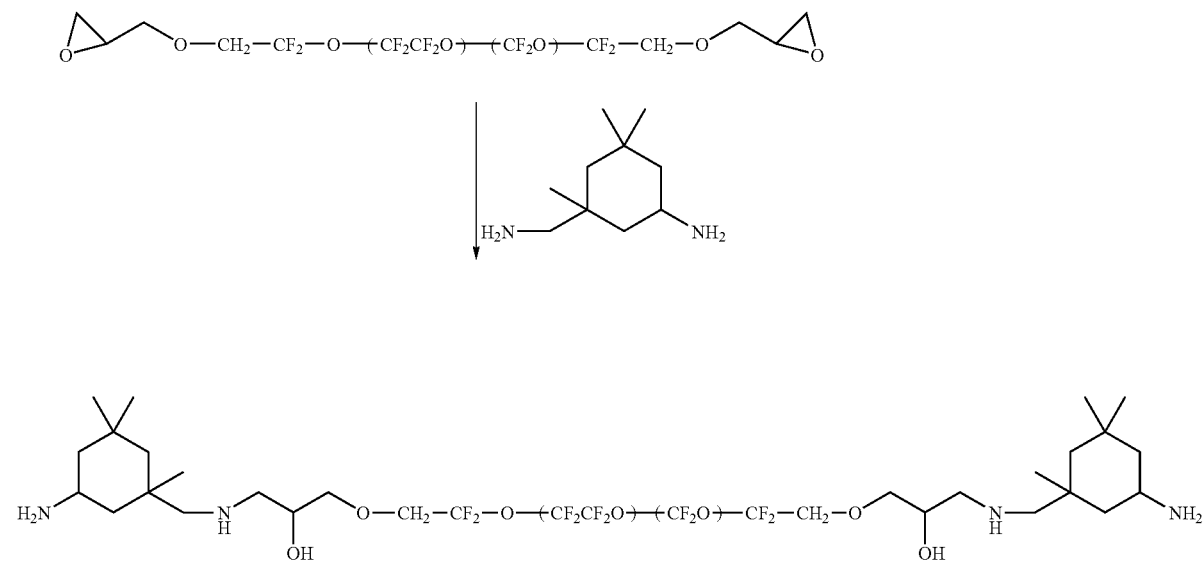

II.S.x Thermally Cured PU-Tetrol

In some embodiments, the material can be thermally cured in a two-component system, such as for example mixed in a 2:1 molar ratio at about 100-about 130 degrees C.; forms tough, mechanically stable network; the cured network is slightly cloudy due to immiscibility of tetrol; and includes the following structure:

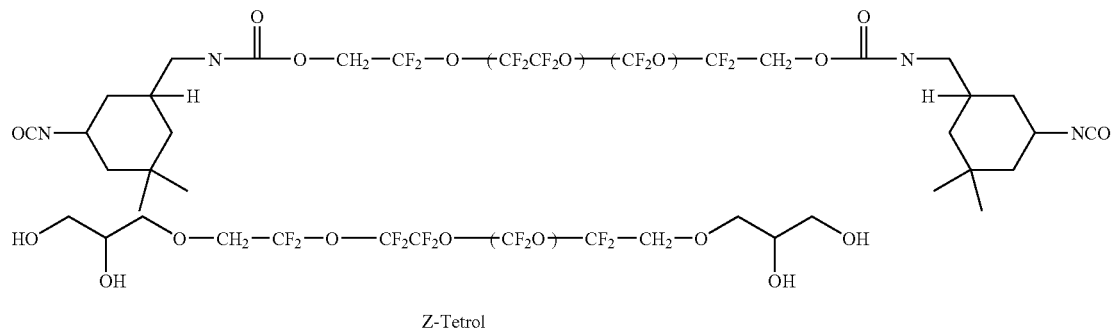

Z-Tetrol

II.S.xi Thermally Cured PU-Triol

In some embodiments, the material can be thermally cured in a two-component system, such as for example mixed in a 3:2 molar ratio, at about 100-about 130 degrees C.; forms tough, mechanically stable network; where the cured network is clear and colorless; and includes the following structure:

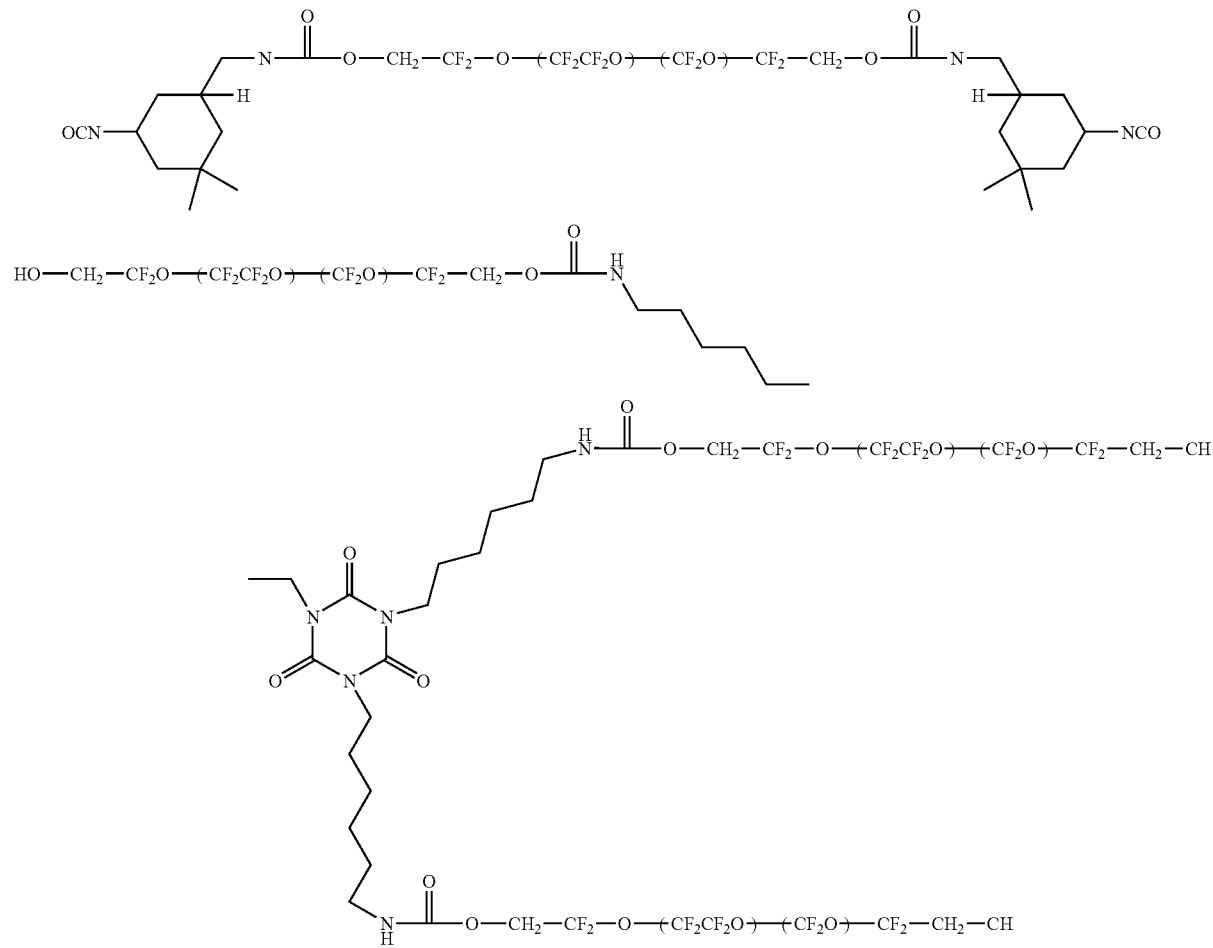

II.S.xii Thermally Cured Epoxy

In some embodiments, the material can be thermally cured in a two-component system, such as for example mixed in a 3:1 molar ratio, at about 100-about 130 degrees C.; forms mechanically stable network; where the cured network is clear and colorless; has high chemical stability; and includes the following structure:

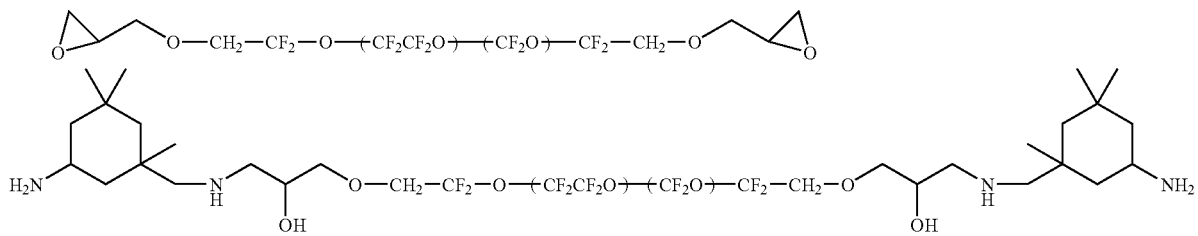

II.S.xiii UV-Cured Epoxy

In some embodiments, the material is a UV curable composition; includes ZDOL TX used to solubilize PAG; where the cured network is clear and yellow; has high chemical stability; and includes the following structure:

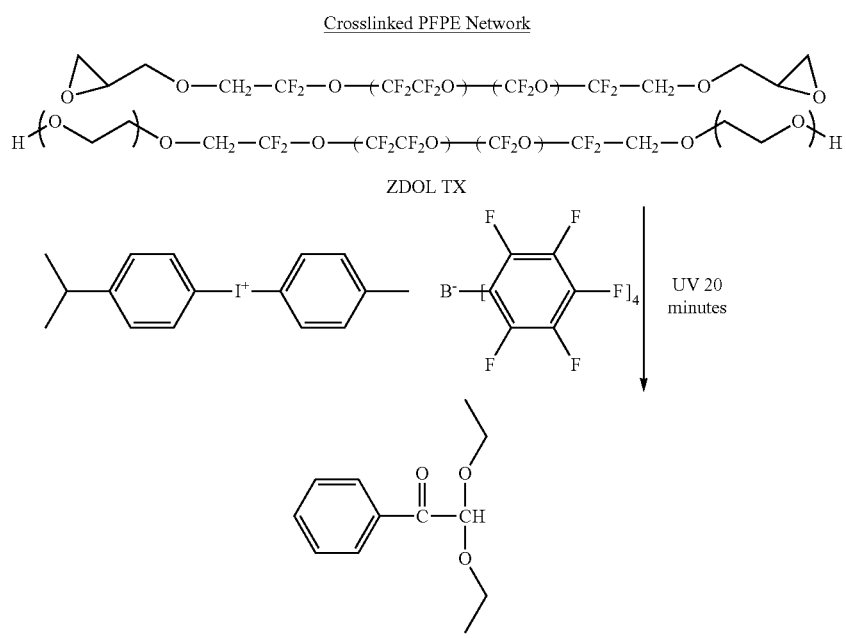

II.S.ixv UV-Thermal Dual Cure

In some embodiments, the material can be mixed in a 2:1 ratio (UV to thermal); forms cloudy network (tetrol); has a high viscosity; forms a very strong adhesion; has very good mechanical properties; and includes the following structure:

UV component

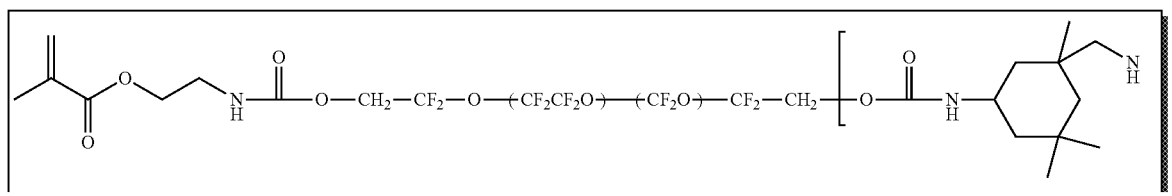

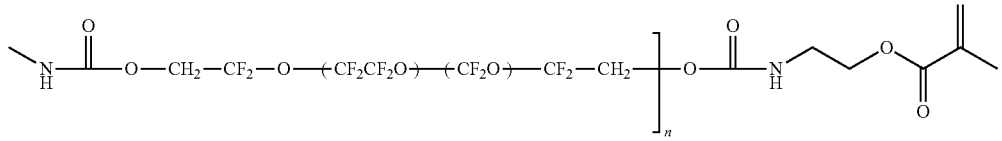
Thermal Component
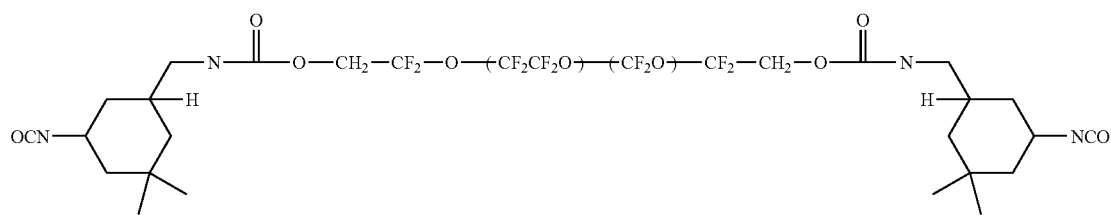
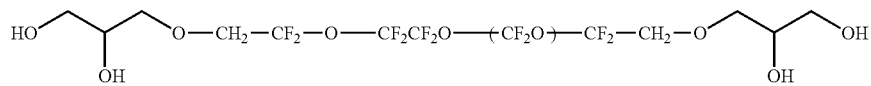
II.S.xv Orthogonal Cure with Triol
In some embodiments, the material can be mixed in a 2:1 ratio (UV to thermal); forms clear and colorless network; has a high viscosity; forms very strong adhesion; includes very good mechanical properties; and includes the following structure:
UV component
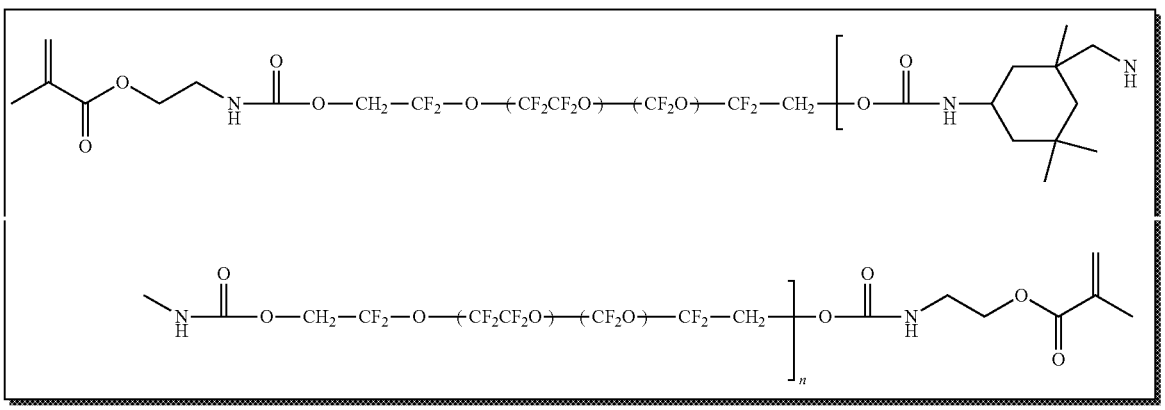

Thermal Component
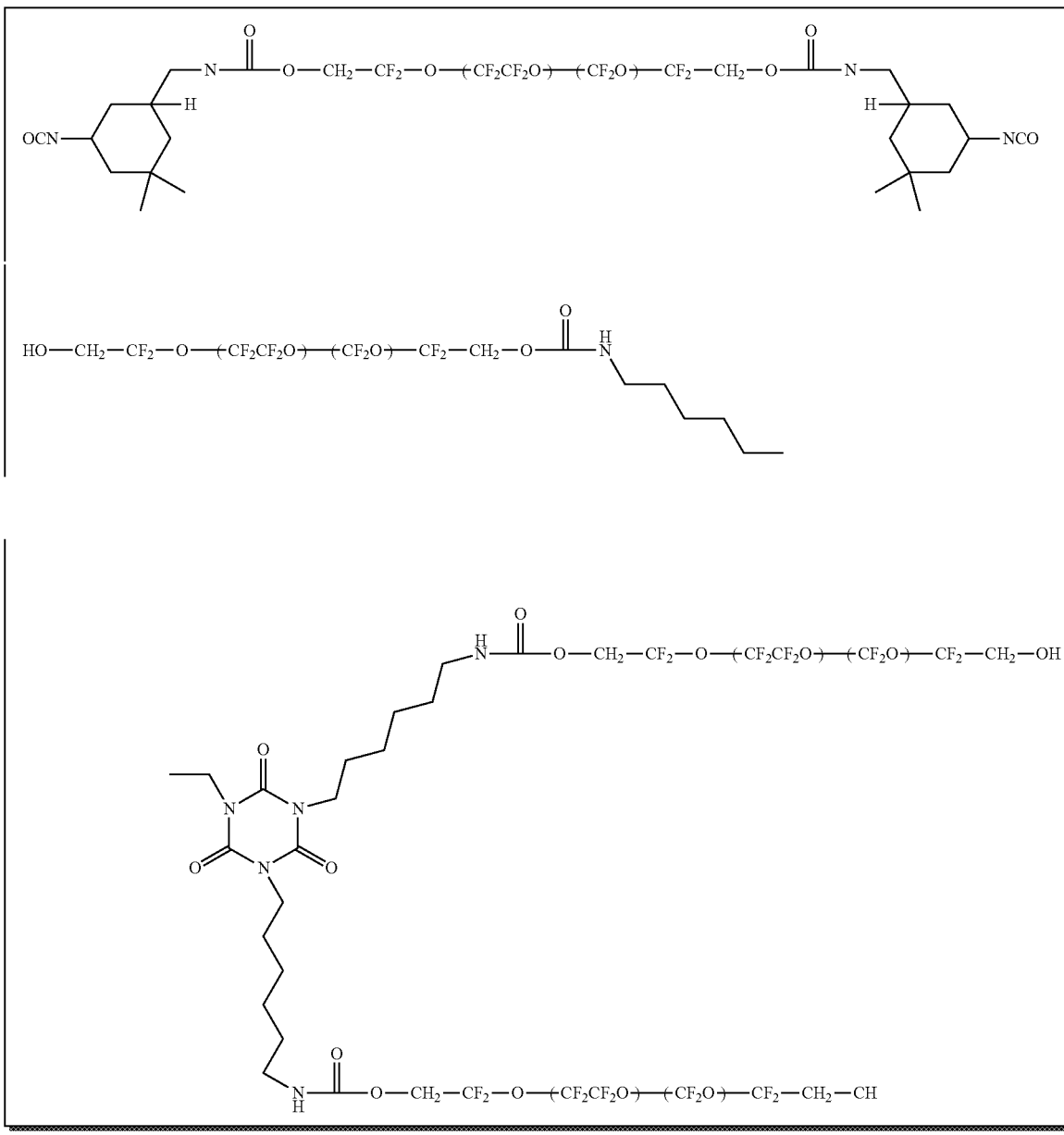
II.S.xvi UV Orthogonol System
In some embodiments, the material includes ZDOL-TX, which can be mixed in a 1:1 ratio (epoxy to methacrylate); forms clear and yellow network; has strong adhesion properties; has good mechanical properties; and includes the following structure:
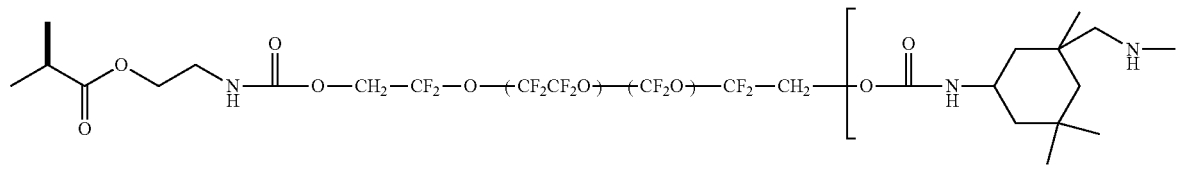

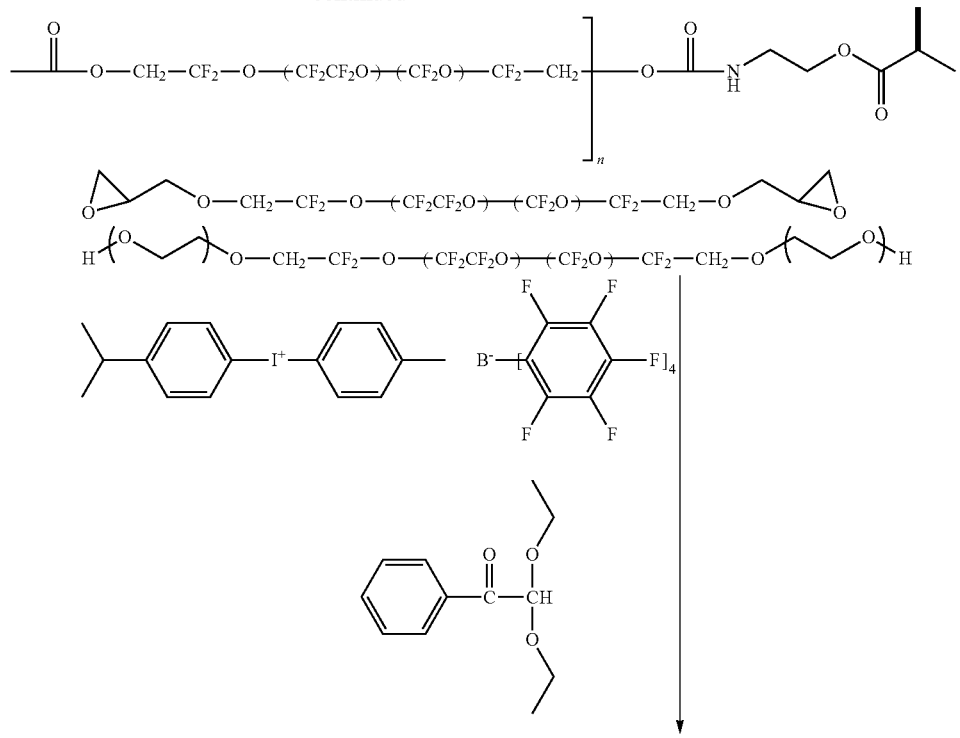
II.S.xvii UV with Epoxy Dual Cure
In some embodiments, the material forms slightly yellow network; includes a ratio (2:1 UV to thermal); has good mechanical properties; good adhesion; is highly chemical stability; and includes the following structure:
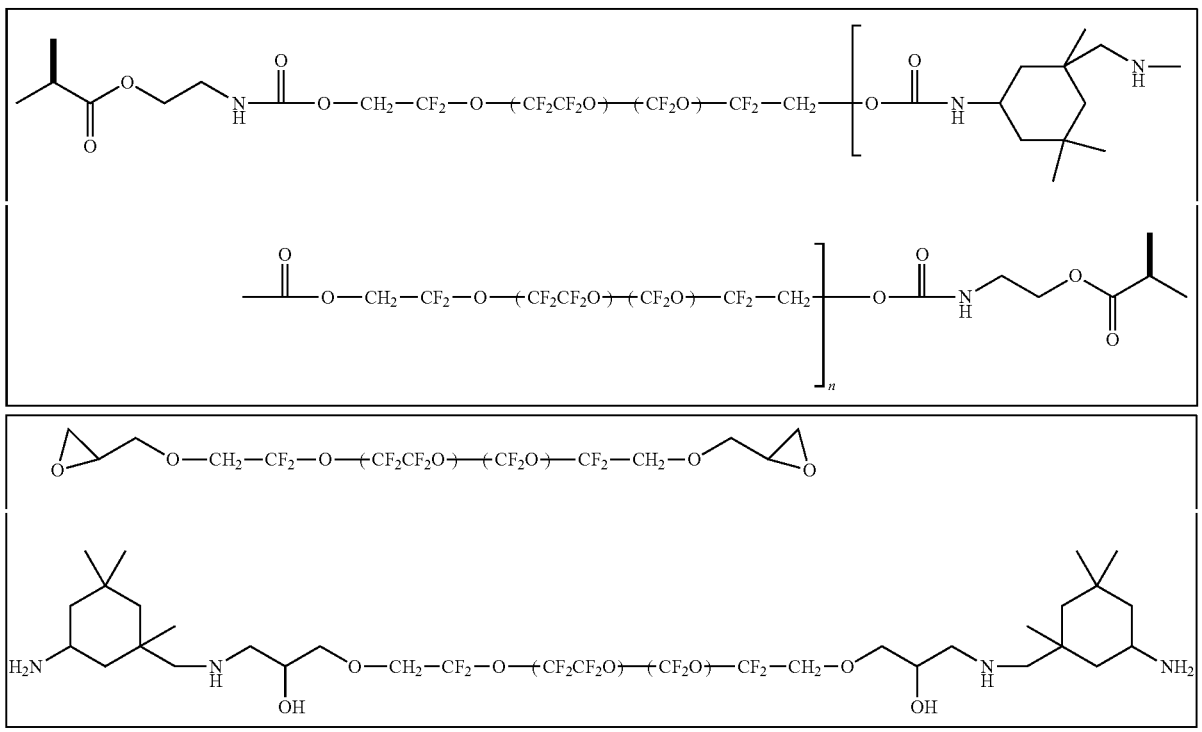

II.S.xviii Orthogonal with Diisocyanate

In some embodiments, the material is one component thermal component (Isocyanate reacts with urethane linkage on urethane dimethacrylate); has good mechanical properties; forms a strong adhesion; cures to clear, slightly yellow network; and includes the following structure:

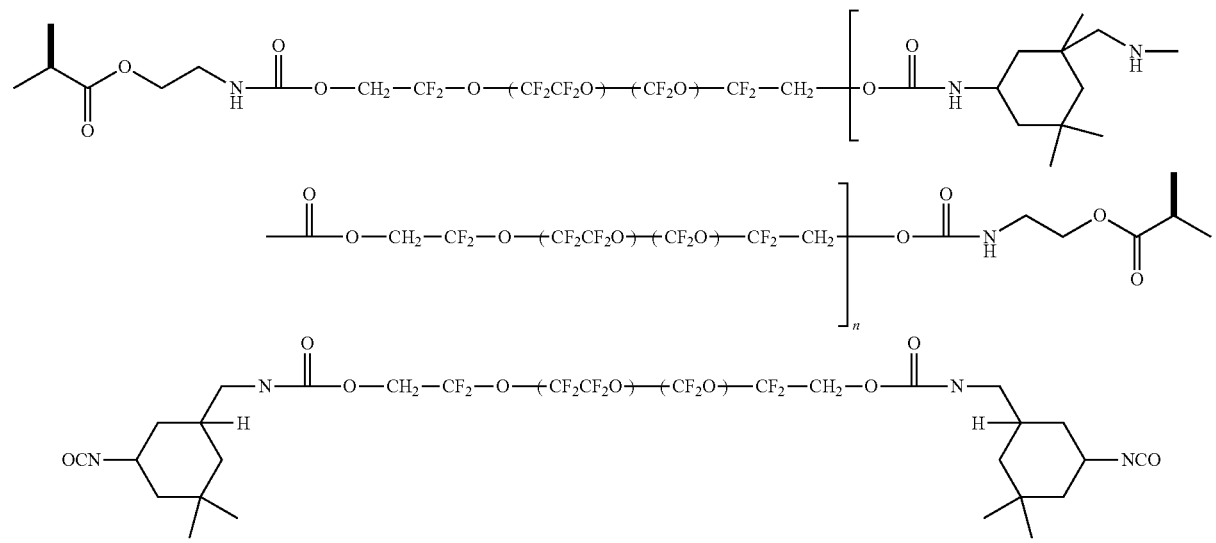

III. Patterned Laminate Molds Fabricated from the Disclosed Materials

The materials of the present invention can be utilized to form laminate layers of nano-sized predetermined shape molds and lamination adhesion promoter tie-layers for fabricating such molds. Referring now to FIG. 1, a general laminate mold 100 of the present invention includes a backing layer 102 affixed to a patterned mold layer 104 by a tie-layer 106. In certain embodiments, tie-layer 106 is used to bond mold layer 104 to backing layer 102. According to some embodiments, patterned mold layer 104 includes a patterned surface 108. Mold layer 104 can be made from the materials disclosed herein, and combinations thereof. Patterns on patterned surface 108 can include cavities 110 and land area L that extends between cavities 110. Patterns on patterned surface 108 can also include a pitch, such as pitch P, which is generally the distance from a first edge of one cavity to a first edge of an adjacent cavity including land area L between the adjacent cavities.

According to some embodiments, laminate mold 100 is fabricated from a two stage lamination process. Initially, a composition, (e.g. a material described herein such as a dual-cure composition) includes the structures shown below in Scheme 1 of Example 1.

Scheme 1 of Example 1: PFPE Dual Cure Composition

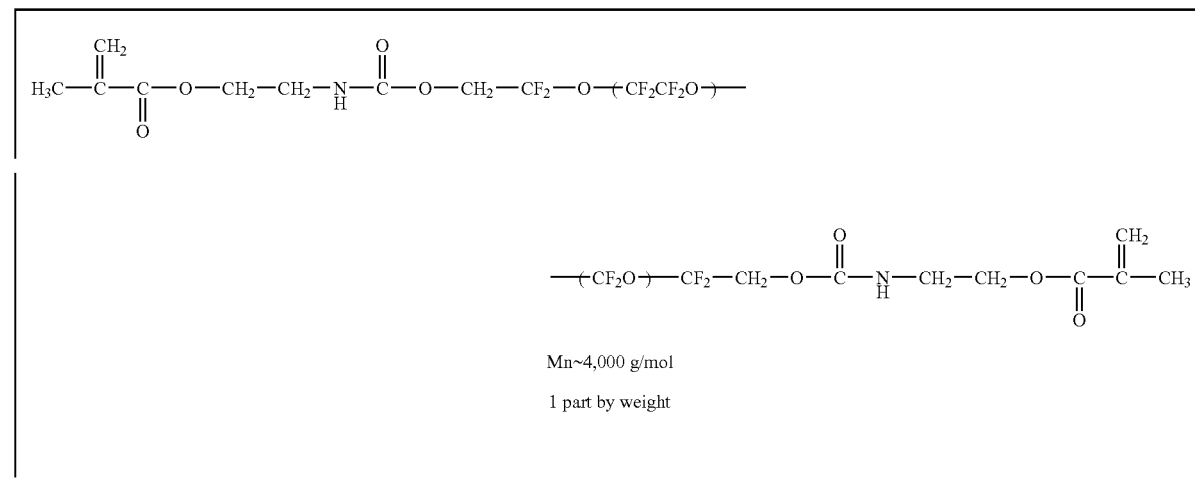

Mn~4,000 g/mol 1 part by weight

-continued

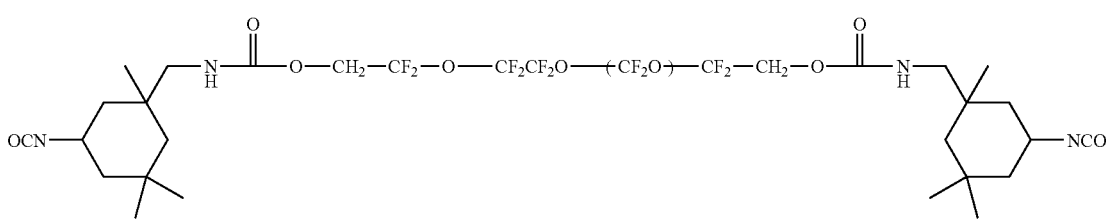

Mn~8,000 g/mol 0.8 part by weight

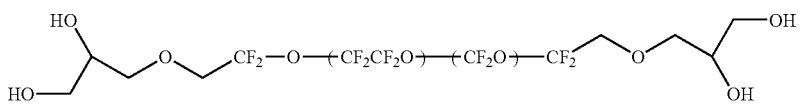

Mn~2,000 g/mol 0.1 part by weight micrometers and about 75 micrometers. In other embodiments, the tie-layer 210 is distributed into a layer of between about 10 micrometers and about 50 micrometers. In some embodiments, the tie-layer 210 is distributed into a layer of between about 15 micrometers and about 40 micrometers. In some embodiments, the tie-layer 210 is distributed into a layer of between about 20 micrometers and about 30 micrometers. In some embodiments, the tie-layer 210 is distributed into a layer of between about 10 micrometers and about 35 micrometers. In some embodiments, the tie-layer 210 is distributed into a layer of between about 10 micrometers and about 25 micrometers. According to some embodiments, the two roll laminator is actuated at a speed of about 5 ft/minute. According to another embodiment, the two roll laminator is actuated at a speed of less than about 5 ft/minute. According to other embodiments, the two roll laminator is actuated at a speed of between about 1 ft/minute and about 10 ft/minute. According to still another embodiment, the two roll laminator is actuated at a speed of about 1 ft/minute.

After roll laminating polymer sheets 206 and 208 with tie-layer 210 distributed therebetween, laminate 214 is cured (e.g., UV cured) to cure or partially cure tie-layer 210. In some embodiments, laminate 214 is cured (e.g., UV cured) in a conveyer system (e.g., UV conveyer system) in which the conveyor is moved at about 8 ft/minute and the UV power output is about 200 Watts/inch. According to such embodiments, laminate 214 is positioned approximately 3 inches from the UV source for UV curing. In some embodiments, following curing, the cured laminate 214 is secondarily cured (e.g., placed in a thermal oven) for curing of tie-layer 210. In some embodiments, thermal oven is set at, and preheated to, 100° C. and laminate 214 is subjected to the thermal condition of the thermal oven for about 10 minutes. After laminate 214 has been secondarily cured (e.g., thermal cured) polymer sheets 206 and 208 are separated. In some embodiments, polymer sheets 206 and 208 are separated by hand by peeling sheets 206 and 208 apart at a rate of about 1 inch per second. In preferred embodiments, tie-layer 210 remains substantially entirely on one of the polymer sheets, 206 or 208.

In some embodiments, separately, a UV curable PFPE resin, having a formula shown as Scheme 2 of Example 1, is mixed with 2.0% by weight diethoxyacetophenone. In some embodiments, the UV curable PFPE resin and the 2.0% by weight diethoxyacetophenone is mixed by hand for more than about 2 minutes at room temperature in a glass vial.

Scheme 2 of Example 1 - UV curable PFPE composition

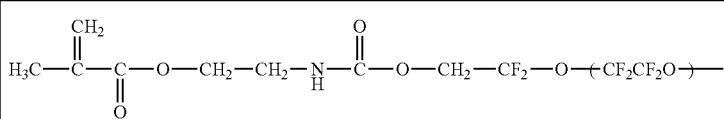

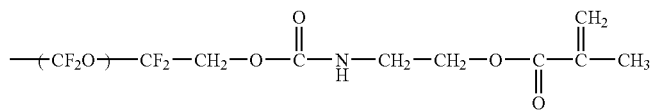

Figure 3:
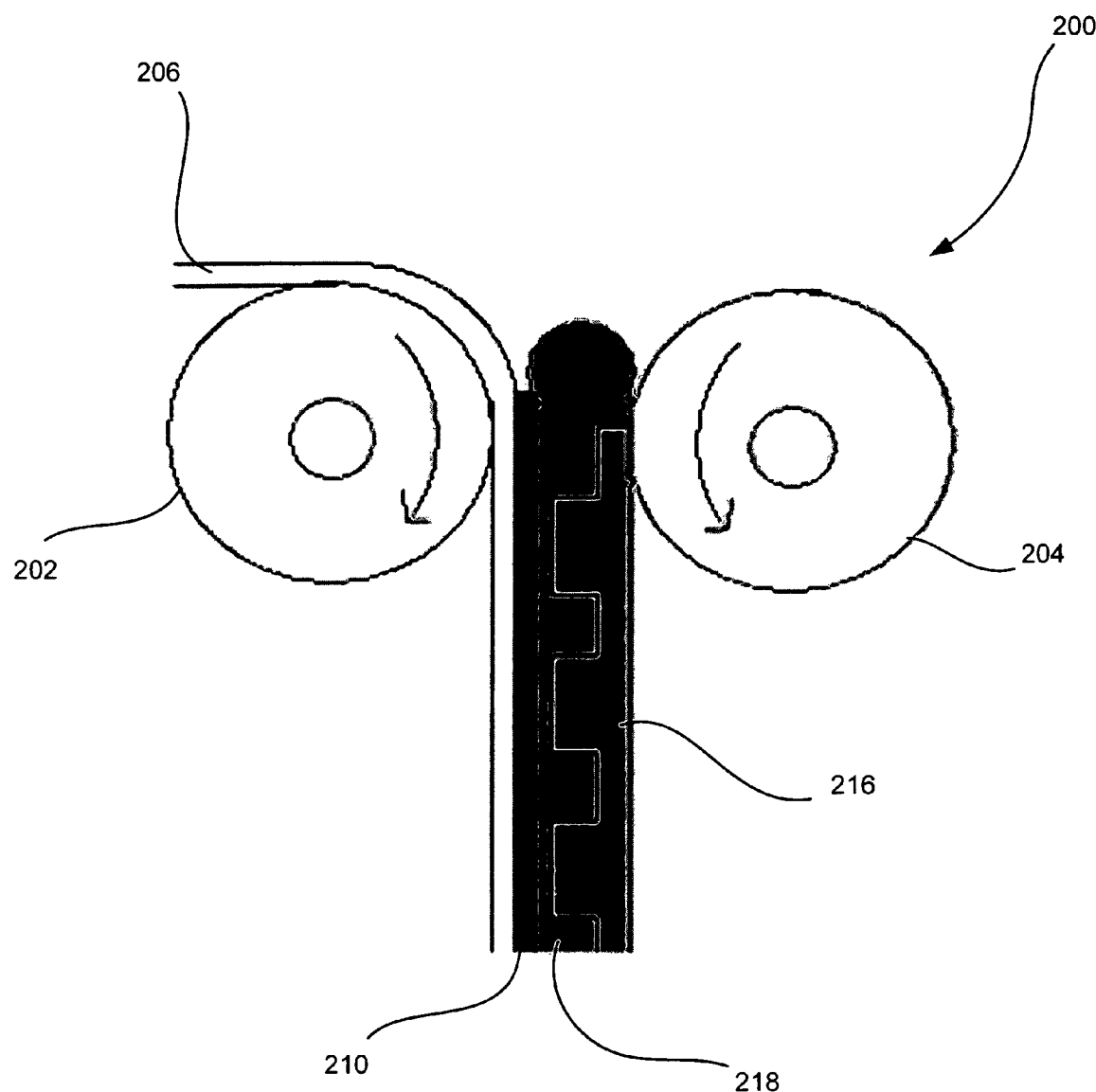
FIG. 3 is a schematic of a roll apparatus for fabricating a laminate mold according to another embodiment of the present invention.

Next, polymer sheet 206 with tie-layer 210 affixed thereto is positioned with respect to a patterned master 216, as shown in FIG. 3. In some embodiments, patterned master is a silicon wafer master patterned with an array of nano-sized structures having predetermined shapes. In other embodiments, patterned master 216 includes viruses, nanotubes, or dendrimers on surfaces. In other embodiments, patterned master 216 can include anodized alumina templates. In some embodiments, the nano-sized structures are 200 nm×200 nm×400 nm cylindrical posts. In other embodiments, the nano-sized structures are 2 micron×2 micron×0.7 micron cuboidal structures protruding from the silicon master.

In other embodiments, the nano-sized structures are 1 micron×1 micron×0.7 micron cuboidal structures protruding from the silicon master. In other embodiments, the nano-sized structures are 1 micron diameter×0.7 micron height cylindrical post structures protruding from the silicon master. In other embodiments, the nano-sized structures are 0.9 micron×0.9 micron×0.9 micron cuboidal structures protruding from the silicon master. In other embodiments, the nano-sized structures are 0.9 micron×0.9 micron×0.7 micron cuboidal structures protruding from the silicon master. In other embodiments, the nano-sized structures are 0.9 micron diameter×0.9 micron height cylindrical structures protruding from the silicon master. In other embodiments, the nano-sized structures are 0.8 micron×0.8 micron×0.8 micron cuboidal structures protruding from the silicon master. In other embodiments, the nano-sized structures are 0.8 micron×0.8 micron×0.6 micron cuboidal structures protruding from the silicon master. In other embodiments, the nano-sized structures are 0.8 micron diameter×0.8 micron height cylindrical structures protruding from the silicon master. In other embodiments, the nano-sized structures are 0.7 micron×0.7 micron×0.7 micron cuboidal structures protruding from the silicon master. In other embodiments, the nano-sized structures are 0.7 micron×0.7 micron×0.5 micron cuboidal structures protruding from the silicon master. In other embodiments, the nano-sized structures are 0.7 micron diameter×0.7 micron height cylindrical structures protruding from the silicon master. In other embodiments, the nano-sized structures are 0.6 micron×0.6 micron×0.6 micron cuboidal structures protruding from the silicon master. In other embodiments, the nano-sized structures are 0.6 micron×0.6 micron×0.3 micron cuboidal structures protruding from the silicon master. In other embodiments, the nano-sized structures are 0.6 micron diameter×0.6 micron height cylindrical structures protruding from the silicon master. In other embodiments, the nano-sized structures are 0.5 micron×0.5 micron×0.5 micron cuboidal structures protruding from the silicon master. In other embodiments, the nano-sized structures are 0.5 micron×0.5 micron×0.2 micron cuboidal structures protruding from the silicon master. In other embodiments, the nano-sized structures are 0.5 micron diameter×0.8 micron height cylindrical structures protruding from the silicon master. In other embodiments, the nano-sized structures are 0.4 micron×0.4 micron×0.4 micron cuboidal structures protruding from the silicon master. In other embodiments, the nano-sized structures are 0.4 micron×0.4 micron×0.7 micron cuboidal structures protruding from the silicon master. In other embodiments, the nano-sized structures are 0.4 micron diameter×0.4 micron height cylindrical structures protruding from the silicon master. In other embodiments, the nano-sized structures are 0.3 micron×0.3 micron×0.3 micron cuboidal structures protruding from the silicon master. In other embodiments, the nano-sized structures are 0.3 micron×0.3 micron×0.1 micron cuboidal structures protruding from the silicon master. In other embodiments, the nano-sized structures are 0.3 micron diameter×0.2 micron height cylindrical structures protruding from the silicon master. In other embodiments, the nano-sized structures are 0.2 micron×0.2 micron×0.2 micron cuboidal structures protruding from the silicon master. In other embodiments, the nano-sized structures are 0.2 micron×0.2 micron×0.05 micron cuboidal structures protruding from the silicon master. In other embodiments, the nano-sized structures are 0.2 micron diameter×0.2 micron height cylindrical structures protruding from the silicon master. In other embodiments, the nano-sized structures are 0.1 micron×0.1 micron×0.1 micron cuboidal structures protruding from the silicon master. In other embodiments, the nano-sized structures are 0.1 micron×0.1 micron×0.05 micron cuboidal structures protruding from the silicon master. In other embodiments, the nano-sized structures are 0.1 micron diameter×0.1 micron height cylindrical structures protruding from the silicon master.

According to still other embodiments, the nano-sized structures can be less than about 10 nm is a broadest dimension. In other embodiments, the nano-sized structures can be between about 5 nm and about 25 nm. In other embodiments, the nano-sized structures can be between about 5 nm and about 50 nm. In other embodiments, the nano-sized structures can be between about 5 nm and about 75 nm. In other embodiments, the nano-sized structures can be between about 5 nm and about 100 nm. In other embodiments, the nano-sized structures can be between about 5 nm and about 150 nm. In other embodiments, the nano-sized structures can be between about 5 nm and about 200 nm. In other embodiments, the nano-sized structures can be between about 5 nm and about 250 nm. In other embodiments, the nano-sized structures can be between about 5 nm and about 350 nm. In other embodiments, the nano-sized structures can be between about 5 nm and about 500 nm. In other embodiments, the nano-sized structures can be between about 5 nm and about 750 nm. In other embodiments, the nano-sized structures can be between about 5 nm and about 1 micrometer. In other embodiments, the nano-sized structures can be between about 5 nm and about 2 micrometers. In other embodiments, the nano-sized structures can be between about 5 nm and about 5 micrometers.

Next, polymer sheet 206, having tie-layer 210 positioned adjacent a patterned side of patterned master 216 and the combination is introduced into nips of a two roll laminator, such as two roll laminator 200 described above. After polymer sheet 206 and patterned master 216 are affixed in rollers 202 and 204, UV curable material 218, such as that disclosed herein, is introduced between an interface of patterned master 216 and tie-layer 210 of polymer sheet 206. Two roll laminator 200 is then activated to thereby laminate polymer sheet 206, tie-layer 210, UV curable material 218, and patterned master 216 together. After the combination of layers has passed through two roll laminator 200, the combination laminate is cured (e.g. UV cured) to cure curable material 218 into a solidified layer attached to tie-layer 210. According to some embodiments, after patterned master 216 is separated from laminate layers 206, 210, and 218, the resulting laminate includes a thin layer of curable material 218 adhered to tie-layer 210 which is adhered to polymer sheet 206. Furthermore, curable layer 218 includes an inverse replica of features of patterned master 216, such as cavities 110. In some embodiments, curable layer 218 is between about 5 microns and about 50 microns thick. In some embodiments, curable layer 218 is between about 5 microns and about 30 microns thick. In some embodiments, curable layer 218 is between about 10 microns and about 25 microns thick. In some embodiments, curable layer 218 is less than about 75 microns thick. In some embodiments, curable layer 218 is less than about 70 microns thick. In some embodiments, curable layer 218 is less than about 65 microns thick. In some embodiments, curable layer 218 is less than about 60 microns thick. In some embodiments, curable layer 218 is less than about 55 microns thick. In some embodiments, curable layer 218 is less than about 50 microns thick. In some embodiments, curable layer 218 is less than about 45 microns thick. In some embodiments, curable layer 218 is less than about 40 microns thick. In some embodiments, curable layer 218 is less than about 35 microns thick. In some embodiments, curable layer 218 is less than about 30 microns thick. In some embodiments, curable layer 218 is less than about 25 microns thick. In some embodiments, curable layer 218 is less than about 20 microns thick. In some embodiments, curable layer 218 is less than about 15 microns thick. In some embodiments, curable layer 218 is less than about 10 microns thick. In some embodiments, curable layer 218 is less than about 7 microns thick.

Figure 4:
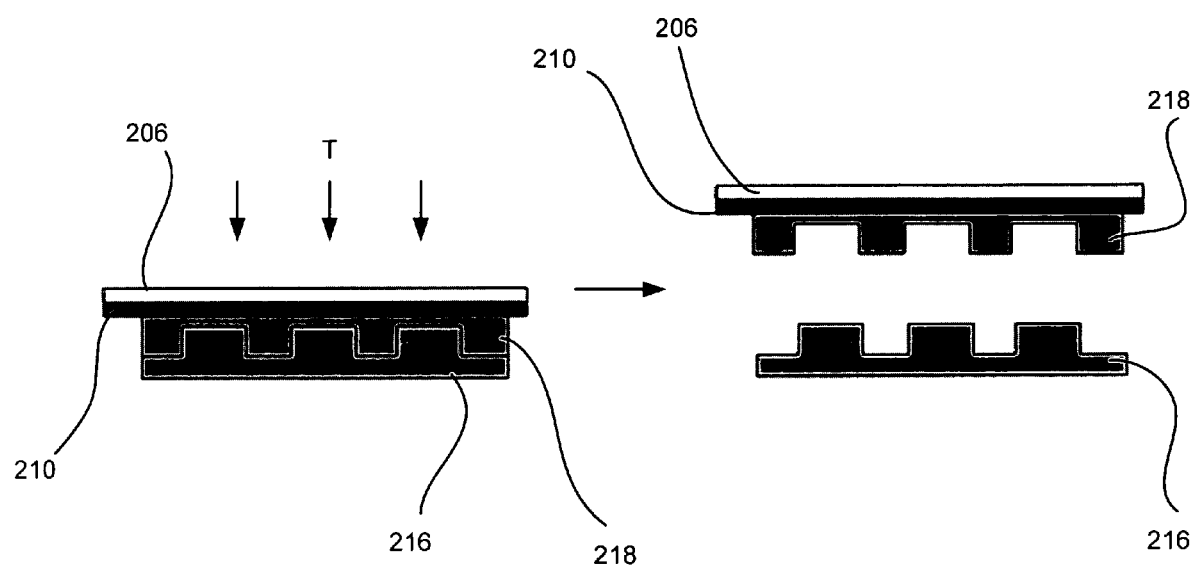
FIG. 4 is a schematic of separation of a laminate mold from a master template according to an embodiment of the present invention.

In still other embodiments, laminate mold 100 is configured with a backing 102 and a single laminate layer 104 adhered directly to backing 102. According to certain embodiments, laminate layer 104 is dual-cure materials disclosed herein, UV-curable materials, thermal curable materials, disclosed herein. Such laminte molds are fabricated, according to FIG. 3, however, without using tie-layer 210 on backing layer 206. Accordingly, backing layer 206 and patterned master 216 are configured in alignment with each other and with rollers 202 and 204, as described herein. Next, either dual-cure materials described herein, UV-curable materials disclosed herein, or thermal curable materials are deposited between backing layer 206 and patterned master 216 on an input side of rollers 202 and 204. Then, when the rollers are activated the dual-cure or UV-curable material is dispersed between backing 206 and patterned master 216 and conform to a pattern of patterned master 216. Next, the laminate of backing 206, un-cured dual-cure or UV-curable material, and patterned master 216 are subjected to a UV-curing treatment T, as shown in FIG. 4. Following UV-curing, if a UV-curable material was used, the patterned master 216 and backing 206 are separated, as shown in the right side of FIG. 4. However, if a dual-cure material was utilized, the UV-cured laminate is subjected to a thermal curing to active the thermal component of the dual-cure. Following thermal curing, the backing 206 and patterned master 216 is separated such that the dual-cure layer mimics the pattern of patterned master 216 and is adhered to backing 206, as shown in FIG. 4.

Figure 5:
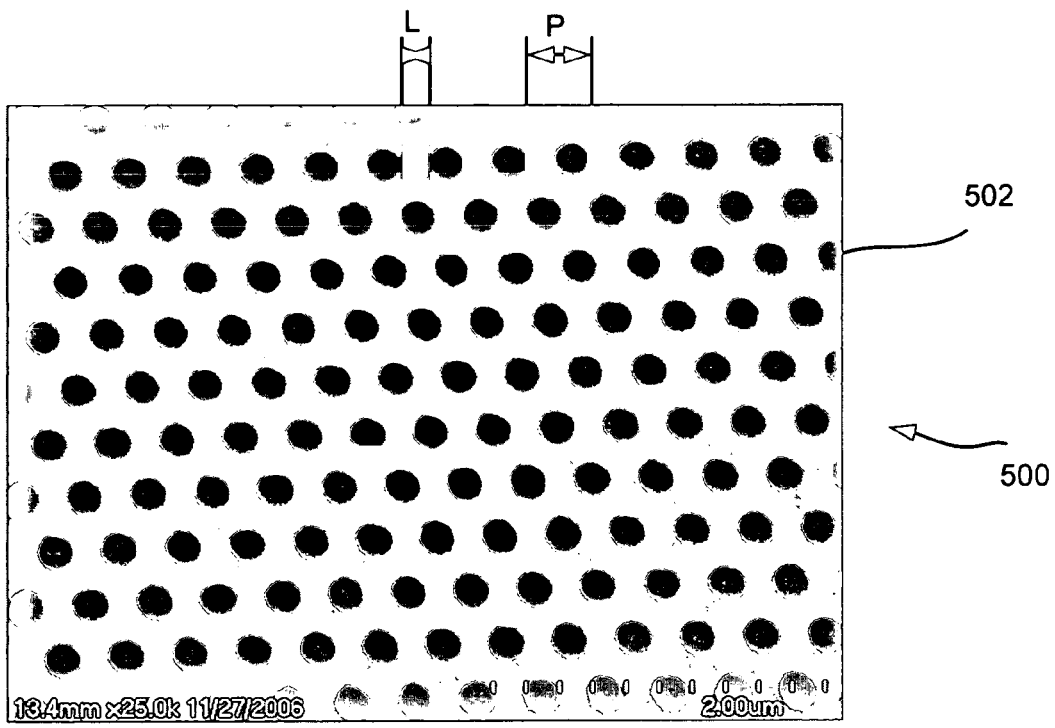
FIG. 5 is an SEM image of a top surface of a laminate mold having 200 nm cavities arranged in a hexagonal array according to an embodiment of the present invention.
Figure 6:
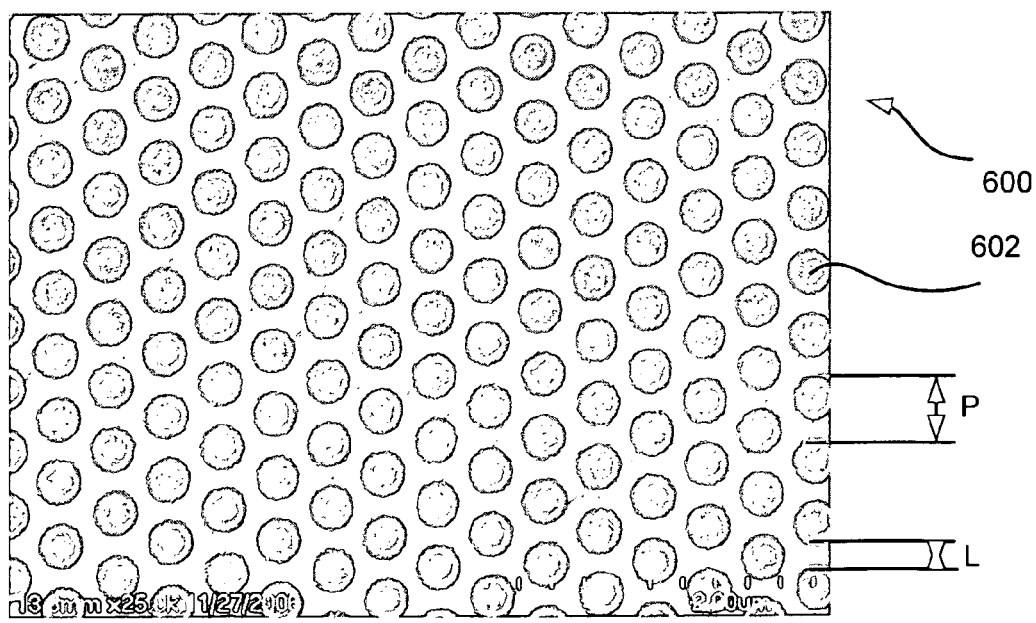
FIG. 6 is an SEM image of a polymer replica fabricated from the laminate mold of FIG. 5 showing hexagonally arranged 200 nm posts formed from the 200 nm cavities of the laminate mold.

Referring now to FIG. 5, a laminate mold 500 mimicking patterned structures of a patterned master 216 are shown. According to FIG. 5, the structures mimicked are 200 nm diameter cylindrical cavities or cavities, the land area L is roughly 200 nm, and the pitch P is roughly 400 nm. FIG. 6 shows a molded material 600 molded from the laminate mold 500 of FIG. 5, wherein structures 602 are 200 nm diameter cylindrical posts, land area L is roughly 200 nm, and pitch P is roughly 400 nm.

In some embodiments, cavities 110 can include any structure that is etched onto silicone wafer. In some embodiments, cavities 110 can include an array of structures which are a repetitious pattern, a random pattern, and combinations thereof of the same structure or a variety of structure sizes and shapes. According to some embodiments, cavities 110 have a cross-sectional diameter of less than about 5 micrometers. According to some embodiments, cavities 110 have a cross-sectional diameter of less than about 2 micrometers. According to some embodiments, cavities 110 have a cross-sectional diameter of less than about 1 micrometer. According to some embodiments, cavities 110 have a cross-sectional diameter of less than about 500 nm. According to some embodiments, cavities 110 have a cross-sectional diameter of less than about 250 nm. According to some embodiments, cavities 110 have a cross-sectional diameter of less than about 200 nm. According to some embodiments, cavities 110 have a cross-sectional diameter of less than about 150 nm. According to some embodiments, cavities 110 have a cross-sectional diameter of less than about 100 nm. According to some embodiments, cavities 110 have a cross-sectional diameter of less than about 75 nm. According to some embodiments, cavities 110 have a cross-sectional diameter of less than about 50 nm. According to some embodiments, cavities 110 have a cross-sectional diameter of less than about 40 nm. According to some embodiments, cavities 110 have a cross-sectional diameter of less than about 30 nm. According to some embodiments, cavities 110 have a cross-sectional diameter of less than about 20 nm. According to some embodiments, cavities 110 have a cross-sectional diameter of less than about 15 nm. According to some embodiments, cavities 110 have a cross-sectional diameter of less than about 10 nm.

According to some embodiments, cavities 110 have a depth of less than about 500 nm. According to other embodiments, cavities 110 have a depth of less than about 300 nm. According to some embodiments, cavities 110 have a depth of less than about 250 nm. According to some embodiments, cavities 110 have a depth of less than about 150 nm. According to some embodiments, cavities 110 have a depth of less than about 100 nm. According to some embodiments, cavities 110 have a depth of less than about 75 nm. According to some embodiments, cavities 110 have a depth of less than about 50 nm. According to some embodiments, cavities 110 have a depth of less than about 30 nm. According to some embodiments, cavities 110 have a depth of less than about 20 nm. According to some embodiments, cavities 110 have a depth of less than about 15 nm. According to some embodiments, cavities 110 have a depth of less than about 10 nm.

According to other embodiments, cavities 110 have a width to depth ratio of between about 1,000:1 and about 100,000:1. According to other embodiments, cavities 110 have a width to depth ratio of between about 1,000:1 and about 10,000:1. According to other embodiments, cavities 110 have a width to depth ratio between of about 100:1 and about 1, 000:1. According to other embodiments, cavities 110 have a width to depth ratio of about 1, 000:1. According to other embodiments, cavities 110 have a width to depth ratio of about 800:1. According to other embodiments, cavities 110 have a width to depth ratio of about 600:1. According to other embodiments, cavities 110 have a width to depth ratio of about 500:1. According to other embodiments, cavities 110 have a width to depth ratio of about 400:1. According to other embodiments, cavities 110 have a width to depth ratio of about 300:1. According to other embodiments, cavities 110 have a width to depth ratio of about 200:1. According to other embodiments, cavities 110 have a width to depth ratio of about 100:1. According to other embodiments, cavities 110 have a width to depth ratio of about 80:1. According to other embodiments, cavities 110 have a width to depth ratio of about 70:1. According to other embodiments, cavities 110 have a width to depth ratio of about 50:1. According to other embodiments, cavities 110 have a width to depth ratio of about 40:1. According to other embodiments, cavities 110 have a width to depth ratio of about 30:1. According to other embodiments, cavities 110 have a width to depth ratio of about 20:1. According to other embodiments, cavities 110 have a width to depth ratio of about 10:1. According to other embodiments, cavities 110 have a width to depth ratio of about 5:1. According to other embodiments, cavities 110 have a width to depth ratio of about 2:1.

According to some embodiments, a shape of cavities 110 are selected from the group of cylindrical, cuboidal, star, arrow, semi-spherical, conical, cresent, viral, cellular, concave disk, and any other shape that can be etched into a patterned master such as a silicon wafer.

In some embodiments, polymer sheet 206 is a PET sheet having a thickness of less than about 10 mil. In some embodiments, a PET sheet having a tie-layer 210 and a UV curable PFPE layer 218 can have a modulus of about 1400 MPa. According to some embodiments, the land area of the laminate mold is between about 5% and about 99% of the entire surface area. According to some embodiments, the land area of the laminate mold is between about 5% and about 90% of the entire surface area. According to some embodiments, the land area of the laminate mold is between about 5% and about 80% of the entire surface area. According to some embodiments, the land area of the laminate mold is between about 5% and about 75% of the entire surface area. According to some embodiments, the land area of the laminate mold is between about 5% and about 60% of the entire surface area. According to some embodiments, the land area of the laminate mold is between about 5% and about 50% of the entire surface area. According to some embodiments, the land area of the laminate mold is between about 5% and about 40% of the entire surface area. According to some embodiments, the land area of the laminate mold is between about 5% and about 30% of the entire surface area. According to some embodiments, the land area of the laminate mold is between about 5% and about 25% of the entire surface area. According to some embodiments, the land area of the laminate mold is between about 5% and about 20% of the entire surface area. According to some embodiments, the land area of the laminate mold is between about 5% and about 15% of the entire surface area. According to some embodiments, the land area of the laminate mold is between about 5% and about 10% of the entire surface area.

According to some embodiments, the dual-cure material and the UV-curable material of the laminate molds of the present invention can include the materials described herein. In some embodiments, the PFPE formulations described herein are used themselves as the molded layer of the laminate. In further embodiments molded PFPE layers are adhered to backing substrates using tie-layers formulated with PFPEs containing various functional end groups. In further embodiments the tie-layer includes a dual-cure mixture of PFPE materials such that one component is capable of being cured by actinic radiation and another is capable of being cured thermally. In other embodiments, the molded PFPE layer itself may include a dual-cure PFPE formulation.

In some embodiments an additional tie-layer structure is not needed between the substrate and the PFPE mold. In further embodiments the PFPE formulation used to fabricate the mold is formulated such that it will adhere to a particular backing material upon curing. In further embodiments, the backing material is chemically functionalized to adhere to a particular PFPE mold formulation.

It should be appreciated, however, that the present invention can be embodied in different forms and should not be construed as limited to the embodiments set forth herein. Unless otherwise defined, all technical and scientific terms used herein have the same meaning as commonly understood by one of ordinary skill in the art to which this presently described subject matter belongs. All publications, patent applications, patents, and other references mentioned herein are incorporated herein by reference in their entirety. Throughout the specification and claims, a given chemical formula or name shall encompass all optical and stereoisomers, as well as racemic mixtures where such isomers and mixtures exist.

IV. Examples

The following Examples have been included to provide guidance to one of ordinary skill in the art for practicing representative embodiments of the presently disclosed subject matter. In light of the present disclosure and the general level of skill in the art, those of skill can appreciate that the following Examples are intended to be exemplary only and that numerous changes, modifications, and alterations can be employed without departing from the scope of the presently disclosed subject matter.

Example 1

Step 1: To form an adhesion promoter for PFPE molds to PET, a dual-cure composition of the PFPE structures, shown below in Scheme 1 of Example 1, was mixed by hand stir for at least 2 minutes at room temperature in a glass vial. In particular, the dual-cure composition of PFPE structures includes the structures shown in Scheme 1 with 2.0% by weight diethoxyacetophenone photoinitiator and 0.1% by weight dibutyltin diacetate catalyst.

Scheme 1 - PFPE Dual Cure Composition

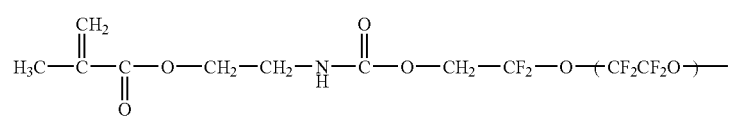

-continued

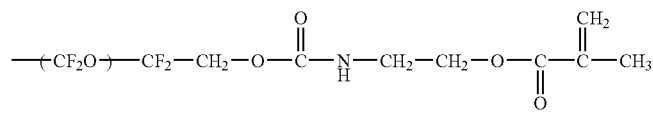

Mn~4,000 g/mol 1 part by weight

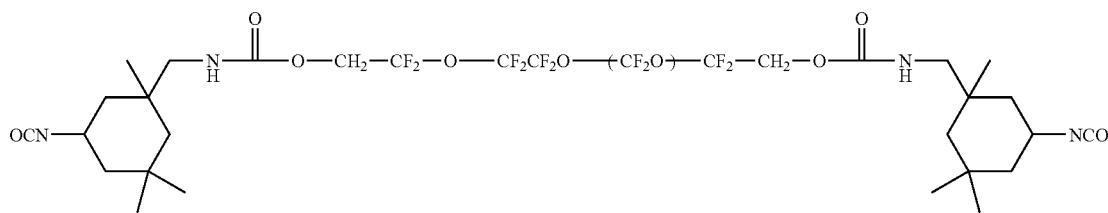

Mn~8,000 g/mol 0.8 part by weight

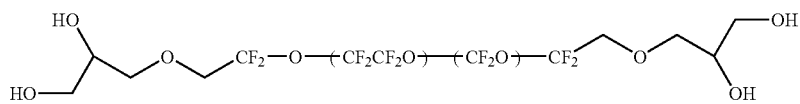

Mn~2,000 g/mol 0.1 part by weight

Figure 2:
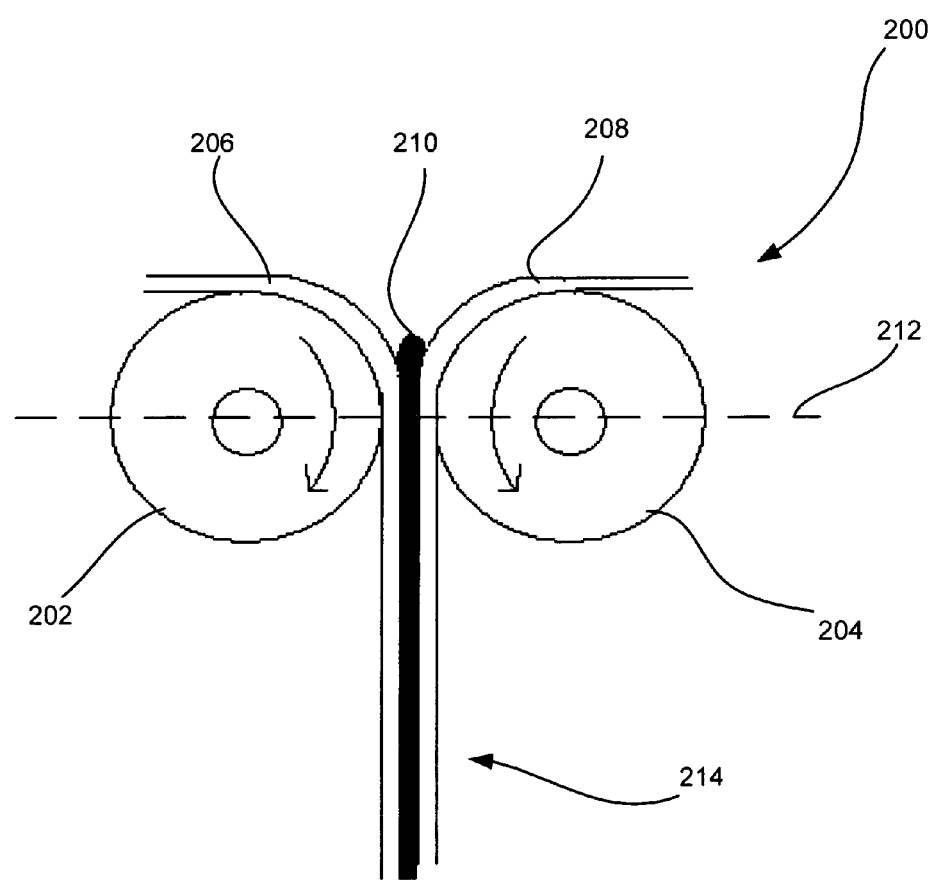
FIG. 2 is a schematic of a roll apparatus for fabricating a laminate mold according to an embodiment of the present invention.

Step 2: Two 6"×12"×7 mil sheets of Melinex 453 (Dupont Teijin Films) treated poly(ethylene terephthalate) (PET) (one side treated) were provided. The two sheets were then configured with a treated side of one sheet facing an untreated side of the other sheet. The configured sheets were inserted into a two roll laminator having two 1" diameter rubber coated rollers having a length of 8" with both rubber rollers having a shore hardness value of 85. The rollers were closed, thereby pinching the configured sheets at a pressure of 60 psig pneumatically driven together by two cylinders of 1" in diameter with approximately 2" of the PET sheets extending beyond the exit side of the rollers. Approximately 2 mL of the dual-cure mixture was placed between the two PET sheets near the nip point on the input side of the rollers. The dual-cure was deposited in an even bead manner from a syringe having an opening of about 1 mm. The two roll laminator was then actuated at a speed of 1 ft/minute, driving the configuration through the nips and dispersing the dual-cure mixture between the two PET sheets and sealing the two PET sheets together with a thin film of dual-cure resin in between as shown in FIG. 2. The two roll laminator was stopped prior to the two PET sheets passing completely through the nip point, such that about 1 inch of PET remained above the input side of the rollers.

Step 3: The PET/dual-cure resin/PET laminate was then UV cured in a UV conveyer system (UVPS conveyor system with Mercury arc lamp source model UVPS6T). The UV conveyor moved at 8 ft/minute with a power output of 200 Watts/inch placed approximately 3 inches above the sample. Prior to subjecting the PET/dual-cure resin/PET laminate to the UV cure, the UV conveyer was allowed to warm-up for about 10 minutes to reach full operating potential.

Step 4: Next, the UV-cured PET/dual-cure resin/PET laminate was placed in a thermal oven set at, and preheated to, 100° C. for 10 minutes. Following this, the PET/dual-cure/PET laminate was allowed to cool at room temperature for 1 minute before the PET sheets were separated by hand by peeling the two PET sheets apart at a rate of about 1 inch per second. The sheets separated cleanly with the dual-cure resin remaining on the PET non-Melinex 453 side of the laminate and the Melinex 453 treated side peeling off free of dual-cure resin.

Step 5: Separately, the UV curable PFPE resin, having the formula below in Scheme 2 of Example 1, was mixed by hand for about 2 minutes at room temperature in a glass vial with 2.0% by weight diethoxyacetophenone.

Scheme 2 - UV curable PFPE composition

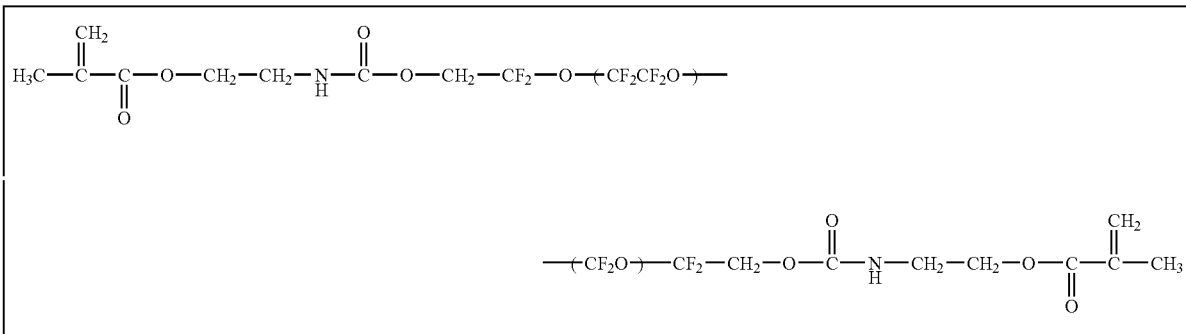

Step 6: Next, an 8" silicon wafer master patterned with an array of 200 nm×200 nm×400 nm cylindrical posts was configured with the PET/dual-cure laminate sheet, formed in Steps 1-4, such that the dual-cure side was facing the patterned side of the wafer. The laminate and the wafer were then inserted into a two roll laminator having two 1" diameter rubber coated rollers 8" in length with both rubber rollers having a shore hardness value of 85. The rollers were closed, thereby pinching the configured sheets at a pressure of 60 psig, pneumaticaly driven by two steel cylinders of 1" diameter with 1" of the layers protruding beyond the exit side of the rollers. Approximately 1 mL of the UV-curable PFPE compound, described in Step 5, was evenly placed between the PET/dual-cure sheet and the wafer near the nip point on the inlet side of the rollers. The UV-curable PFPE was disposed in a bead pattern from a syringe having an opening of about 1 mm. The laminator was then actuated at a speed of 6 ft/min, laminating the PET/dual cure sheet to the 8" patterned wafer with a thin film of UV-curable PFPE distributed in between as shown in FIG. 3. The two roll laminator was then stopped when about 1 inch of the PET/dual-cure laminate/UV-curable PFPE/silicon master remained on the inlet side of the rollers. The rollers were carefully opened to release the PET/dual-cure laminate/UV-curable PFPE/silicon master laminate.

Step 7: The Dual cure sheet/UV-curable PFPE/Silicon wafer laminate was exposed to UV light through the PET sheet using a floodlamp (Oriel Arc Lamp, Mercury-Xenon, model 81172) placed approximately 3 inches from the sample for 1 minute to cure the UV-curable PFPE resin. Prior to exposing the dual-cure sheet/UV-curable PFPE/silicon wafer laminate to the UV floodlamp, the UV light source was allowed to warm up for 10 minutes. After exposure for 10 minutes, the light was extinguished and the dual-cure sheet/UV-curable PFPE/silicon wafer laminate was removed. Following removal from the floodlamp, the dual-cure sheet/UV-curable PFPE layer was carefully separated, by hand peeling at about 1 inch per second from the silicon master. Upon separation, a thin (10-20 micron) PFPE layer was adhered to the dual-cure adhered to the PET and the thin PFPE layer included features of the etched silicon wafers. An example of these procedures is shown in FIG. 4.

Step 8: The PFPE mold was inspected after fabrication by scanning electron microscopy (SEM). FIG. 5 shows a representative image. FIG. 5 is an SEM image of a PFPE/PET laminate mold with 200 nm cavities in a hexagonal array.

Step 9: Mechanical Properties of the laminate mold formed in steps 1-7 were compared to a 1 mm thick mold made purely from the UV curable PFPE composition shown in Scheme 2. The thick mold was formed by casting directly onto the silicon master and UV curing under nitrogen for 2 minutes using an (ELC-4001 UV flood lamp available from Electrolite Corp, Bethel, Conn.).

| Mold Material | Modulus (MPa) |
|---|---|
| UV-curable PFPE (scheme 2) | 7 |
| PFPE/PET Laminate | 1440 |

Step 10: The laminate mold formed in Step 7 was configured with a 6"×12"×7 mil sheet of Melinex 453 such that the patterned side of the mold was facing the treated side of the PET. The sheets were inserted into a two roll laminator having two 1" diameter rubber coated rollers 6" in length; one with a shore hardness of 30, and the other with a shore hardness of 70. The pattern on the laminate mold was facing the 30 durometer roller. The rollers were closed, thereby pinching the configured sheets at a pressure of 40 psig pneumaticaly driven by two steel cylinders of 1" diameter with 1 inch of the layers protruding beyond the exit side of the rollers. Approximately 1 mL of a UV-curable optical adhesive, Dymax 1180-M (DYMAX Corp. Torrington, Conn.), was placed between the two PET sheets at the nip point on the top of the rollers. The laminator was then actuated at a speed of 4.6 ft/min, sealing the two PET sheets together with a thin film of Dymax 1180-M resin in between.

Step 11: The laminate was UV cured on the conveyer system described with respect to Step 3, moving at 8 ft/minute with a power output of 200 Watts/inch placed approximately 3 inches above the sample. The laminate was UV cured with the PET backed PFPE mold side toward the UV lamp.

Step 12: The layers were then carefully separated by hand peeling at about 1 inch per second to reveal a replicate pattern of the original patterned silicon master formed in the Dymax 1180-M. The fidelity of the pattern was inspected using SEM. FIG. 6 shows a representative image of the replica pattern formed from the laminate mold. FIG. 6 is an SEM image of a polymer replica on PET of hexagonally packed 200 nm posts formed from a PFPE/PET laminate mold.

Example 2

Step 1: To form an adhesion promoter for PFPE molds to PET, a dual-cure composition of the PFPE structures, shown in Scheme 1 of Example 1, was mixed by hand stir for at least 2 minutes at room temperature in a glass vial. In particular, the dual-cure composition of PFPE structures includes the structures shown in Scheme 1 of Example 1 with 2.0% by weight diethoxyacetophenone photoinitiator and 0.1% by weight dibutyltin diacetate catalyst.

Step 2: Two 6"×12"×7 mil sheets of Melinex 453 (Dupont Teijin Films) poly(ethylene terephthalate) (PET) were cut. The two sheets were then configured with a treated side of one sheet facing an untreated side of the other sheet. The configured sheets were inserted into a two roll laminator having two different size rollers. One roller is a 16 mm diameter rubber covered roller 9" l length with a shore hardness of 30 and the other roller is a 30 mm diameter aluminum roller 9" in length. The rollers were closed, thereby pinching the configured sheets at a pressure of 5 psig pneumaticaly driven together by 2 steel cylinders of 1.5" diameter with 1" of the layers protruding beyond the exit side of the rollers. Approximately 2 mL of the dual-cure mixture was placed between the two PET sheets near the nip point on the input side of the rollers. The dual-cure was deposited in an even bead manner from a syringe having an opening of about 1 mm. The two roll laminator was then actuated at a speed of 3 ft/minute, driving the configuration through the nips and dispersing the dual-cure mixture between the two PET sheets and sealing the two PET sheets together with a thin film of dual-cure resin in between. The two roll laminator was stopped prior to the two PET sheets passing completely through the nip point, such that about 1 inch of PET remained above the input side of the rollers.

Step 3: The PET/dual-cure resin/PET laminate was then UV cured in a UV flood lamp (ELC-4001 from Electro-Lite Corp, Bethel, Conn.) (Mercury arc lamp with an output range of 290-420 nm (365 nm peak)) and illuminated for 1 minute at approximately 3 inches from the lamp. Prior to subjecting the PET/dual-cure resin/PET laminate to the UV cure, the UV flood lamp was allowed to warm-up for about 10 minutes to reach full operating potential.

Step 4: Next, the UV-cured PET/dual-cure resin/PET laminate was placed in a thermal oven set at, and preheated to, 100° C. for 10 minutes. Following this, the PET/dual-cure/PET laminate was allowed to cool at room temperature for 1 minute before the PET sheets were separated by hand by peeling the two PET sheets apart at a rate of about 1 inch per second. The sheets separated cleanly with the dual-cure resin remaining on the PET non-Melinex 453 side of the laminate and the Melinex 453 treated side peeling off free of dual-cure resin.

Step 5: Separately, the UV curable PFPE resin, having the formula in Scheme 2 of Example 1, was mixed by hand for more than about 2 minutes at room temperature in a glass vial with 2.0% by weight diethoxyacetophenone.

Step 6: Next, a 6" silicon master containing a patterned array of 2 μm×2 μm×0.7 μm cuboidal posts was configured with the PET/dual-cure laminate sheet, formed in Steps 1-4, such that the dual-cure side was facing the patterned side of the wafer. The laminate and the wafer were inserted into a two roll laminator having two different size rollers. One roller is a 16 mm diameter rubber coated roller, 9" in length with a shore hardness of 30 and the other roller is a 30 mm diameter aluminum roller 9" in length. The rollers were closed, thereby pinching the configured sheets at a pressure of 5 psig pneumaticaly driven by two steel cylinders of 1.5" diameter with 1" of the layers protruding beyond the exit side of the rollers. Approximately 1 mL of the UV-curable PFPE compound, described in Step 5, was evenly placed between the PET/dual-cure sheet and the wafer near the nip point on the inlet side of the rollers. The UV-curable PFPE was disposed in a bead pattern from a syringe having an opening of about 1 mm. The laminator was then actuated at a speed of 3 ft/minute, laminating the PET/dual cure sheet to the 6" patterned wafer with a thin film of UV-curable PFPE distributed in between. The two roll laminator was then stopped when about 1 inch of the PET/dual-cure laminate/UV-curable PFPE/silicon master remained on the inlet side of the rollers. The rollers were carefully opened to release the PET/dual-cure laminate/UV-curable PFPE/silicon master laminate.

Step 7: The Dual cure sheet/UV-curable PFPE/Silicon wafer laminate was exposed to UV light through the PET sheet using a UV flood lamp (ELC-4001 from Electro-Lite Corp, Bethel, Conn.) (Mercury arc lamp with an output range of 290-420 nm (365 nm peak)) and were illuminated for 1 minute approximately 3 inches from the lamp. Prior to exposing the dual-cure sheet/UV-curable PFPE/silicon wafer laminate to the UV floodlamp, the UV light source was allowed to warm up for 10 minutes. After exposure for 10 minutes, the light was extinguished and the dual-cure sheet/UV-curable PFPE/silicon wafer laminate was removed. Following removal from the floodlamp, the dual-cure sheet/UV-curable PFPE layer was carefully separated, by hand peeling at about 1 inch per second from the silicon master. Upon separation, a thin (10-20 micron) PFPE layer was adhered to the dual-cure adhered to the PET and the thin PFPE layer included features of the etched silicon wafers.

Example 3

Step 1: To form an adhesion promoter for PFPE molds to PET, a dual-cure composition of the PFPE structures, shown in Scheme 1 or Example 1, was mixed by hand stir for at least 2 minutes at room temperature in a glass vial. In particular, the dual-cure composition of PFPE structures includes the structures shown in Scheme 1 of Example 1 with 2.0% by weight diethoxyacetophenone photoinitiator and 0.1% by weight dibutyltin diacetate catalyst.

Step 2: One 6"×12"×7 mil sheet of Melinex 453 (Dupont Teijin Films) polyethylene terephthalate) (PET) and one 6"×12"×4 mil sheet of Melinex 454 (amine functionalized) (Dupont Teijin Films) PET were prepared. The two sheets were then configured with the Melinex 453 PET treated side facing an untreated side of the Melinex 454 PET sheet. The configured sheets were inserted into a two roll laminator having two different size rollers. One roller is a 16 mm diameter rubber coated roller, 9" in length with a shore hardness of 30 and the other roller is a 30 mm diameter aluminum roller 9" in length. The rollers were closed, thereby pinching the configured sheets at a pressure of 5 psig pneumaticaly driven together by two steel cylinders of 1.5" diameter with 1" of the layers protruding beyond the exit side of the rollers. Approximately 2 mL of the dual-cure mixture was placed between the two PET sheets near the nip point on the input side of the rollers. The dual-cure was deposited in an even bead manner from a syringe having an opening of about 1 mm. The two roll laminator was then actuated at a speed of 3 ft/minute, driving the configuration through the nips and dispersing the dual-cure mixture between the two PET sheets and sealing the two PET sheets together with a thin film of dual-cure resin in between. The two roll laminator was stopped prior to the two PET sheets passing completely through the nip point, such that about 1 inch of PET remained above the input side of the rollers.

Step 3: The Melinex 454 PET/dual-cure resin/Melinex 453 PET laminate was then UV cured in a UV flood lamp (ELC-4001 from Electro-Lite Corp, Bethel, Conn.) (Mercury arc lamp with an output range of 290-420 nm (365 nm peak)) and illuminated for 1 minute at approximately 3 inches from the lamp. Prior to subjecting the Melinex 454 PET/dual-cure resin/Melinex 453 PET laminate to the UV cure, the UV flood lamp was allowed to warm-up for about 10 minutes to reach full operating potential.

Step 4: Next, the UV-cured Melinex 454 PET/dual-cure resin/Melinex 453 PET laminate was placed in a thermal oven set at, and preheated to, 100° C. for 10 minutes. Following this, the laminate was allowed to cool at room temperature for 1 minute before the PET sheets were separated by hand by peeling the two PET sheets apart at a rate of about 1 inch per second. The sheets separated cleanly with the dual-cure resin remaining on the Melinex 454 PET sheet of the laminate and the Melinex 453 treated side peeling off free of dual-cure resin.

Step 5: Separately, the UV curable PFPE resin, having the formula in Scheme 2 of Example 1, was mixed by hand for more than about 2 minutes at room temperature in a glass vial with 2.0% by weight diethoxyacetophenone.

Step 6: Next, a 6" silicon master containing a patterned array of 2 μm×2 μm×0.7 μm cuboidal posts was configured with the Melinex 454 PET/dual-cure laminate sheet, formed in Steps 1-4, such that the dual-cure side was facing the patterned side of the wafer. The laminate and the wafer were inserted into a two roll laminator having two different size rollers. One roller is a 16 mm diameter rubber coated roller, 9" in length with a shore hardness of 30 and the other roller is a 30 mm diameter aluminum roller 9" in length. The rollers were closed, thereby pinching the configured sheets at a pressure of 5 psig pneumaticaly driven together by two steel cylinders of 1.5" diameter with 1" of the layers protruding beyond the exit side of the rollers. Approximately 1 mL of the UV-curable PFPE compound, described in Step 5, was evenly placed between the Melinex 454 PET/dual-cure sheet and the wafer near the nip point on the inlet side of the rollers. The UV-curable PFPE was disposed in a bead pattern from a syringe having an opening of about 1 mm. The laminator was then actuated at a speed of 3 ft/minute, laminating the Melinex 454 PET/dual cure sheet to the 6" patterned wafer with a thin film of UV-curable PFPE distributed in between. The two roll laminator was then stopped when about 1 inch of the Melinex 454 PET/dual-cure laminate/UV-curable PFPE/silicon master remained on the inlet side of the rollers. The rollers were carefully opened to release the Melinex 454 PET/dual-cure laminate/UV-curable PFPE/silicon master laminate.

Step 7: The Dual cure sheet/UV-curable PFPE/Silicon wafer laminate was exposed to UV light through the Melinex 454 PET sheet using a UV flood lamp (ELC-4001 from Electro-Lite Corp, Bethel, Conn.) (Mercury arc lamp with an output range of 290-420 nm (365 nm peak)) and were illuminated for 1 minute approximately 3 inches from the lamp. Prior to exposing the dual-cure sheet/UV-curable PFPE/silicon wafer laminate to the UV floodlamp, the UV light source was allowed to warm up for 10 minutes. After exposure for 10 minutes, the light was extinguished and the dual-cure sheet/UV-curable PFPE/silicon wafer laminate was removed. Following removal from the floodlamp, the dual-cure sheet/UV-curable PFPE layer was carefully separated, by hand peeling at about 1 inch per second from the silicon master. Upon separation, a thin (10-20 micron) PFPE layer was adhered to the dual-cure adhered to the PET and the thin PFPE layer included features of the etched silicon wafers.

Example 4

Step 1: To form an adhesion promoter for PFPE molds to PET, a dual-cure composition of the PFPE structures, shown in Scheme 1 of Example 1, was mixed by hand stir for at least 2 minutes at room temperature in a glass vial. In particular, the dual-cure composition of PFPE structures includes the structures shown in Scheme 1 of Example 1 with 2.0% by weight diethoxyacetophenone photoinitiator and 0.1% by weight dibutyltin diacetate catalyst.

Step 2: One 6"×12"×7 mil sheet of Melinex 453 (Dupont Teijin Films) poly(ethylene terephthalate) (PET) and one 6"×12"×4 mil sheet of Melinex 582 (carboxyl functionalized) (Dupont Teijin Films) PET were prepared. The two sheets were then configured with the Melinex 453 PET treated side facing an untreated side of the Melinex 582 PET sheet. The configured sheets were inserted into a two roll laminator having two different size rollers. One roller is a 16 mm diameter rubber coated roller, 9" in length with a shore hardness of 30 and the other roller is a 30 mm diameter aluminum roller 9" in length. The rollers were closed, thereby pinching the configured sheets at a pressure of 5 psig pneumaticaly driven together by two steel cylinders of 1.5" diameter with 1 inch of the layers protruding beyond the exit side of the rollers. Approximately 2 mL of the dual-cure mixture was placed between the two PET sheets near the nip point on the input side of the rollers. The dual-cure was deposited in an even bead manner from a syringe having an opening of about 1 mm. The two roll laminator was then actuated at a speed of 3 ft/minute, driving the configuration through the nips and dispersing the dual-cure mixture between the two PET sheets and sealing the two PET sheets together with a thin film of dual-cure resin in between. The two roll laminator was stopped prior to the two PET sheets passing completely through the nip point, such that about 1 inch of PET remained above the input side of the rollers.

Step 3: The Melinex 582 PET/dual-cure resin/Melinex 453 PET laminate was then UV cured in a UV flood lamp (ELC-4001 from Electro-Lite Corp, Bethel, Conn.) (Mercury arc lamp with an output range of 290-420 nm (365 nm peak)) and illuminated for 1 minute at approximately 3 inches from the lamp. Prior to subjecting the Melinex 582 PET/dual-cure resin/Melinex 453 PET laminate to the UV cure, the UV flood lamp was allowed to warm-up for about 10 minutes to reach full operating potential.

Step 4: Next, the UV-cured Melinex 582 PET/dual-cure resin/Melinex 453 PET laminate was placed in a thermal oven set at, and preheated to, 100° C. for 10 minutes. Following this, the laminate was allowed to cool at room temperature for 1 minute before the PET sheets were separated by hand by peeling the two PET sheets apart at a rate of about 1 inch per second. The sheets separated cleanly with the dual-cure resin remaining on the Melinex 582 PET sheet of the laminate and the Melinex 453 treated side peeling off free of dual-cure resin.

Step 5: Separately, the UV curable PFPE resin, having the formula in Scheme 2 of Example 1, was mixed by hand for more than about 2 minutes at room temperature in a glass vial with 2.0% by weight diethoxyacetophenone.

Step 6: Next, a 6" silicon master containing a patterned array of 2 μm×2 μm×1.4 μm cuboidal posts was configured with the Melinex 582 PET/dual-cure laminate sheet, formed in Steps 1-4, such that the dual-cure side was facing the patterned side of the wafer. The laminate and the wafer were inserted into a two roll laminator having two different size rollers. One roller is a 16 mm diameter rubber coated roller, 9" in length with a shore hardness of 30 and the other roller is a 30 mm diameter aluminum roller 9" in length. The rollers were closed, thereby pinching the configured sheets at a pressure of 5 psig pneumaticaly driven together by two steel cylinders of 1.5" diameter with 1 inch of the layers protruding beyond the exit side of the rollers. Approximately 1 mL of the UV-curable PFPE compound, described in Step 5, was evenly placed between the Melinex 582 PET/dual-cure sheet and the wafer near the nip point on the inlet side of the rollers. The UV-curable PFPE was disposed in a bead pattern from a syringe having an opening of about 1 mm. The laminator was then actuated at a speed of 3 ft/minute, laminating the Melinex 582 PET/dual cure sheet to the 6" patterned wafer with a thin film of UV-curable PFPE distributed in between. The two roll laminator was then stopped when about 1 inch of the Melinex 582 PET/dual-cure laminate/UV-curable PFPE/silicon master remained on the inlet side of the rollers. The rollers were carefully opened to release the Melinex 582 PET/dual-cure laminate/UV-curable PFPE/silicon master laminate.

Step 7: The Dual cure sheet/UV-curable PFPE/Silicon wafer laminate was exposed to UV light through the Melinex 582 PET sheet using a UV flood lamp (ELC-4001 from Electro-Lite Corp, Bethel, Conn.) (Mercury arc lamp with an output range of 290-420 nm (365 nm peak)) and were illuminated for 1 minute approximately 3 inches from the lamp. Prior to exposing the dual-cure sheet/UV-curable PFPE/silicon wafer laminate to the UV floodlamp, the UV light source was allowed to warm up for 10 minutes. After exposure for 10 minutes, the light was extinguished and the dual-cure sheet/UV-curable PFPE/silicon wafer laminate was removed. Following removal from the floodlamp, the dual-cure sheet/UV-curable PFPE layer was carefully separated, by hand peeling at about 1 inch per second from the silicon master. Upon separation, a thin (10-20 micron) PFPE layer was adhered to the dual-cure adhered to the PET and the thin PFPE layer included features of the etched silicon wafers.

Example 5

Step 1: To form an adhesion promoter for PFPE molds to PET, a dual-cure composition of the PFPE structures, shown in Scheme 1 of Example 1, was mixed by hand stir for at least 2 minutes at room temperature in a glass vial. In particular, the dual-cure composition of PFPE structures includes the structures shown in Scheme 1 of Example 1 with 2.0% by weight diethoxyacetophenone photoinitiator and 0.1% by weight dibutyltin diacetate catalyst.

Step 2: Two 6"×12"×7 mil sheets of Melinex 453 (Dupont Teijin Films) poly(ethylene terephthalate) (PET) were cut. The two sheets were then configured with a treated side of one sheet facing an untreated side of the other sheet, however, untreated side was treated with a 1 minute corona treatment. The configured sheets were inserted into a two roll laminator having two different size rollers. One roller is a 16 mm diameter rubber coated roller, 9" in length with a shore hardness of 30 and the other roller is a 30 mm diameter aluminum roller 9" in length. The rollers were closed, thereby pinching the configured sheets at a pressure of 5 psig pneumaticaly driven together by two steel cylinders of 1.5" diameter with 1 inch of the layers protruding beyond the exit side of the rollers. Approximately 2 mL of the dual-cure mixture was placed between the two PET sheets near the nip point on the input side of the rollers. The dual-cure was deposited in an even bead manner from a syringe having an opening of about 1 mm. The two roll laminator was then actuated at a speed of 3 ft/minute, driving the configuration through the nips and dispersing the dual-cure mixture between the two PET sheets and sealing the two PET sheets together with a thin film of dual-cure resin in between. The two roll laminator was stopped prior to the two PET sheets passing completely through the nip point, such that about 1 inch of PET remained above the input side of the rollers.

Step 3: The PET/dual-cure resin/PET laminate was then UV cured in a UV flood lamp (ELC-4001 from Electro-Lite Corp, Bethel, Conn.) (Mercury arc lamp with an output range of 290-420 nm (365 nm peak)) and illuminated for 1 minute at approximately 3 inches from the lamp. Prior to subjecting the PET/dual-cure resin/PET laminate to the UV cure, the UV flood lamp was allowed to warm-up for about 10 minutes to reach full operating potential.

Step 4: Next, the UV-cured PET/dual-cure resin/PET laminate was placed in a thermal oven set at, and preheated to, 100° C. for 10 minutes. Following this, the PET/dual-cure/PET laminate was allowed to cool at room temperature for 1 minute before the PET sheets were separated by hand by peeling the two PET sheets apart at a rate of about 1 inch per second. The sheets separated cleanly with the dual-cure resin remaining on the 1 minute corona treated PET non-Melinex 453 side of the laminate and the Melinex 453 treated side peeling off free of dual-cure resin.

Step 5: Separately, the UV curable PFPE resin, having the formula in Scheme 2 of Example 1, was mixed by hand for more than about 2 minutes at room temperature in a glass vial with 2.0% by weight diethoxyacetophenone.

Step 6: Next, a 6" silicon master containing a patterned array of 2 μm×2 μm×0.7 μm cuboidal posts was configured with the PET/dual-cure laminate sheet, formed in Steps 1-4, such that the dual-cure side was facing the patterned side of the wafer. The laminate and the wafer were inserted into a two roll laminator having two different size rollers. One roller is a 16 mm diameter rubber coated roller, 9" in length with a shore hardness of 30 and the other roller is a 30 mm diameter aluminum roller 9" in length. The rollers were closed, thereby pinching the configured sheets at a pressure of 5 psig pneumaticaly driven together by two steel cylinders of 1.5" diameter with 1 inch of the layers protruding beyond the exit side of the rollers. Approximately 1 mL of the UV-curable PFPE compound, described in Step 5, was evenly placed between the PET/dual-cure sheet and the wafer near the nip point on the inlet side of the rollers. The UV-curable PFPE was disposed in a bead pattern from a syringe having an opening of about 1 mm. The laminator was then actuated at a speed of 3 ft/minute, laminating the PET/dual cure sheet to the 6" patterned wafer with a thin film of UV-curable PFPE distributed in between. The two roll laminator was then stopped when about 1 inch of the PET/dual-cure laminate/UV-curable PFPE/silicon master remained on the inlet side of the rollers. The rollers were carefully opened to release the PET/dual-cure laminate/UV-curable PFPE/silicon master laminate.

Step 7: The Dual cure sheet/UV-curable PFPE/Silicon wafer laminate was exposed to UV light through the PET sheet using a UV flood lamp (ELC-4001 from Electro-Lite Corp, Bethel, Conn.) (Mercury arc lamp with an output range of 290-420 nm (365 nm peak)) and were illuminated for 1 minute approximately 3 inches from the lamp. Prior to exposing the dual-cure sheet/UV-curable PFPE/silicon wafer laminate to the UV floodlamp, the UV light source was allowed to warm up for 10 minutes. After exposure for 10 minutes, the light was extinguished and the dual-cure sheet/UV-curable PFPE/silicon wafer laminate was removed. Following removal from the floodlamp, the dual-cure sheet/UV-curable PFPE layer was carefully separated, by hand peeling at about 1 inch per second from the silicon master. Upon separation, a thin (10-20 micron) PFPE layer was adhered to the dual-cure adhered to the PET and the thin PFPE layer included features of the etched silicon wafers.

Example 6

Step 1: To form an adhesion promoter for PFPE molds to polycarbonate, a dual-cure composition of the PFPE structures, shown in Scheme 1 of Example 1, was mixed by hand stir for at least 2 minutes at room temperature in a glass vial. In particular, the dual-cure composition of PFPE structures includes the structures shown in Scheme 1 of Example 1 with 2.0% by weight diethoxyacetophenone photoinitiator and 0.1% by weight dibutyltin diacetate catalyst.

Step 2: One 6"×12"×7 mil sheet of Melinex 453 (Dupont Teijin Films) poly(ethylene terephthalate) (PET) and one 6"×12"×6.5 mil sheet of polycarbonate (PC) were cut. The two sheets were then configured with a treated side of the PET sheet facing the sheet of PC. The configured sheets were inserted into a two roll laminator having two different size rollers. One roller is a 16 mm diameter rubber Coated roller, 9" in length with a shore hardness of 30 and the other roller is a 30 mm diameter aluminum roller 9" in length. The rollers were closed, thereby pinching the configured sheets at a pressure of 5 psig pneumaticaly driven together by two steel cylinders of 1.5" diameter with 1 inch of the layers protruding beyond the exit side of the rollers. Approximately 2 mL of the dual-cure mixture was placed between the PET/PC sheets near the nip point on the input side of the rollers. The dual-cure was deposited in an even bead manner from a syringe having an opening of about 1 mm. The two roll laminator was then actuated at a speed of 3 ft/minute, driving the configuration through the nips and dispersing the dual-cure mixture between the PET/PC sheets and sealing the PET/PC sheets together with a thin film of dual-cure resin in between. The two roll laminator was stopped prior to the PET/PC sheets passing completely through the nip point, such that about 1 inch of the PET/PC sheets remained above the input side of the rollers.

Step 3: The PC/dual-cure resin/PET laminate was then UV cured in a UV flood lamp (ELC-4001 from Electro-Lite Corp, Bethel, Conn.) (Mercury arc lamp with an output range of 290-420 nm (365 nm peak)) and illuminated for 1 minute at approximately 3 inches from the lamp. Prior to subjecting the PC/dual-cure resin/PET laminate to the UV cure, the UV flood lamp was allowed to warm-up for about 10 minutes to reach full operating potential.

Step 4: Next, the UV-cured PC/dual-cure resin/PET laminate was placed in a thermal oven set at, and preheated to, 100° C. for 10 minutes. Following this, the PC/dual-cure/PET laminate was allowed to cool at room temperature for 1 minute before the PET/PC sheets were separated by hand by peeling the PET/PC sheets apart at a rate of about 1 inch per second. The sheets separated cleanly with the dual-cure resin remaining on the PC side of the laminate and the Melinex 453 treated PET peeling off free of dual-cure resin.

Step 5: Separately, the UV curable PFPE resin, having the formula in Scheme 2 of Example 1, was mixed by hand for more than about 2 minutes at room temperature in a glass vial with 2.0% by weight diethoxyacetophenone.

Step 6: Next, a 6" silicon master containing a patterned array of 2 μm×2 μm×0.7 μm cuboidal posts was configured with the PC/dual-cure laminate sheet, formed in Steps 1-4, such that the dual-cure side was facing the patterned side of the wafer. The laminate and the wafer were inserted into a two roll laminator having two different size rollers. One roller is a 16 mm diameter rubber coated roller, 9" in length with a shore hardness of 30 and the other roller is a 30 mm diameter aluminum roller 9" in length. The rollers were closed, thereby pinching the configured sheets at a pressure of 5 psig pneumaticaly driven together by two steel cylinders of 1.5" diameter with 1 inch of the layers protruding beyond the exit side of the rollers. Approximately 1 mL of the UV-curable PFPE compound, described in Step 5, was evenly placed between the PC/dual-cure sheet and the wafer near the nip point on the inlet side of the rollers. The UV-curable PFPE was disposed in a bead pattern from a syringe having an opening of about 1 mm. The laminator was then actuated at a speed of 3 ft/minute, laminating the PC/dual cure sheet to the 6" patterned wafer with a thin film of UV-curable PFPE distributed in between. The two roll laminator was then stopped when about 1 inch of the PC/dual-cure laminate/UV-curable PFPE/silicon master remained on the inlet side of the rollers. The rollers were carefully opened to release the PC/dual-cure laminate/UV-curable PFPE/silicon master laminate.

Step 7: The Dual cure sheet/UV-curable PFPE/Silicon wafer laminate was exposed to UV light through the PC sheet using a UV flood lamp (ELC-4001 from Electro-Lite Corp, Bethel, Conn.) (Mercury arc lamp with an output range of 290-420 nm (365 nm peak)) and were illuminated for 1 minute approximately 3 inches from the lamp. Prior to exposing the dual-cure sheet/UV-curable PFPE/silicon wafer laminate to the UV floodlamp, the UV light source was allowed to warm up for 10 minutes. After exposure for 10 minutes, the light was extinguished and the dual-cure sheet/UV-curable PFPE/silicon wafer laminate was removed. Following removal from the floodlamp, the dual-cure sheet/UV-curable PFPE layer was carefully separated, by hand peeling at about 1 inch per second from the silicon master. Upon separation, a thin (10-20 micron) PFPE layer was adhered to the dual-cure adhered to the PET and the thin PFPE layer included features of the etched silicon wafers.

Example 7

Step 1: To form an adhesion promoter for PFPE molds to silicon rubber, a dual-cure composition of the PFPE structures, shown in Scheme 1 of Example 1, was mixed by hand stir for at least 2 minutes at room temperature in a glass vial. In particular, the dual-cure composition of PFPE structures includes the structures shown in Scheme 1 of Example 1 with 2.0% by weight diethoxyacetophenone photoinitiator and 0.1% by weight dibutyltin diacetate catalyst.

Step 2: One 6"×12"×7 mil sheet of Melinex 453 (Dupont Teijin Films) polyethylene terephthalate) (PET) and one 6"×12"×10 mil sheet of corona treated silicone rubber (SR) were cut. The two sheets were then configured with the corona treated side of the silicone rubber sheet facing a treated side of the PET sheet. The configured sheets were inserted into a two roll laminator having two different size rollers. One roller is a 16 mm diameter rubber coated roller, 9" in length with a shore hardness of 30 and the other roller is a 30 mm diameter aluminum roller 9" in length. The rollers were closed, thereby pinching the configured sheets at a pressure of 5 psig pneumaticaly driven together by two steel cylinders of 1.5" diameter with 1 inch of the layers protruding beyond the exit side of the rollers. Approximately 2 mL of the dual-cure mixture was placed between the SR/PET sheets near the nip point on the input side of the rollers. The dual-cure was deposited in an even bead manner from a syringe having an opening of about 1 mm. The two roll laminator was then actuated at a speed of 3 ft/minute, driving the configuration through the nips and dispersing the dual-cure mixture between the SR/PET sheets and sealing the SR/PET sheets together with a thin film of dual-cure resin in between. The two roll laminator was stopped prior to the SR/PET sheets passing completely through the nip point, such that about 1 inch of SR/PET remained above the input side of the rollers.

Step 3: The SR/dual-cure resin/PET laminate was then UV cured in a UV flood lamp (ELC-4001 from Electro-Lite Corp, Bethel, Conn.) (Mercury arc lamp with an output range of 290-420 nm (365 nm peak)) and illuminated for 1 minute at approximately 3 inches from the lamp. Prior to subjecting the SR/dual-cure resin/PET laminate to the UV cure, the UV flood lamp was allowed to warm-up for about 10 minutes to reach full operating potential.

Step 4: Next, the UV-cured SR/dual-cure resin/PET laminate was placed in a thermal oven set at, and preheated to, 100° C. for 10 minutes. Following this, the SR/dual-cure/PET laminate was allowed to cool at room temperature for 1 minute before the SR/PET sheets were separated by hand by peeling the SR/PET sheets apart at a rate of about 1 inch per second. The sheets separated cleanly with the dual-cure resin remaining on the SR sheet and the Melinex 453 treated PET side peeling off free of dual-cure resin.

Step 5: Separately, the UV curable PFPE resin, having the formula in Scheme 2 of Example 1, was mixed by hand for more than about 2 minutes at room temperature in a glass vial with 2.0% by weight diethoxyacetophenone.

Step 6: Next, a 6" silicon master containing a patterned array of 2 μm×2 μm×1.4 μm cuboidal posts was configured with the SR/dual-cure laminate sheet, formed in Steps 1-4, such that the dual-cure side was facing the patterned side of the wafer. The laminate and the wafer were inserted into a two roll laminator having two different size rollers. One roller is a 16 mm diameter rubber coated roller, 9" in length with a shore hardness of 30 and the other roller is a 30 mm diameter aluminum roller 9" in length. The rollers were closed, thereby pinching the configured sheets at a pressure of 5 psig pneumaticaly driven together by two steel cylinders of 1.5" diameter with 1 inch of the layers protruding beyond the exit side of the rollers. Approximately 1 mL of the UV-curable PFPE compound, described in Step 5, was evenly placed between the SR/dual-cure sheet and the wafer near the nip point on the inlet side of the rollers. The UV-curable PFPE was disposed in a bead pattern from a syringe having an opening of about 1 mm. The laminator was then actuated at a speed of 3 ft/minute, laminating the SR/dual cure sheet to the 6" patterned wafer with a thin film of UV-curable PFPE distributed in between. The two roll laminator was then stopped when about 1 inch of the SR/dual-cure laminate/UV-curable PFPE/silicon master remained on the inlet side of the rollers. The rollers were carefully opened to release the SR/dual-cure laminate/UV-curable PFPE/silicon master laminate.

Step 7: The Dual cure sheet/UV-curable PFPE/Silicon wafer laminate was exposed to UV light through the SR sheet using a UV flood lamp (ELC-4001 from Electro-Lite Corp, Bethel, Conn.) (Mercury arc lamp with an output range of 290-420 nm (365 nm peak)) and were illuminated for 1 minute approximately 3 inches from the lamp. Prior to exposing the dual-cure sheet/UV-curable PFPE/silicon wafer laminate to the UV floodlamp, the UV light source was allowed to warm up for 10 minutes. After exposure for 10 minutes, the light was extinguished and the dual-cure sheet/UV-curable PFPE/silicon wafer laminate was removed. Following removal from the floodlamp, the dual-cure sheet/UV-curable PFPE layer was carefully separated, by hand peeling at about 1 inch per second from the silicon master. Upon separation, a thin (10-20 micron) PFPE layer was adhered to the dual-cure adhered to the SR and the thin PFPE layer included features of the etched silicon wafers.

Example 8

Step 1: To form an adhesion promoter for PFPE molds to PET, a dual-cure composition of the PFPE structures, shown in Scheme 1 of Example 1, was mixed by hand stir for at least 2 minutes at room temperature in a glass vial. In particular, the dual-cure composition of PFPE structures includes the structures shown in Scheme 1 of Example 1 with 2.0% by weight diethoxyacetophenone photoinitiator and 0.1% by weight dibutyltin diacetate catalyst.

Step 2: One 6"×12"×7 mil sheet of untreated poly(ethylene terephthalate) (PET) was cut. The PET sheet was configured adjacent a 6" silicon master containing a patterned array of 2 μm×2 μm×1.4 μm cuboidal posts. The configured PET sheet/silicon wafer master were inserted into a two roll laminator having two different size rollers. One roller is a 16 mm diameter rubber coated roller, 9" in length with a shore hardness of 30 and the other roller is a 30 mm diameter aluminum roller 9" in length. The rubber roller was positioned adjacent the silicon master and the aluminum roller was positioned adjacent the PC. The rollers were closed, thereby pinching the configured sheets at a pressure of 5 psig pneumaticaly driven together by two steel cylinders of 1.5" diameter with 1 inch of the layers protruding beyond the exit side of the rollers. Approximately 2 mL of the dual-cure mixture was placed between the PET/master configuration near the nip point on the input side of the rollers. The dual-cure was deposited in an even bead manner from a syringe having an opening of about 1 mm. The two roll laminator was then actuated at a speed of 3 ft/minute, driving the configuration through the nips and dispersing the dual-cure mixture between the PET/master configuration and sealing the PET/master configuration together with a thin film of dual-cure resin in between. The two roll laminator was stopped prior to the PET/master configuration passing completely through the nip point, such that about 1 inch of PET/master configuration remained above the input side of the rollers.

Step 3: The PET/dual-cure resin/master laminate was then UV cured in a UV flood lamp (ELC-4001 from Electro-Lite Corp, Bethel, Conn.) (Mercury arc lamp with an output range of 290-420 nm (365 nm peak)) and illuminated for 3 minutes at approximately 3 inches from the lamp. Prior to subjecting the PET/dual-cure resin/master laminate to the UV cure, the UV flood lamp was allowed to warm-up for about 10 minutes to reach full operating potential.

Step 4: Next, the UV-cured PET/dual-cure resin/master laminate was placed in a thermal oven set at, and preheated to, 115° C. for 3 hours. Following this, the PET/dual-cure/master laminate was allowed to cool at room temperature for 1 minute before the PET sheet was separated from the master by hand by peeling the PET sheet away at a rate of about 1 inch per second. Following this, the PET/dual-cure laminate was separated cleanly from the master wafer to reveal a patterned dual-cure mold adhered to the PET.

Example 9

Step 1: To form an adhesion promoter for PFPE molds to PET, a UV curable composition of the PFPE structures, shown in Scheme 2 of Example 1, was mixed by hand stir for at least 2 minutes at room temperature in a glass vial. In particular, the UV-curable composition of PFPE structures includes the structure shown in Scheme 2 of Example 1 and 2.0% by weight diethoxyacetophenone.

Step 2: One 6"×12"×6.5 mil sheet of polycarbonate (PC) was cut. The PC sheet was configured adjacent a 6" silicon master containing a patterned array of 2 μm×2 μm×1.4 μm cuboidal posts. The configured PC/silicon master was inserted into a two roll laminator having two different size rollers. One roller is a 16 mm diameter rubber coated roller, 9" in length with a shore hardness of 30 and the other roller is a 30 mm diameter aluminum roller 9" in length. The rubber coated roller was positioned adjacent the silicon master and the aluminum roller was positioned adjacent the PC. The rollers were closed, thereby pinching the configured sheets at a pressure of 5 psig pneumaticaly driven together by two steel cylinders of 1.5" diameter with 1 inch of the layers protruding beyond the exit side of the rollers. Approximately 2 mL of the UV-curable mixture was placed between the PC/master configuration near the nip point on the input side of the rollers. The UV-curable mixture was deposited in an even bead manner from a syringe having an opening of about 1 mm. The two roll laminator was then actuated at a speed of 3 ft/minute, driving the configuration through the nips and dispersing the UV-curable mixture between the PC/master configuration and sealing the PC/master configuration together with a thin film of UV-curable mixture in between. The two roll laminator was stopped prior to the PC/master configuration passing completely through the nip point, such that about 1 inch of PC/master configuration remained above the input side of the rollers.

Step 3: The PC/UV-curable mixture/master laminate was then UV cured in a UV flood lamp (ELC-4001 from Electro-Lite Corp, Bethel, Conn.) (Mercury arc lamp with an output range of 290-420 nm (365 nm peak)) and illuminated for 3 minutes at approximately 3 inches from the lamp. Prior to subjecting the PC/UV-curable mixture/master laminate to the UV cure, the UV flood lamp was allowed to warm-up for about 10 minutes to reach full operating potential.

Step 4: Next, the PC/UV-curable mixture laminate was separated cleanly from the master wafer to reveal a patterned UV-curable mold adhered to the PC.

Example 10

Gel Fraction

Figure 7A:
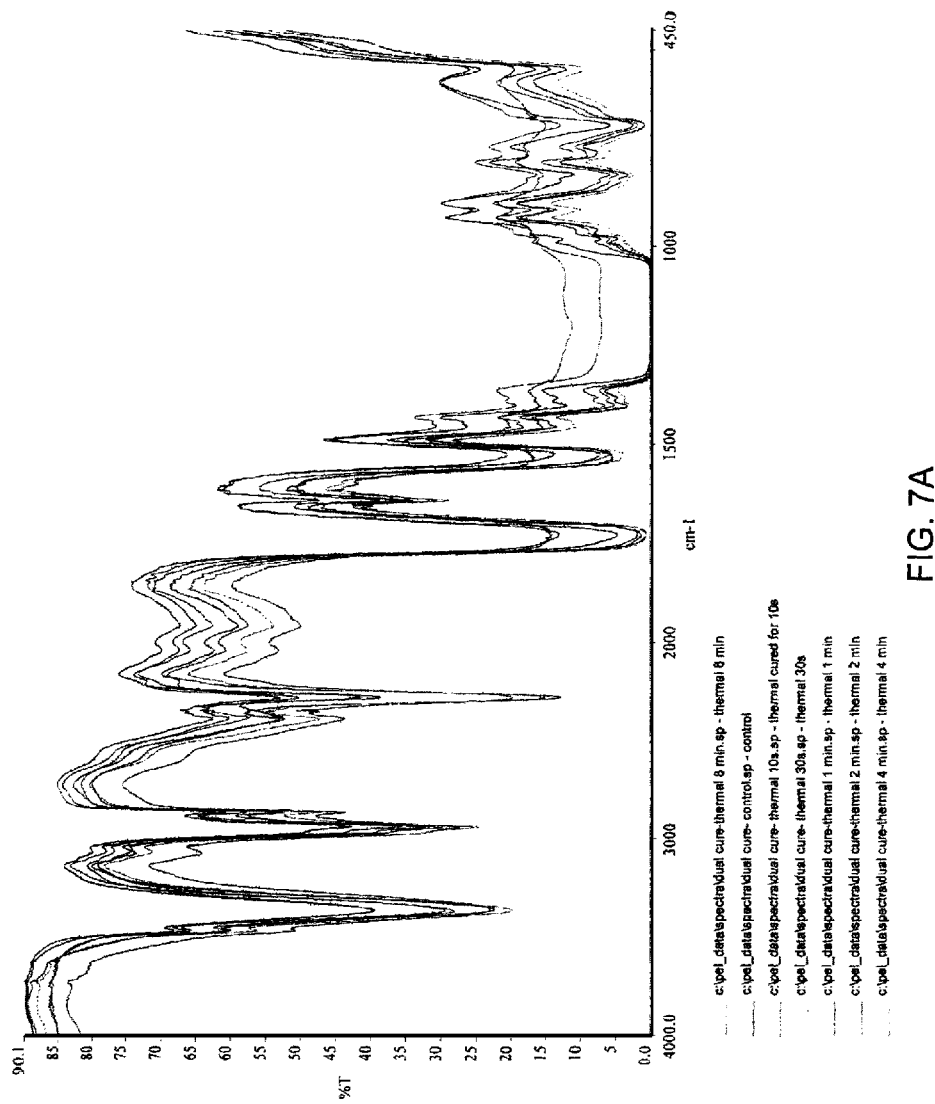
FIGS. 7A and 7B are graphs showing sample IR data according to an embodiment of the present invention.
Figure 7B:
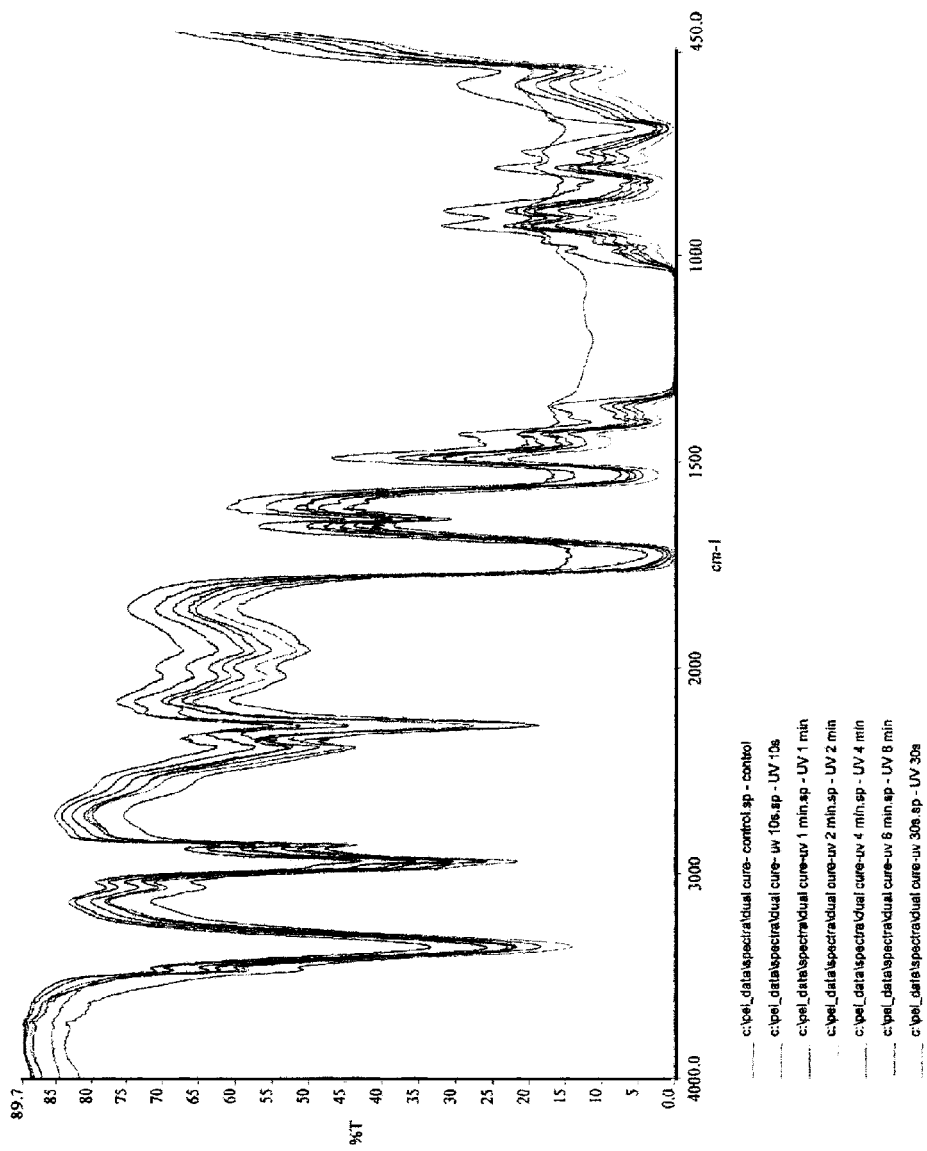

Dual cure materials are synthesized as given previously. For each sample, approximately 2 g of uncured material is weighed into a 20 mL glass vial of known weight. Between samples, the material is stored in a desiccator. For thermal tests, the vials are labeled as T1-T7, for uv curing, the vials are labeled as U1-U6. IR spectra were taken of all samples. FIGS. 7A and 7B are graphs showing sample IR data.

For the thermal cure tests, a digital convection oven is set to 100° C. The vial is placed in the oven for the determined amount of time (10 sec, 30 sec, 1 min, 2 min, 4 min, 8 min, or 12 min). The vial is removed from the oven and allowed to cool to room temperature. The sample is checked for fiber formation using tweezers, in a manner similar to a "toothpick test", known to those skilled in the art. The sample vial is then filled with approximately 20 mL of SOLKANE™ (1,1,1,3,3-pentafluorobutane) (Solvay Solexis, Brussels, Belgium) and shaken for 2 minutes to extract the sol fraction. The liquid is decanted off and passed through a 45 µm filter into a glass vial of known weight, labeled as T1a, T2a, etc. All vials are placed in a vacuum oven and taken to dryness (about 2 hours). The vials are weighed to determine the masses of the sol fraction and gelled material.

For the uv cure tests, a low power uv oven (24-28 mW/cm$^2$ at 365 nm) provided by Electro-lite (Electro-Lite Corporation, Bethel, Conn.). The vial is placed in the uv oven, purged with nitrogen for 2 minutes, then cured for the determined amount of time (10 sec, 30 sec, 1 min, 2 min, 4 min, 8 min, or 12 min). The vial is removed from the uv oven. The sample is checked for fiber formation using tweezers, in a manner similar to a "toothpick test", known to those skilled in the art. The sample vial is then filled with approximately 20 mL of SOLKANE™ (1,1,1,3,3-pentafluorobutane) (Solvay Solexis, Brussels, Belgium) and shaken for 2 minutes to extract the sol fraction. The liquid is decanted off and passed through a 45 µm filter into a glass vial of known weight, labeled as U1a, U2a, etc. All vials are placed in a vacuum oven and taken to dryness (about 2 hours). The vials are weighed to determine the masses of the sol fraction and gelled material.

Results of Solgel Fraction Study:

| Vial # | Cure type | Cure time | % sol fraction |
|--------|-----------|-----------|----------------|
| T1 | Thermal | 10 sec | 91.56 |
| T2 | Thermal | 30 sec | 52.57 |
| T3 | Thermal | 60 sec | 32.58 |
| T4 | Thermal | 2 min | 11.6 |
| T5 | Thermal | 4 min | 20.23 |
| T6 | Thermal | 8 min | 7.71 |
| T7 | Thermal | 12 min | 8.81 |
| U1 | UV | 10 sec | 76.49 |
| U2 | UV | 30 sec | 81.5 |
| U3 | UV | 60 sec | 23.33 |
| U4 | UV | 2 min | 16.21 |
| U5 | UV | 4 min | 3.16 |
| U6 | UV | 8 min | 0.85 |

Tweezer Test

| Sample | Result | |
|--------|--------|---|
| T1 | N | |
| T2 | N | |
| T3 | Y/N | |
| T4 | Y | |
| T5 | Y | Y/N means no fibers initially, but when SOLKANE ™ is added, a few fibers can be seen in solution |
| T6 | Y | |
| T7 | Y | |
| U1 | N | |
| U2 | Y/N | |
| U3 | Y | |
| U4 | Y | |
| U5 | Y | |
| U6 | Y | |

Samples having properties appropriate for the present applications include #s T6 and T7 (thermally cured at 100° C. for greater than 8 min.) and U5 and U6 (UV cured at 24-28 mW/cm$^2$ at 365 nm for greater than 4 min).

The invention claimed is:

1. A laminate nanomold system comprising:
    a layer of perfluoropolyether, wherein the layer of perfluoropolyether includes a first surface defining a plurality of cavities, wherein each cavity of the plurality of cavities has a predetermined shape and is less than about 10 micrometers in a largest dimension, and wherein the layer of perfluoropolyether is less than about 75 micrometers in thickness;
    a support layer bonded to a second surface of the layer of perfluoropolyether opposite the first surface, wherein the support layer bonded to the layer of perfluoropolyether has a combined modulus greater than about 1400 MPa;
    a sheet positioned to face the first surface of the layer of perfluoropolyether;
    a material disposed between the sheet and the first surface of the layer of perfluoropolyether, the material configured to conform to the cavities of the first surface; and
    a first roller and a second roller defining a nip point configured and dimensioned to receive the layer of perfluoropolyether bonded to the support layer, the sheet, and the material.

2. The laminate nanomold system of claim 1, further comprising a tie-layer disposed between the layer of perfluoropolyether and the support layer to attach the support layer with the layer of perfluoropolyether.

3. The laminate nanomold system of claim 2, wherein the tie-layer comprises a dual cure material.

4. The laminate nanomold system of claim 1, wherein each cavity of the plurality of cavities comprise a predetermined shape selected from the group consisting of cylindrical, 200 nm diameter cylinders, cuboidal, 200 nm cuboidal, crescent, and concave disc.

5. The laminate nanomold system of claim 1, wherein the plurality of cavities comprise cavities of a variety of predetermined shapes.

6. The laminate nanomold system of claim 1, wherein each cavity of the plurality of cavities is less than about 5 micrometers in a largest dimension.

7. The laminate nanomold system of claim 1, wherein each cavity of the plurality of cavities is less than about 1 micrometers in a largest dimension.

8. The laminate nanomold system of claim 1, wherein each cavity of the plurality of cavities is less than about 750 nanometers in a largest dimension.

9. The laminate nanomold system of claim 1, wherein each cavity of the plurality of cavities is less than about 500 nanometers in a largest dimension.

10. The laminate nanomold system of claim 1, wherein each cavity of the plurality of cavities is less than about 300 nanometers in a largest dimension.

11. The laminate nanomold system of claim 1, wherein each cavity of the plurality of cavities is less than about 200 nanometers in a largest dimension.

12. The laminate nanomold system of claim 1, wherein each cavity of the plurality of cavities is less than about 100 nanometers in a largest dimension.

13. The laminate nanomold system of claim 1, wherein each cavity of the plurality of cavities is less than about 75 nanometers in a largest dimension.

14. The laminate nanomold system of claim 1, wherein each cavity of the plurality of cavities is less than about 50 nanometers in a largest dimension.

15. The laminate nanomold system of claim 1, wherein each cavity of the plurality of cavities is less than about 40 nanometers in a largest dimension.

16. The laminate nanomold system of claim 1, wherein each cavity of the plurality of cavities is less than about 30 nanometers in a largest dimension.

17. The laminate nanomold system of claim 1, wherein each cavity of the plurality of cavities is less than about 20 nanometers in a largest dimension.

18. The laminate nanomold system of claim 1, wherein each cavity of the plurality of cavities is less than about 10 nanometers in a largest dimension.

19. The laminate nanomold system of claim 1, wherein the perfluoropolyether layer is less than about 40 micrometers thick.

20. The laminate nanomold system of claim 1, wherein the perfluoropolyether layer is less than about 30 micrometers thick.

21. The laminate nanomold system of claim 1, wherein the perfluoropolyether layer is less than about 20 micrometers thick.

22. The laminate nanomold system of claim 1, wherein the perfluoropolyether layer is less than about 15 micrometers thick.

23. The laminate nanomold system of claim 1, wherein the perfluoropolyether layer is less than about 10 micrometers thick.

24. The laminate nanomold system of claim 1, wherein the support layer comprises a polymer.

25. The laminate nanomold system of claim 24, wherein the polymer of the support layer comprises polyethylene terephthalate.

26. The laminate nanomold system of claim 1, wherein the support layer is less than about 20 mil thick.

27. The laminate nanomold system of claim 1, wherein the support layer is less than about 15 mil thick.

28. The laminate nanomold system of claim 1, wherein the support layer is less than about 10 mil thick.

29. The laminate nanomold system of claim 1, wherein the support layer is less than about 5 mil thick.

30. The laminate nanomold system of claim 1, wherein the support layer introduces a modulus of greater than 1000 to the laminate.

31. The laminate nanomold system of claim 3, wherein the layer of perfluoropolyether is attached to the support layer by photoinitiator coupling and thermalinitiator coupling.

32. The laminate nanomold system of claim 1, wherein the perfluoropolyether comprises a photocurable component.

33. The laminate nanomold system of claim 1, wherein the layer of perfluoropolyether has a footprint greater than about 25 square centimeters.

34. The laminate nanomold system of claim 1, wherein the layer of perfluoropolyether has a footprint greater than about 50 square centimeters.

35. The laminate nanomold system of claim 1, wherein the layer of perfluoropolyether has a footprint greater than about 100 square centimeters.

36. The laminate nanomold system of claim 1, wherein each cavity of the plurality of cavities is less than about 5 micrometers from an adjacent cavity.

37. The laminate nanomold system of claim 1, wherein each cavity of the plurality of cavities is less than about 2 micrometer from an adjacent cavity.

38. The laminate nanomold system of claim 1, wherein each cavity of the plurality of cavities is less than about 1 micrometers from an adjacent cavity.

39. The laminate nanomold system of claim 1, wherein each cavity of the plurality of cavities is less than about 750 nanometers from an adjacent cavity.

40. The laminate nanomold system of claim 1, wherein each cavity of the plurality of cavities is less than about 500 nanometers from an adjacent cavity.

41. The laminate nanomold system of claim 1, wherein the perfluoropolyether has less than about 10 percent sol fraction.

42. The laminate nanomold system of claim 1, wherein the first roller and second roller are configured and dimensioned to pinch the layer of perfluoropolyether, the support layer, the sheet, and the material.

43. A laminate nanomold comprising:
a layer of perfluoropolyether, wherein the layer of perfluoropolyether includes a first surface defining a plurality of cavities, wherein each cavity of the plurality of cavities has a predetermined shape and is less than about 10 micrometers in a largest dimension, and wherein the layer of perfluoropolyether is less than about 75 micrometers in thickness; and
a support layer bonded to a second surface of the layer of perfluoropolyether opposite the first surface, wherein the support layer bonded to the layer of perfluoropolyether has a combined modulus greater than about 1400 MPa.

* * * * *

UNITED STATES PATENT AND TRADEMARK OFFICE
CERTIFICATE OF CORRECTION

| | | |
|---|---|---|
| PATENT NO. | : 8,128,393 B2 | Page 1 of 1 |
| APPLICATION NO. | : 11/633763 | |
| DATED | : March 6, 2012 | |
| INVENTOR(S) | : Jason P. Rolland | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 572 days.

Signed and Sealed this
Twenty-sixth Day of June, 2012

David J. Kappos
*Director of the United States Patent and Trademark Office*